United States Patent
Huang et al.

(10) Patent No.: US 12,482,417 B2
(45) Date of Patent: Nov. 25, 2025

(54) DISPLAY PANEL AND DISPLAY APPARATUS

(71) Applicants: Chengdu BOE Optoelectronics Technology Co., Ltd., Chengdu (CN); BOE TECHNOLOGY GROUP CO., LTD., Beijing (CN)

(72) Inventors: Yao Huang, Beijing (CN); Cong Liu, Beijing (CN)

(73) Assignees: Chengdu BOE Optoelectronics Technology Co., Ltd., Sichuan (CN); Beijing BOE Technology Development Co., Ltd., Beijing (CN)

( * ) Notice: Subject to any disclaimer, the term of this patent is extended or adjusted under 35 U.S.C. 154(b) by 0 days.

(21) Appl. No.: 18/287,529

(22) PCT Filed: Jul. 20, 2022

(86) PCT No.: PCT/CN2022/106870
§ 371 (c)(1),
(2) Date: Oct. 19, 2023

(87) PCT Pub. No.: WO2023/071312
PCT Pub. Date: May 4, 2023

(65) Prior Publication Data
US 2024/0212610 A1    Jun. 27, 2024

(30) Foreign Application Priority Data
Oct. 28, 2021   (CN) .......................... 202111265004.9

(51) Int. Cl.
*G09G 3/3233* (2016.01)
*H10K 59/131* (2023.01)

(52) U.S. Cl.
CPC ......... *G09G 3/3233* (2013.01); *H10K 59/131* (2023.02); *G09G 2300/0465* (2013.01);
(Continued)

(58) Field of Classification Search
CPC ......... G09G 3/3233; G09G 2300/0465; G09G 2300/0819; G09G 2300/0842;
(Continued)

(56) References Cited

U.S. PATENT DOCUMENTS

2020/0394959 A1* 12/2020 Lou ...................... H10K 59/353
2021/0193746 A1    6/2021 Lee et al.
(Continued)

FOREIGN PATENT DOCUMENTS

| CN | 110706649 A | 1/2020 |
| CN | 112117320 A | 12/2020 |

(Continued)

OTHER PUBLICATIONS

Written Opinion of the International Searching Authority in PCT/CN2022/106870 dated Oct. 26, 2022 in English.
(Continued)

*Primary Examiner* — Nelson M Rosario
(74) *Attorney, Agent, or Firm* — Collard & Roe, P.C.

(57) ABSTRACT

Provided are a display panel and a display apparatus. The display panel includes: a first display area and a second display area, a transmittance of the first display area is greater than a transmittance of the second display area; the first display area includes a plurality of built-in light-emitting devices and at least one first driving circuit, the plurality of built-in light-emitting devices include a first light-emitting device and a second light-emitting device, the first driving circuit is connected to the first light-emitting device, the second display area includes at least one third light-emitting device and a plurality of external driving circuits, the plurality of external driving circuits include a second driving circuit and a third driving circuit, the second driving circuit is connected to the second light-emitting (Continued)

device through a lead wire, and the third driving circuit is connected to the third light-emitting device.

20 Claims, 40 Drawing Sheets

(52) U.S. Cl.
CPC ............... *G09G 2300/0819* (2013.01); *G09G 2300/0842* (2013.01); *G09G 2320/0233* (2013.01)

(58) Field of Classification Search
CPC ......... G09G 2320/0233; H10K 59/121; H10K 59/128; H10K 59/131; H10K 59/1213
See application file for complete search history.

(56) References Cited

U.S. PATENT DOCUMENTS

2022/0190082 A1    6/2022  Li
2024/0062720 A1    2/2024  Ma et al.

FOREIGN PATENT DOCUMENTS

| CN | 113178163 A | 7/2021 |
|---|---|---|
| CN | 113241358 A | 8/2021 |
| CN | 113990909 A | 1/2022 |
| EP | 4336543 A1 | 3/2024 |

OTHER PUBLICATIONS

International Search Report in PCT/CN2022/106870 in Chinese dated Oct. 26, 2022 with English translation.
Written Opinion of the International Searching Authority in PCT/CN2022/106870 in Chinese dated Oct. 26, 2022.
Extended European Search Report in European Application No. 22885215.8 dated Mar. 18, 2024.
Supplementary European Search Report in European Application No. 22885215.8 dated Feb. 23, 2024.

* cited by examiner

LY0

LY3

LY4

LY0+LY3+LY4

LY0+VH1+LY3+VH2+LY4

LY0

LY1

LY0

LY1

DISPLAY PANEL AND DISPLAY APPARATUS

CROSS REFERENCE TO RELATED APPLICATIONS

This application is the National Stage of PCT/CN2022/106870 filed on Jul. 20, 2022, which claims priority under 35 U.S.C. § 119 of Chinese Application No. 202111265004.9 filed on Oct. 28, 2021, the disclosure of which is incorporated by reference.

TECHNICAL FIELD

Embodiments of the present disclosure relate to a display panel and a display apparatus.

BACKGROUND

Compared with traditional liquid crystal displays, organic light-Emitting diode (OLED) devices have the advantages of being self-luminous, a wide color gamut, high contrast, lightness and thinness, etc. Because OLED display panels have an ultra-high screen-to-body ratio, they have gradually become a mainstream form of mobile devices such as mobile phones.

With the continuous advancement of technology, under-screen cameras are one of the future development trends of full screens. However, in related technologies, display products with under-screen cameras still have many defects to be overcome.

SUMMARY

Embodiments of the present disclosure provide a display panel and a display apparatus to improve display uniformity.

Embodiments of the present disclosure provide a display panel, including: a first display area and a second display area, wherein the second display area is located on at least one side of the first display area and a transmittance of the first display area is greater than a transmittance of the second display area; the first display area includes a plurality of built-in light-emitting devices and at least one first driving circuit, the plurality of built-in light-emitting devices include a first light-emitting device and a second light-emitting device, the first driving circuit is connected to the first light-emitting device, and the first driving circuit is configured to drive the first light-emitting device to emit light; the second display area includes at least one third light-emitting device and a plurality of external driving circuits, the plurality of external driving circuits include a second driving circuit and a third driving circuit, the second driving circuit is connected to the second light-emitting device through a lead wire, the second driving circuit is configured to drive the second light-emitting device to emit light, the third driving circuit is connected to the third light-emitting device, and the third driving circuit is configured to drive the third light-emitting device to emit light.

For example, a plurality of the third light-emitting devices are provided, and in a first direction, the plurality of external driving circuits and the plurality of third light-emitting devices are arranged periodically, and an arrangement period of the plurality of external driving circuits is less than an arrangement period of the plurality of third light-emitting devices.

For example, a ratio of the arrangement period of the plurality of external driving circuits to the arrangement period of the plurality of third light-emitting devices is greater than or equal to 1/2 and less than or equal to 9/10.

For example, the first light-emitting device includes a first anode layer disposed on a base substrate, and the third light-emitting device includes a second anode layer disposed on the base substrate; a ratio of an orthographic projection area of the first driving circuit on the base substrate to an orthographic projection area of the first anode layer on the base substrate is less than a ratio of an orthographic projection area of the third driving circuit on the base substrate to an orthographic projection area of the second anode layer on the base substrate.

For example, an orthographic projection of the first anode layer on the base substrate covers an orthographic projection of the first driving circuit on the base substrate.

For example, the first display area is divided into two sub-areas, and the light-emitting devices in one sub-area are all first light-emitting devices and the light-emitting devices in the other sub-area are all second light-emitting devices.

For example, a plurality of first light-emitting devices are provided, a plurality of second light-emitting devices are provided, the plurality of first light-emitting devices constitute a plurality of first light-emitting device groups, the plurality of second light-emitting devices constitute a plurality of second light-emitting device groups, the plurality of first light-emitting device groups and the plurality of second light-emitting device groups are alternately arranged, each of the plurality of first light-emitting device groups includes at least one column of first light-emitting devices, and each of the plurality of second light-emitting device groups includes at least one column of second light-emitting devices.

For example, the first light-emitting device includes a green light light-emitting device and/or a blue light light-emitting device; and the second light-emitting device includes at least one selected from the group consisting of a green light light-emitting device, a blue light light-emitting device, and a red light light-emitting device.

For example, the first light-emitting device includes a red light light-emitting device and/or a blue light light-emitting device; and the second light-emitting device includes at least one selected from the group consisting of a green light light-emitting device, a blue light light-emitting device, and a red light light-emitting device.

For example, the first light-emitting device includes a green light light-emitting device and/or a red light light-emitting device; and the second light-emitting device includes at least one selected from the group consisting of a green light light-emitting device, a blue light light-emitting device, and a red light light-emitting device.

For example, the number of the first light-emitting device is greater than or equal to the number of the second light-emitting device.

For example, the second light-emitting device includes a first color light light-emitting device, a second color light light-emitting device, and a third color light light-emitting device, the lead wire connecting the first color light light-emitting device and the second driving circuit is a first lead wire, the lead wire connecting the second color light light-emitting device and the second driving circuit is a second lead wire, the lead wire connecting the third color light light-emitting device and the second driving circuit is a third lead wire, an area of the first lead wire is less than or equal to an area of the second lead wire, and the area of the second lead wire is less than or equal to an area of the third lead wire.

For example, the first light-emitting device includes a first color light light-emitting device, the second light-emitting device includes a second color light light-emitting device and a third color light light-emitting device, and the first color light light-emitting device, the second color light light-emitting device, and the third color light light-emitting device are configured to emit light of different colors.

For example, the first light-emitting device includes a green light light-emitting device and the second light-emitting device includes a red light light-emitting device and a blue light light-emitting device.

For example, the lead wire includes a first conductive wire and a second conductive wire, the first conductive wire is connected to the second color light light-emitting device, and the second conductive wire is connected to the third color light light-emitting device.

For example, a signal line connected to the first driving circuit includes a first line segment and a second line segment, the first line segment is connected to the second line segment, the first line segment is located in the first display area, the second line segment is located in the second display area, a material of the first line segment includes a transparent conductive material, and a material of the second line segment includes a metal material.

For example, a material of the lead wire includes a transparent conductive material, and the lead wire and the first line segment are respectively located in different film layers.

For example, the display panel further includes a plurality of signal lines connected to the first driving circuit, wherein at least one signal line in the plurality of signal lines is arranged in segments.

For example, the signal line arranged in segments includes a plurality of signal portions located in different layers.

For example, the signal line arranged in segments includes a first signal portion and a second signal portion, a material of the first signal portion includes a transparent conductive metal oxide, and a material of the second signal portion includes a metal.

For example, the first display area includes a driving circuit arranging area and a wiring area, the first signal portion is located in the driving circuit arranging area, and the second signal portion is located in the wiring area.

For example, the display panel further includes a light-emitting control signal line, a reset control signal line, and a reset signal line, wherein a pixel circuit includes a driving module, a light-emitting control circuit, and a reset circuit, the pixel circuit includes at least one of the first driving circuit, the second driving circuit, and the third driving circuit; the light-emitting control signal line is connected to a control terminal of the light-emitting control circuit, the reset control signal line is connected to a control terminal of the reset circuit, the reset signal line is connected to a first electrode of the reset circuit, and at least one of the light-emitting control signal line, the reset control signal line, and the reset signal line is arranged in segments in the first display area.

For example, the reset circuit includes a first reset transistor and a second reset transistor, the first reset transistor is configured to reset a control terminal of the driving module, the second reset transistor is configured to reset a first electrode of a light-emitting device, the light-emitting device includes at least one of the first light-emitting device, the second light-emitting device, and the third light-emitting device, and in a same pixel circuit located in the first display area, the first reset transistor and the second reset transistor share a same reset signal line.

For example, a layout of the second driving circuit is the same as a layout of the third driving circuit, and a layout of the first driving circuit is different from the layout of the second driving circuit or the third driving circuit.

For example, the first driving circuit includes a driving transistor, a first reset transistor, a second reset transistor, a data writing transistor, and a threshold compensation transistor, a first electrode of the first reset transistor is electrically connected to a first reset signal line, and a second electrode of the first reset transistor is electrically connected to a gate electrode of the driving transistor, a first electrode of the second reset transistor is electrically connected to a second reset signal line, and a second electrode of the second reset transistor is connected to the first light-emitting device, a first electrode of the data writing transistor is electrically connected to a first electrode of the driving transistor, and a second electrode of the data writing transistor is configured to be connected to a data line; a first electrode of the threshold compensation transistor is electrically connected to a second electrode of the driving transistor, and a second electrode of the threshold compensation transistor is electrically connected to the gate electrode of the driving transistor, and the first reset signal line and the second reset signal line are a same reset signal line.

For example, a gate electrode of the second reset transistor, a gate electrode of the data writing transistor, and a gate electrode of the threshold compensation transistor are all connected to a same gate signal line.

For example, pixels per inch of the first display area is less than or equal to pixels per inch of the second display area.

For example, the second display area surrounds the first display area.

The present disclosure provides a display apparatus, including: a photosensitive element and any one of the display panels as described above, an orthographic projection of the photosensitive element on the display panel overlaps with the first display area.

BRIEF DESCRIPTION OF THE DRAWINGS

In order to clearly illustrate the technical solution of the embodiments of the present disclosure, the drawings of the embodiments will be briefly described in the following. It is obvious that the described drawings are only related to some embodiments of the present disclosure and thus are not limitative of the present disclosure.

DETAILED DESCRIPTION

For more clear understanding of the objectives, technical details and advantages of the embodiments of the present disclosure, the technical solutions of the embodiments will be described in a clearly and fully understandable way in connection with the drawings related to the embodiments of the present disclosure. Apparently, the described embodiments are just a part but not all of the embodiments of the present disclosure. Based on the described embodiments herein, those skilled in the art can obtain other embodiment(s), without any inventive work, which should be within the scope of the present disclosure.

Unless otherwise defined, all the technical and scientific terms used herein have the same meanings as commonly understood by one of ordinary skill in the art to which the present disclosure belongs. The terms "first," "second," etc., which are used in the present disclosure, are not intended to indicate any sequence, amount or importance, but distinguish various components. Also, the terms "comprise", "comprising", "include", "including", etc., are intended to specify that the elements or the objects stated before these terms encompass the elements or the objects and equivalents thereof listed after these terms, but do not preclude the other elements or objects. The phrases "connect", "connected" and the like are not limited to a physical or mechanical connection, but also include an electrical connection, either directly or indirectly. "On," "under," "right," "left" and the like are only used to indicate relative position relationship, and when the position of the described object is changed, the relative position relationship may be changed accordingly.

In the display panel in the related art, only light-emitting devices are provided in the camera area, and the driving signals for controlling the light-emitting devices to emit light are drawn out from pixel circuits that are in the same row as the light-emitting devices and are in a horizontal direction, and the lead wires for transmitting the driving signals are made of a transparent conductive material. The inventor(s) found that due to the different lengths of the lead wires, the coupling capacitance caused by the lead wires is quite different, thereby leading to poor display uniformity of the display panel.

In order to solve the above problems, embodiments of the present disclosure provide a display panel and a display apparatus comprising the display panel, which will be described in detail below.

Figure 1:
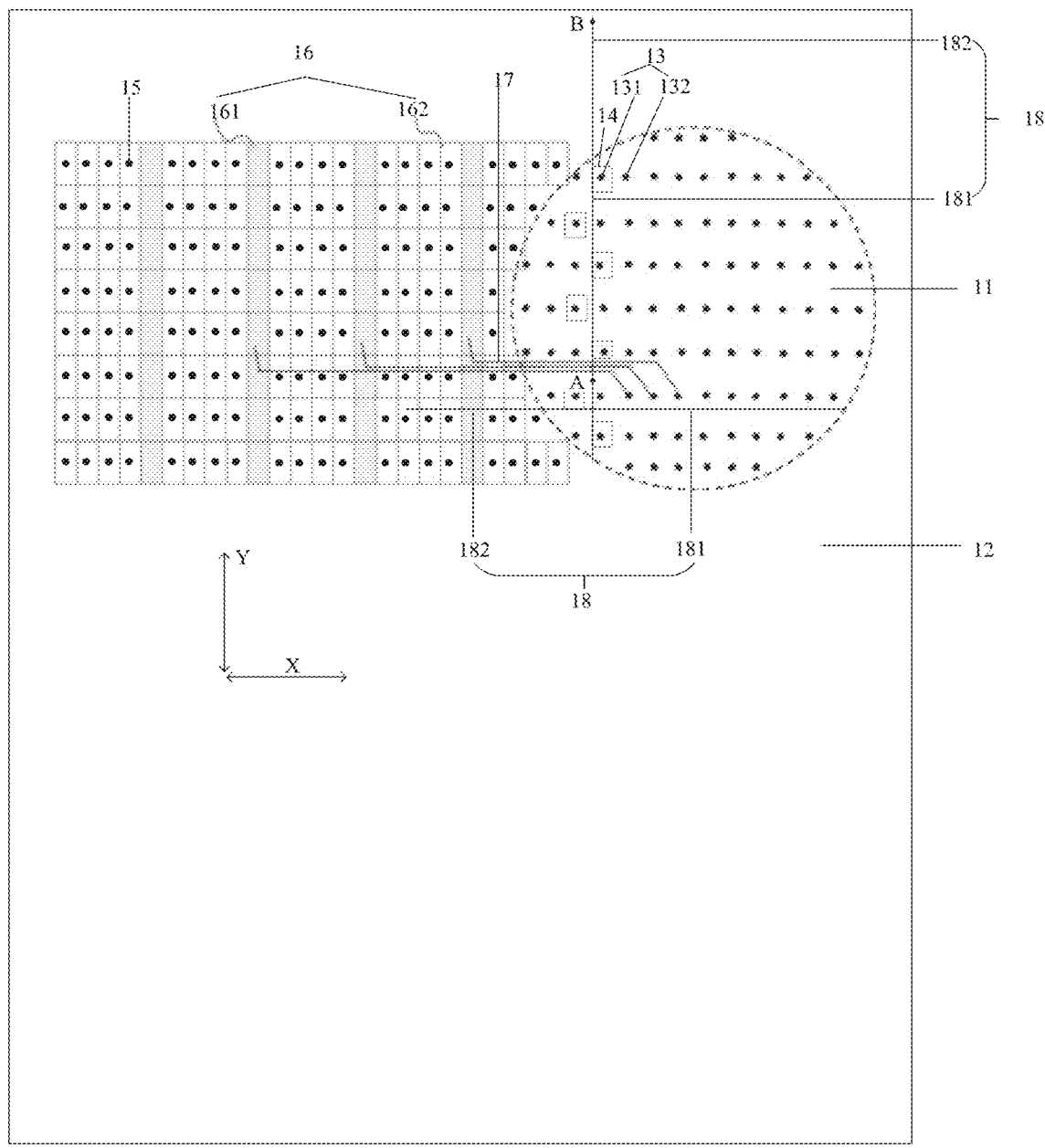
FIG. 1 is a schematic structural plan view of a display panel provided by an embodiment of the present disclosure.

FIG. 1 is a schematic structural plan view of a display panel provided by an embodiment of the present disclosure. Embodiments of the present disclosure provide a display panel, as illustrated in FIG. 1, including a first display area 11 and a second display area 12, the transmittance of the first display area 11 being greater than that of the second display area 12. As illustrated in FIG. 1, the second display area 12 is located on at least one side of the first display area 11. Embodiments of the present disclosure are illustrated by taking the second display area 12 surrounding the first display area 11 as an example.

As illustrated in FIG. 1, the first display area 11 includes a plurality of built-in light-emitting devices 13 and at least one first driving circuit 14, the plurality of built-in light-emitting devices 13 include a first light-emitting device 131 and a second light-emitting device 132, the first driving circuit 14 is connected to the first light-emitting device 131, and the first driving circuit 14 is configured to drive the first light-emitting device 131 to emit light. The first driving circuit 14 can also be referred to as a built-in driving circuit.

As illustrated in FIG. 1, the second display area 12 includes at least one third light-emitting device 15 and a plurality of external driving circuits 16, the plurality of external driving circuits 16 include a second driving circuit 161 and a third driving circuit 162, the second driving circuit 161 is connected to the second light-emitting device 132 through a lead wire 17, the second driving circuit 161 is configured to drive the second light-emitting device 132 to emit light, the third driving circuit 162 is connected to a third light-emitting device 15, and the third driving circuit 162 is configured to drive the third light-emitting device 15 to emit light.

For example, in the embodiments of the present disclosure, built-in and external can be relative to the first display area 11, a light-emitting device located in the first display area 11 can be referred to as a built-in light-emitting device (built-in light-emitting device 13 illustrated in FIG. 1), and a driving circuit located in the first display area 11 can be referred to as a built-in driving circuit (first driving circuit 14 illustrated in FIG. 1).

For example, in the embodiments of the present disclosure, according to whether the light-emitting devices and the driving circuits are arranged separately, that is, whether they are located in the same display area, driving circuits can be divided into in-situ driving circuits and ex-situ driving circuits. As illustrated in FIG. 1, the second driving circuit 161 and the second light-emitting device 132 are arranged separately and located in the second display area 12 and the first display area 11 respectively, and thus the second driving circuit 161 can be referred to as an ex-situ driving circuit. As illustrated in FIG. 1, the third driving circuit 162 and the third light-emitting device 15 are both located in the second display area 12, and thus the third driving circuit 162 can be referred to as an in-situ driving circuit. As illustrated in FIG. 1, the first light-emitting device 131 and the first driving circuit 14 are both located in the first display area 11, and thus the first driving circuit 14 can be referred to an in-situ driving circuit.

In the embodiments of the present disclosure, the direction connecting the second light-emitting device 132 and the second driving circuit 161 is defined as a first direction X, as illustrated in FIG. 1.

As illustrated in FIG. 1, the second display area 12 is located on at least one side of the first display area 11 along the first direction X. Optionally, the second display area 12 can surround the first display area 11.

The first light-emitting device 131, the second light-emitting device 132 and the third light-emitting device 15 can all be organic light-emitting devices or quantum dot light-emitting devices. No limitation is made in this regard in the embodiments of the present disclosure.

The shape of the first display area 11 can be a rectangle, a square, a circle or an ellipse. No limitation is made in this regard in the embodiments of the present disclosure.

In the display panel provided by the embodiments of the present disclosure, by arranging the first driving circuit 14 connected to the first light-emitting device 131 in the first display area 11, the number of lead wires 17 connecting built-in light-emitting devices 13 and external driving circuits 16 can be reduced, thereby reducing the diffraction effect caused by the lead wires 17 and improving image quality; the length of the lead wire 17 can also be shortened, thereby reducing the coupling capacitance caused by the lead wire 17 and improving the display uniformity of the first display area 11. In addition, by arranging the second driving circuit 161 connected to the second light-emitting device 132 in the second display area 12, the transmittance of the first display area 11 can be improved.

Because the number of the lead wires 17 is reduced, the length of the lead wires 17 can be shortened and the coupling capacitance can be reduced by optimizing the design, thereby reducing the influence of the coupling capacitance on the turn-on voltage and further improving display uniformity. In addition, the decrease in the number of the lead wires 17 can also increase process stability.

In the display panel and the display apparatus provided by the embodiments of the present disclosure, by arranging the first driving circuit connected to the first light-emitting device in the first display area, the number of lead wires connecting built-in light-emitting devices and external driving circuits can be reduced, thereby reducing the diffraction effect caused by the lead wires and improving image quality; the length of the lead wires can also be shortened, thereby reducing the coupling capacitance caused by the lead wires and improving the display uniformity of the first display area. In addition, by arranging the second driving circuit connected to the second light-emitting device in the second display area, the transmittance of the first display area can be improved.

In a specific implementation, there can be a plurality of third light-emitting devices 15. In the first direction X, the external driving circuits 16 and the third light-emitting device 15 can be arranged periodically. The arrangement period of the external driving circuit 16 and the arrangement period of the third light-emitting device 15 can be the same or different.

Figure 2:
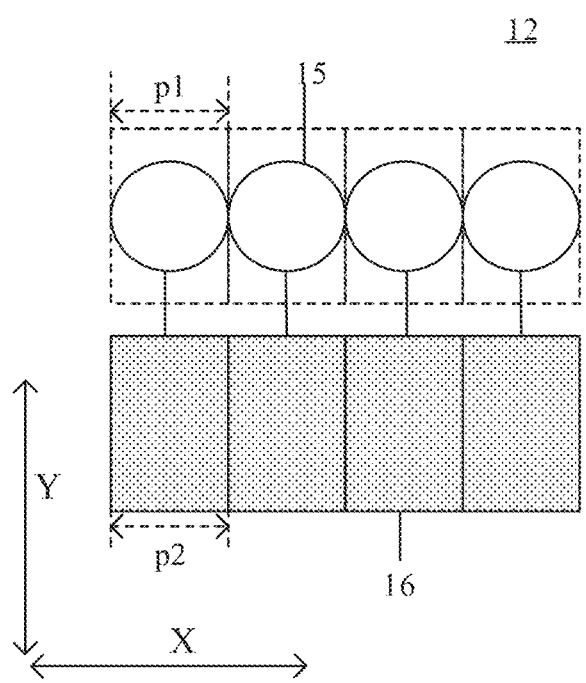
FIG. 2 is a schematic structural diagram of a third light-emitting device and an external driving circuit in a display panel provided by an embodiment of the present disclosure.

FIG. 2 is a schematic structural diagram of a third light-emitting device and an external driving circuit in a display panel provided by an embodiment of the present disclosure. As illustrated in FIG. 2, in the first direction X, the arrangement period p2 of the external driving circuit 16 is the same as the arrangement period p1 of the third light-emitting device 15, for example, both are 31.6 μm.

Figure 3:
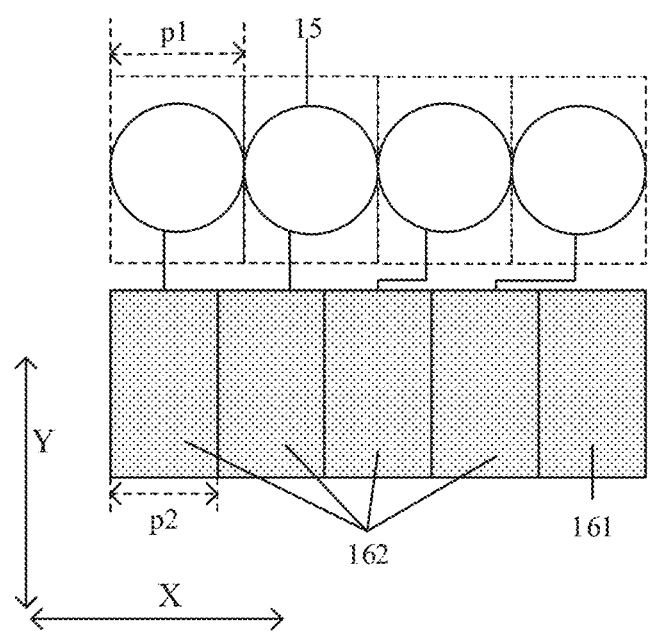
FIG. 3 is a schematic structural diagram of a third light-emitting device and an external driving circuit in another display panel provided by an embodiment of the present disclosure.

In an optional implementation manner, as illustrated in FIG. 3, the arrangement period p2 of the external driving circuit 16 is less than the arrangement period p1 of the third light-emitting device 15.

FIG. 3 is a schematic structural diagram of a third light-emitting device and an external driving circuit in another display panel provided by an embodiment of the present disclosure. In this implementation, as illustrated in FIG. 3, the arrangement periods of the external driving circuit 16 and the third light-emitting device 15 in the first direction X are different. The arrangement period p2 of the external driving circuit 16 is, for example, 27.6 μm, and the arrangement period p1 of the third light-emitting device 15 is 31.6 μm. For example, the arrangement period p1 of the third light-emitting device 15 is 4 μm wider than the arrangement period p2 of the external driving circuit 16 in the first direction X. The arrangement period p2 of the external driving circuit 16 and the arrangement period p1 of the third light-emitting device 15 are not limited to the above description.

In this implementation, as illustrated in FIG. 3, by setting a small arrangement period of the external driving circuit 16 in the second display area 12, in the first direction X of the second display area 12, the number of external driving circuits 16 can be greater than the number of third light-emitting devices 15 to ensure that each third light-emitting device 15 is connected to a corresponding external driving circuit 16, that is, a third driving circuit 162, thereby ensuring the normal display of the second display area 12. There is also an external driving circuit 16 not connected to any third light-emitting device 15, that is, a second driving circuit 161. The second driving circuit 161 can be connected to a second light-emitting device 132 of the first display area 11 for driving the second light-emitting device 132 in the first display area 11.

In this way, the second driving circuit 161 connected to the second light-emitting device 132 can be disposed in the second display area 12 without sacrificing the pixel density, so as to improve the transmittance of the first display area 11 and ensure that the first display area 11 has a relatively high display uniformity.

The following is an example. Referring to FIG. 1, assuming that the first display area 11 is a circular region, the arrangement period p1 of the third light-emitting device 15 in the first direction X is 31.6 μm and the arrangement period p2 of the external driving circuit 16 in the first direction X is 27.6 μm. Assuming that there are altogether 48 second light-emitting devices 132 in a row along the first direction X within the first display area 11, 48 redundant second driving circuits 161 need to be provided in the second display area 12 so as to control these second light-emitting devices 132 to emit light. Therefore, a total space of 48*27.6 μm needs to be compressed to provide 48 redundant second driving circuits 161. Because each third light-emitting device 15 can compress a space of 4 μm, the number of corresponding third light-emitting devices 15 is 48*27.6 μm/4 μm, which is 332 after rounding. That is, 332 third driving circuits 162 and 48 second driving circuits 161 can be provided in a space of 332*31.6 μm. The 332 third driving circuits 162 are used for driving the 332 third light-emitting devices 15 in the second display area 12 to emit light, and the 48 second driving circuits 161 are used for driving the 48 second light-emitting devices in the first display area 11 to emit light.

Optionally, the ratio of the arrangement period p2 of the external driving circuit 16 to the arrangement period p1 of the third light-emitting device 15 can be greater than or equal to 1/2 and less than or equal to 9/10. No limitation is made in this regard in the embodiments of the present disclosure. For example, the ratio can be 2/3, 3/4, 4/5, 5/6, 6/7, 7/8, 8/9, or the like. As illustrated in FIG. 3, the ratio of the arrangement period p2 of the external driving circuit 16 to the arrangement period p1 of the third light-emitting device 15 is 4/5.

For example, the arrangement period can refer to a pitch. The arrangement period p2 of the external driving circuit 16 refers to the pitch of the external driving circuit 16. The arrangement period p1 of the third light-emitting device 15 refers to the pitch of the arrangement period p1 of the third light-emitting device 15. For example, the arrangement period p1 can be a fixed value and the arrangement period p2 can be a fixed value. Of course, in different embodiments, the arrangement period p1 can be a different value and the arrangement period p2 can be a different value.

Figure 4:
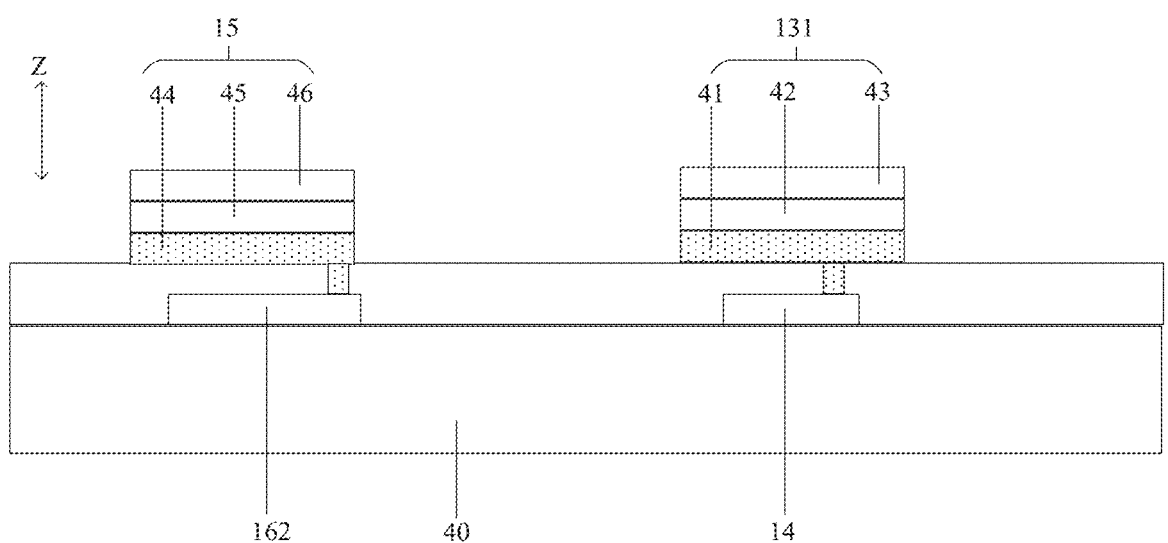
FIG. 4 is a schematic structural cross-sectional diagram of a display panel provided by an embodiment of the present disclosure.

FIG. 4 is a schematic structural cross-sectional diagram of a display panel provided by an embodiment of the present disclosure. As illustrated in FIG. 4, the first light-emitting device 131 can include a first anode layer 41 disposed on a base substrate 40, and can also include a first light-emitting layer 42 disposed on the side of the first anode layer 41 facing away from the base substrate 40 and a first cathode layer 43, the first light-emitting layer 42 is disposed between the first anode layer 41 and the first cathode layer 43. The first driving circuit 14 can be disposed on the side of the first anode layer 41 close to the base substrate 40, that is, disposed between the base substrate 40 and the first anode layer 41.

As illustrated in FIG. 4, the third light-emitting device 15 can include a second anode layer 44 disposed on a base substrate 40, and can also include a second light-emitting layer 45 disposed on the side of the second anode layer 44 away from the base substrate 40 and a second cathode layer 46, the second light-emitting layer 45 is disposed between the second anode layer 44 and the second cathode layer 46. The third driving circuit 162 can be disposed on the side of the second anode layer 44 close to the base substrate 40, that is, disposed between the base substrate 40 and the second anode layer 44.

Figure 5:
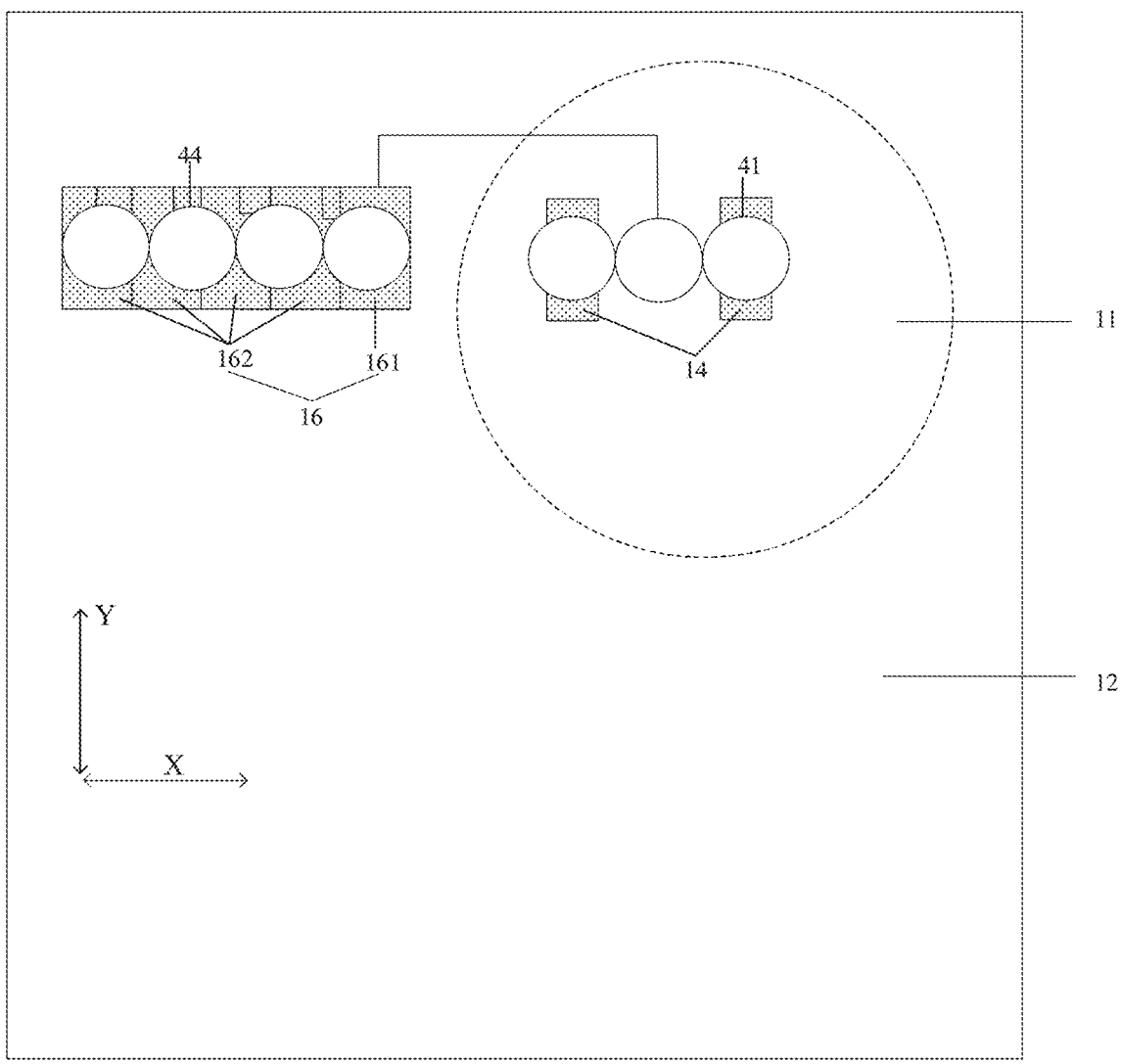
FIG. 5 is a schematic plan view of a structural comparison of a first display area and a second display area provided by an embodiment of the present disclosure.

FIG. 5 is a schematic plan view of a structural comparison of a first display area and a second display area provided by an embodiment of the present disclosure. In an optional implementation, referring to FIG. 4 and FIG. 5, the ratio of the orthographic projection area of the first driving circuit 14 on the base substrate 40 to the orthographic projection area of the first anode layer 41 on the base substrate 40 is less than the ratio of the orthographic projection area of the third driving circuit 162 on the base substrate 40 to the orthographic projection area of the second anode layer 44 on the base substrate 40.

The orthographic projection areas of the second driving circuit 161 and the third driving circuit 162 respectively on the base substrate 40 can be the same.

As illustrated in FIG. 4 and FIG. 5, in the case where the orthographic projection area of the first anode layer 41 on the base substrate 40 is equal to the orthographic projection area of the second anode layer 44 on the base substrate 40, the orthographic projection area of the first driving circuit 14 on the base substrate 40 is less than the orthographic projection area of the third driving circuit on the base substrate 40.

In this implementation, compared with the external driving circuit 16, the compression ratio of the driving circuit, that is, the first driving circuit 14, in the first display area 11, relative to the first anode layer 41 is large. Because a driving circuit usually includes a plurality of metal layers, the transmittance thereof is relatively poor. In this implementation, by reasonably designing the positional relationship between the first anode layer 41 and the first driving circuit 14, the influence of the first driving circuit 14 on the aperture ratio of the first display area 11 can be reduced, thereby increasing the aperture ratio of the first display area 11.

Figure 6:
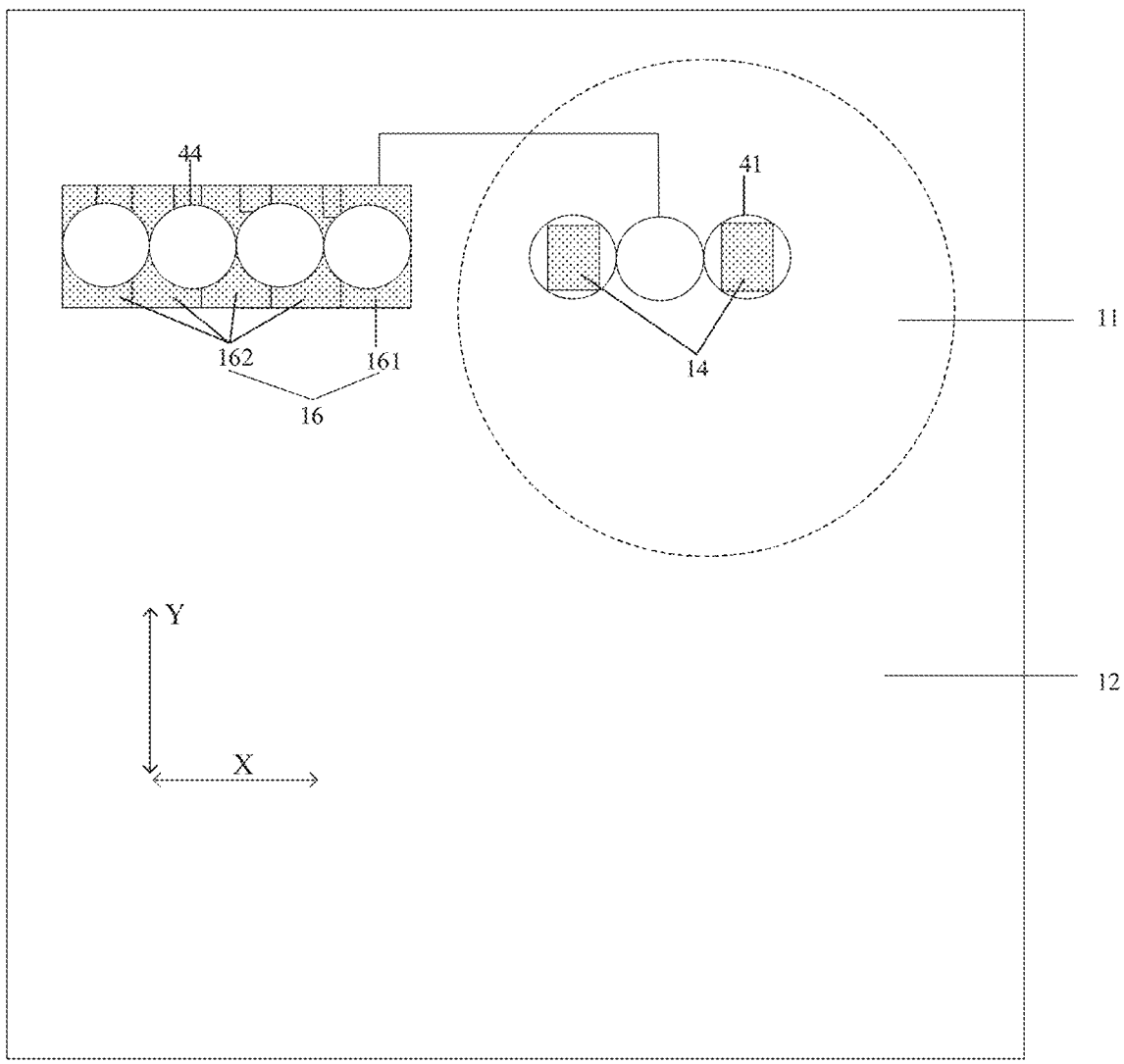
FIG. 6 is another schematic plan view of a structural comparison of a first display area and a second display area provided by an embodiment of the present disclosure.

FIG. 6 is another schematic plan view of a structural comparison of a first display area and a second display area provided by an embodiment of the present disclosure. Optionally, as illustrated in FIG. 4 and FIG. 6, the orthographic projection of the first anode layer 41 on the base substrate 40 can cover the orthographic projection of the first driving circuit 14 on the base substrate 40. Because the transmittance of the driving circuit is poor, the transmittance of the first display area 11 can be further improved by setting the first anode layer 41 to completely cover the first driving circuit 14.

For example, the first anode layer 41 can also be referred to as a first electrode of the first light-emitting device 131, and the first cathode layer 43 can also be referred to as a second electrode of the first light-emitting device 131. For example, the second anode layer 44 can also be referred to as a first electrode of the third light-emitting device 15, and the second cathode layer 46 can also be referred to as a second electrode of the third light-emitting device 15.

In the embodiments of the present disclosure, the first light-emitting device 131 can include one or more of a green light light-emitting device, a blue light light-emitting device, a red light light-emitting device, a white light light-emitting device, and other light-emitting devices. No limitation is made in this regard in the embodiments of the present disclosure.

The built-in light-emitting devices 13 in the first display area 11 except the first light-emitting device 131 can all be second light-emitting devices 132. The second light emitting device 132 can include one or more of a green light light-emitting device, a blue light light-emitting device, a red light light-emitting device, a white light light-emitting device, and other light-emitting devices. No limitation is made in this regard in the embodiments of the present disclosure.

In a first optional implementation manner, the first light-emitting device 131 includes a green light light-emitting device and/or a blue light light-emitting device. In this implementation manner, the first light-emitting device 131 can include a green light light-emitting device, or a blue light light-emitting device, or a green light light-emitting device and a blue light light-emitting device.

In a second optional implementation manner, the first light-emitting device 131 includes a red light light-emitting device and/or a blue light light-emitting device. In this implementation manner, the first light-emitting device 131 can include a red light light-emitting device, or a blue light light-emitting device, or a red light light-emitting device and a blue light light-emitting device.

In a second optional implementation manner, the first light-emitting device 131 includes a green light light-emitting device and/or a red light light-emitting device. In this implementation manner, the first light-emitting device 131 can include a green light light-emitting device, or a red light light-emitting device, or a red light light-emitting device and a green light light-emitting device.

Because the green light light-emitting device is sensitive to the capacitance caused by lead wires 17, in the case where the first light-emitting device 131 includes a green light light-emitting device, the uniformity of the display image can be further improved.

Because the anode area in the blue light light-emitting device is large, in the case where the first light-emitting device 131 includes a blue light light-emitting device, the influence of the first driving circuit 14 connected to the blue light light-emitting device on the aperture ratio can be reduced, which helps to improve the transmittance of the first display area 11.

In an optional implementation manner, the number of first light-emitting devices 131 can be greater than or equal to the number of second light-emitting devices 132.

For built-in light-emitting devices 13 of all colors, the ratio of the number of first light-emitting devices 131 to the number of second light-emitting devices 132 can be greater than or equal to 1, that is, the proportion of the built-in light-emitting devices 13 with their driving circuits located in the first display area 11 is relatively high, thus further reducing the number of lead wires and improving image quality. In a specific implementation, in the built-in light-emitting devices 13 of all colors, the ratio of the number of first light-emitting devices 131 to the number of second light-emitting devices 132 can be, for example, 2:1, 3:1, or the like, and the specific numerical value can be set depending upon actual requirement. No limitation is made in this regard in the embodiments of the present disclosure.

For built-in light-emitting devices 13 of the same color, all of them can be first light-emitting devices 131; all of them can be second light-emitting devices 132; or some of them can be first light-emitting devices 131 and the remaining are second light-emitting devices 132.

Optionally, in the built-in light-emitting devices 13 of the same color, the number of first light-emitting devices 131 can be greater than or equal to the number of second light-emitting devices 132, thus further reducing the number of lead wires and improving image quality. In a specific implementation, in the built-in light-emitting devices 13 of the same color, the ratio of the number of first light-emitting devices 131 to the number of second light-emitting devices 132 can be, for example, 2:1, 3:1, or the like, and the specific numerical value can be set depending upon actual requirement. No limitation is made in this regard in the embodiments of the present disclosure.

In an optional implementation manner, the second light-emitting device 132 includes a green light light-emitting device, a blue light light-emitting device and a red light light-emitting device, the lead wire 17 connecting the green light light-emitting device and the second driving circuit 161 is a first lead wire, the lead wire 17 connecting the red light light-emitting device and the second driving circuit 161 is a second lead wire, and the lead wire 17 connecting the blue light light-emitting device and the second driving circuit 161 is a third lead wire.

For example, the green light light-emitting device can be referred to as a first color light light-emitting device, the red light light-emitting device can be referred to as a second color light light-emitting device, and the blue light light-emitting device can be referred to as a third color light light-emitting device.

For example, the first color light light-emitting device is configured to emit first color light, the second color light light-emitting device is configured to emit second color light, and the third color light light-emitting device is configured to emit third color light. For example, the first color light is green light, the second color light is red light, and the third color light is blue light, but no limitation is made thereto and selection can be made depending upon requirements.

For example, the first color light light-emitting device, the second color light light-emitting device and the third color light light-emitting device are configured to emit light of different colors.

For example, the area of the first lead wire can be less than or equal to the area of the second lead wire, and the area of the second lead wire can be less than or equal to the area of the third lead wire.

Because the sensitivity of the green light light-emitting device, the red light light-emitting device and the blue light light-emitting device to the coupling capacitance caused by the lead wire 17 decreases successively, by setting the area of the first lead wire to be less than or equal to the area of the second lead wire and the area of the second lead wire to be less than or equal to the area of the third lead wire, the influence of the coupling capacitance as a whole can be reduced, image display quality can be improved, and the uniformity of display image can be enhanced.

In the case where the first lead wire, the second lead wire and the third lead wire have the same width perpendicular to their respective extension directions, the length of the first lead wire can be set to be less than or equal to the length of the second lead wire and the length of the second lead wire can be set to be less than or equal to the third lead wire.

Figure 7:
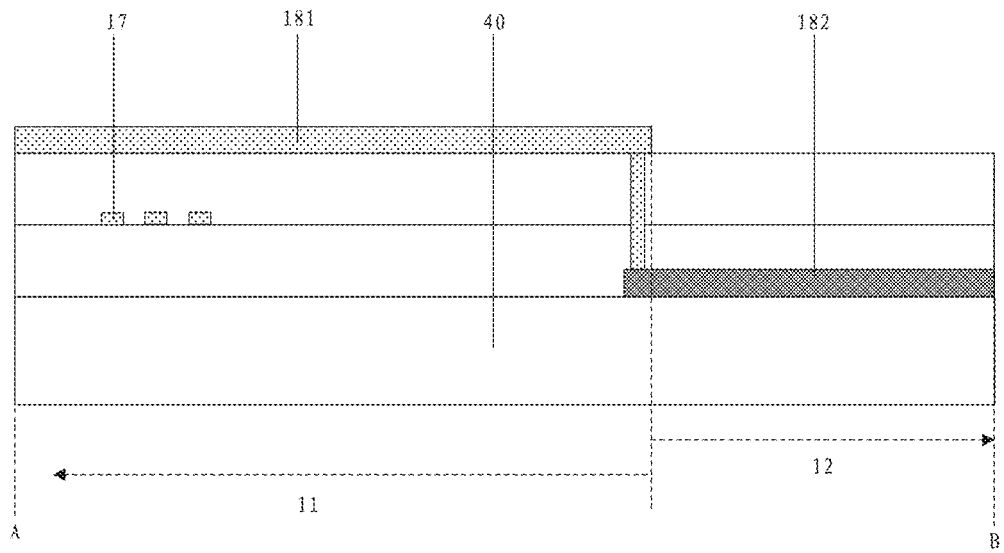
FIG. 7 is a schematic structural cross-sectional diagram of a signal line in a display panel provided by an embodiment of the present disclosure.

FIG. 7 is a schematic structural cross-sectional diagram of a signal line in a display panel provided by an embodiment of the present disclosure. In an optional implementation, as illustrated in FIG. 1 and FIG. 7, the signal line 18 connected to the first driving circuit 14 includes a first line segment 181 and a second line segment 182, the first line segment 181 is connected to the second line segment 182, the first line segment 181 is located in the first display area 11, and the second line segment 182 is located in the second display area 12.

The first line segment 181 and the second line segment 182 can be disposed in different film layers, for example, an insulating layer can be disposed between the two line segments, and the first line segment 181 and the second line segment 182 can be connected through via holes disposed in the insulating layer, as illustrated in FIG. 7. The first line segment 181 and the second line segment 182 can also be disposed in the same film layer, or connected by overlapping. No limitation is made in this regard in the embodiments of the present disclosure.

Figure 8:
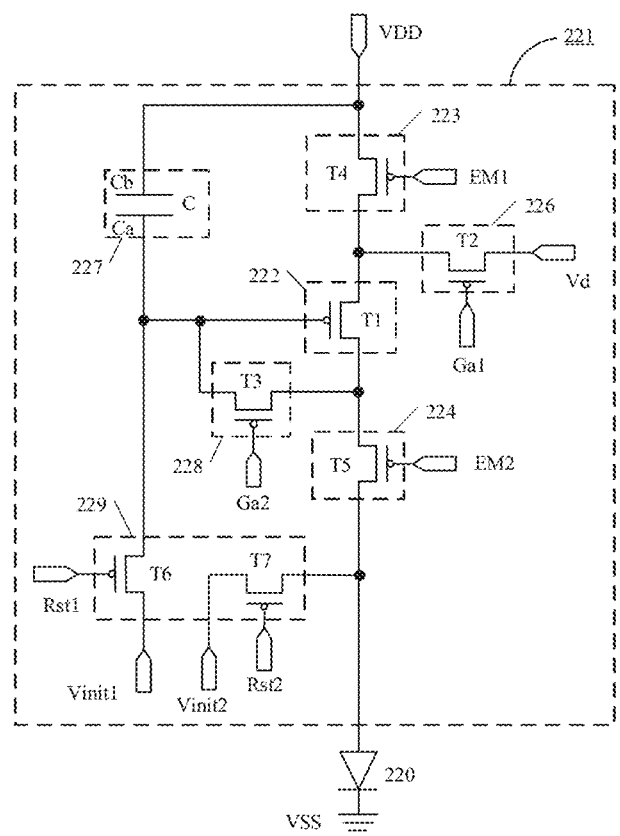
FIG. 8 is a schematic structural diagram of a pixel circuit in a display panel provided by an embodiment of the present disclosure.

The signal line 18 can be, for example, a gate signal line (such as the first scanning signal line Ga1 or the second scanning signal line Ga2 in FIG. 8), a light-emitting control signal line (such as the first light-emitting control signal line EM1 or the second light-emitting control signal line EM2 in FIG. 8), a data signal line (such as the data line Vd in FIG. 8), a reset control signal line (such as the first reset control signal line Rst1 or the second reset control signal line Rst2 in FIG. 8), a power supply signal line, a reset signal line, or the like.

For example, the material of the first line segment 181 can be a transparent conductive material.

For example, the material of the second line segment 182 can be a metal material.

For example, the transparent conductive material can be a metal, a metal oxide, an inorganic material, an organic material or a composite material, or the like. Specifically, the transparent conductive material can be indium tin oxide (ITO), indium zinc oxide (IZO), a carbon nanotube, nano-silver, graphene, or the like. No limitation is made in this regard in the embodiments of the present disclosure.

For example, the material of the lead wire 17 can be ITO. The material of the first line segment 181 can be ITO or nano-silver. Because the sheet resistance of nano-silver is low and the transmittance thereof is high, when nano-silver is used as the material of the first line segment 181, the resistance of the first line segment 181 can be reduced and the transmittance of the first display area 11 can be improved.

Optionally, as illustrated in FIG. 7, the lead wire 17 and the first line segment 181 are respectively located in different film layers. By arranging the lead wire 17 and the first line segment 181 in two film layers respectively, the wiring space can be increased, thereby helping to realize the first display area 11 having a high pixel density. As illustrated in FIG. 7, an insulating material can be disposed between the lead wire 17 and the first line segment 181. FIG. 7 is exemplified by the film layer where the lead wire 17 is located being closer to the base substrate, but no limitation is made thereto. In other embodiments, the film layer where the first line segment 181 is located can be closer to the base substrate than the film layer where the lead wire 17 is located.

In an optional implementation manner, the pixel density of the first display area 11 is less than or equal to the pixel density of the second display area 12. For example, pixel density refers to the number of light-emitting devices disposed per inch. In the case where the pixel density of the first display area 11 is less than the pixel density of the second display area 12, the transmittance of the first display area 11 can be further improved.

In the embodiments of the present disclosure, the circuit structures of the first driving circuit 14, the second driving circuit 161 and the third driving circuit 162 can be the same or different. No limitation is made in this regard in the embodiments of the present disclosure.

FIG. 8 is a schematic structural diagram of a pixel circuit in a display panel provided by an embodiment of the present disclosure. Optionally, at least one of the first driving circuit 14, the second driving circuit 161 and the third driving circuit 162 is the pixel circuit 221 as illustrated in FIG. 8. The light-emitting device 220 in FIG. 8 can be a first light-emitting device 131, a second light-emitting device 132 or a third light-emitting device 15. The light-emitting device 220 can be an organic light-emitting device, but is not limited thereto.

As illustrated in FIG. 8, the pixel circuit 221 includes a first light-emitting control circuit 223, a second light-emitting control circuit 224, and a driving module 222.

For example, as illustrated in FIG. 8, the driving module 222 includes a control terminal, a first terminal, and a second terminal, and is configured to provide a driving current for driving the light-emitting device 220 to emit light. For example, the first light-emitting control circuit 223 is connected to the first terminal of the driving module 222 and a first voltage terminal VDD, respectively, and is configured to realize the connection or disconnection between the driving module 222 and the first voltage terminal VDD; and the second light-emitting control circuit 224 is electrically connected to the second terminal of the driving module 222 and the first electrode of the light-emitting device 220, and is configured to realize the connection or disconnection between the driving module 222 and the light-emitting device 220.

For example, as illustrated in FIG. 8, the pixel circuit 221 further includes a data writing circuit 226, a storage circuit 227, a threshold compensation circuit 228, and a reset circuit 229. The data writing circuit 226 is electrically connected to the first terminal of the driving module 222, and is configured to write data signals into the storage circuit 227 under the control of a scanning signal; the storage circuit 227 is electrically connected to the control terminal of the driving module 222 and the first voltage terminal VDD respectively, and is configured to store data signals; the threshold compensation circuit 228 is electrically connected to the control terminal and the second terminal of the driving module 222, respectively, and is configured to perform threshold compensation on the driving module 222; the reset circuit 229 is electrically connected to the control terminal of the driving module 222 and the first electrode of the light-emitting device 220, and is configured to reset the control terminal of the driving module 222 and the first electrode of the light-emitting device 220 under the control of a reset control signal.

For example, as illustrated in FIG. 8, the driving module 222 includes a driving transistor T1, the control terminal of the driving module 222 includes a gate electrode of the driving transistor T1, the first terminal of the driving module 222 includes a first electrode of the driving transistor T1, and the second terminal of the driving module 222 includes a second electrode of the driving transistor T1.

For example, as illustrated in FIG. 8, the data writing circuit 226 includes a data writing transistor T2, the storage circuit 227 includes a capacitor C, the threshold compensation circuit 228 includes a threshold compensation transistor T3, and the first light-emitting control circuit 223 includes a first light-emitting control transistor T4, the second light-emitting control circuit 224 includes a second light-emitting control transistor T5, the reset circuit 229 includes a first reset transistor T6 and a second reset transistor T7, and the reset control signal can include a first reset control signal and a second reset control signal.

For example, as illustrated in FIG. 8, the first electrode of the data writing transistor T2 is electrically connected to the first electrode of the driving transistor T1, the second electrode of the data writing transistor T2 is configured to be electrically connected to the data line Vd so as to receive a data signal, and the gate electrode of the data writing transistor T2 is configured to be electrically connected to a first scanning signal line Ga1 so as to receive a scanning signal; the first electrode Cb of the capacitor C is electrically connected to a first power supply terminal VDD, and the second electrode Ca of the capacitor C is electrically connected to the gate electrode of the driving transistor T1; the first electrode of the threshold compensation transistor T3 is electrically connected to the second electrode of the driving transistor T1, the second electrode of the threshold compensation transistor T3 is electrically connected to the gate electrode of the driving transistor T1, and the gate electrode of the threshold compensation transistor T3 is configured to be electrically connected to a second scanning signal line Ga2 so as to receive a compensation control signal; the first electrode of the first reset transistor T6 is configured to be electrically connected to a first reset power supply terminal Vinit1 so as to receive a first reset signal, the second electrode of the first reset transistor T6 is electrically connected to the gate electrode of the driving transistor T1, and the gate electrode of the first reset transistor T6 is configured to be electrically connected to a first reset control signal line Rst1 so as to receive a first reset control signal; the first electrode of the second rest transistor T7 is configured to be electrically connected to a second reset power supply terminal Vinit2 so as to receive a second reset signal, the second electrode of the second reset transistor T7 is electrically connected to the first electrode of the light-emitting device 220, and the gate electrode of the second reset transistor T7 is configured to be electrically connected to a second reset control signal line Rst2 so as to receive a second reset control signal; the first electrode of the first light-emitting control transistor T4 is electrically connected to the first power supply terminal VDD, the second electrode of the first light-emitting control transistor T4 is electrically connected to the first electrode of the driving transistor T1, and the gate electrode of the first light-emitting control transistor T4 is configured to be electrically connected to a first light-emitting control signal line EM1 so as to receive a first light-emitting control signal; the first electrode of the second light-emitting control transistor T5 is electrically connected to the second electrode of the driving transistor T1, the second electrode of the second light-emitting control transistor T5 is electrically connected to the first electrode of the light-emitting device 220, and the gate electrode of the second light-emitting control transistor T5 is configured to be electrically connected to a second light-emitting control signal line EM2 so as to receive a second light-emitting control signal; and the second electrode of the light-emitting device 220 is electrically connected to a second power supply terminal VSS.

For example, the light-emitting device 220 includes an organic light-emitting element, but is not limited thereto, and the type of the light-emitting device 220 can be determined depending upon requirements.

For example, one of the first power supply terminal VDD and the second power supply terminal VSS is a high-voltage terminal, and the other is a low-voltage terminal. For example, in the embodiment illustrated in FIG. 8, the first power supply terminal VDD is a voltage source so as to output a constant first voltage, the first voltage being a positive voltage; and the second power supply terminal VSS can be a voltage source so as to output a constant second voltage, the second voltage being a negative voltage. For example, in some examples, the second power supply terminal VSS can be grounded.

For example, as illustrated in FIG. 8, the scanning signal and the compensation control signal can be the same, that is, the gate electrode of the data writing transistor T2 and the gate electrode of the threshold compensation transistor T3 can be electrically connected to the same signal line, for example, a first scanning signal line Ga1, so as to receive the same signal (for example, a scanning signal). In this case, the display panel (display substrate) may not be provided with a second scanning signal line Ga2, thus reducing the number of signal lines. For another example, the gate electrode of the data writing transistor T2 and the gate electrode of the threshold compensation transistor T3 can also be electrically connected to different signal lines respectively, that is, the gate electrode of the data writing transistor T2 is electrically connected to the first scanning signal line Ga1, the gate electrode of the threshold compensation transistor T3 is electrically connected to the second scanning signal line Ga2, and the signals transmitted by the first scanning signal line Ga1 and the second scanning signal line Ga2 are the same.

It should be noted that the scanning signal and the compensation control signal can also be different, so that the gate electrode of the data writing transistor T2 and the threshold compensation transistor T3 can be controlled separately, thereby increasing the flexibility to control a pixel circuit.

For example, as illustrated in FIG. 8, the first light-emitting control signal and the second light-emitting control signal can be the same, that is, the gate electrode of the first light-emitting control transistor T4 and the gate electrode of the second light-emitting control transistor T5 can be electrically connected to the same signal line, for example, both are electrically connected to the first light-emitting control signal line EM1 so as to receive the same signal (for example, a first light-emitting control signal). In this case, the display panel (display substrate) may not be provided with the second light-emitting control signal line EM2, thus reducing the number of signal lines. For another example, the gate electrode of the first light-emitting control transistor T4 and the gate electrode of the second light-emitting control transistor T5 can also be electrically connected to different signal lines respectively, that is, the gate electrode of the first light-emitting control transistor T4 is electrically connected to the first light-emitting control signal line EM1, the gate electrode of the second light-emitting control transistor T5 is electrically connected to the second light-emitting control signal line EM2, and the signals transmitted by the first light-emitting control signal line EM1 and the second light-emitting control signal line EM2 are the same.

It should be noted that in the case where the first light-emitting control transistor T4 and the second light-emitting control transistor T5 are transistors of different types, for example, the first light-emitting control transistor T4 is a P-type transistor and the second light-emitting control transistor T5 is an N-type transistor, the first light-emitting control signal and the second light-emitting control signal can also be different. No limitation is made in this regard in the embodiments of the present disclosure.

For example, the first reset control signal and the second reset control signal can be the same, that is, the gate electrode of the first reset transistor T6 and the gate electrode of the second reset transistor T7 can be electrically connected to the same signal line, for example, the first reset control signal line Rst1, so as to receive the same signal (for example, a first reset control signal). In this case, the display panel (display substrate) may not be provided with the second reset control signal line Rst2, thus reducing the number of signal lines. For another example, the gate electrode of the first reset transistor T6 and the gate electrode of the second reset transistor T7 can also be electrically connected to different signal lines, that is, the gate electrode of the first reset transistor T6 is electrically connected to the first reset control signal line Rst1, the gate electrode of the second reset transistor T7 is electrically connected to the second reset control signal line Rst2, and the signals transmitted by the first reset control signal line Rst1 and the second reset control signal line Rst2 are the same. It should be noted that the first reset control signal and the second reset control signal can also be different.

For example, in some examples, the second reset control signal can be the same as the scanning signal, that is, the gate electrode of the second reset transistor T7 can be electrically connected to the first scanning signal line Ga1 so as to receive a scanning signal as the second reset control signal.

For example, the first electrode of the first reset transistor T6 and the first electrode of the second reset transistor T7 are respectively connected to the first reset power supply terminal Vinit1 and the second reset power supply terminal Vinit2, and the first reset power supply terminal Vinit1 and the second reset power supply terminal Vinit2 can be a direct current (DC) reference voltage terminal so as to output a constant DC reference voltage. The first reset power supply terminal Vinit1 and the second reset power supply terminal Vinit2 can be the same, for example, the first electrode of the first reset transistor T6 and the first electrode of the second reset transistor T7 are connected to the same reset power supply terminal. The first reset power supply terminal Vinit1 and the second reset power supply terminal Vinit2 can be high-voltage terminals or low-voltage terminals as long as they can provide a first reset signal and a second reset signal so as to reset the gate electrode of the driving transistor T1 and the first electrode of the light-emitting device 220. No limitation is made in this regard in the embodiments of the present disclosure.

It should be noted that the driving module 222, the data writing circuit 226, the storage circuit 227, the threshold compensation circuit 228 and the reset circuit 229 in the pixel circuit illustrated in FIG. 8 are merely for illustration. The specific structures of circuits such as the driving module 222, the data writing circuit 226, the storage circuit 227, the threshold compensation circuit 228, and the reset circuit 229 can be set depending upon actual application requirements. No limitation is made in this regard in the embodiments of the present disclosure.

For example, according to the characteristics of transistors, transistors can be divided into N-type transistors and P-type transistors. For the sake of clarity, the embodiments of the present disclosure take as an example that the transistors are P-type transistors (for example, P-type MOS transistors) to illustrate the technical solution of the present disclosure in detail. That is to say, as described in the present disclosure, the driving transistor T1, the data writing transistor T2, the threshold compensation transistor T3, the first light-emitting control transistor T4, the second light-emitting control transistor T5, the first reset transistor T6, the second reset transistor T7, and the like can all be P-type transistors. However, the transistors in the embodiments of the present disclosure are not limited to P-type transistors, and those skilled in the art can use N-type transistors (for example, N-type MOS transistors) to realize the functions of one or more transistors in the embodiments of the present disclosure depending upon actual requirements.

It should be noted that the transistors used in the embodiments of the present disclosure can be thin film transistors or field effect transistors or other switching devices with the same characteristics, and the thin film transistors can include oxide semiconductor thin film transistors, amorphous silicon thin film transistors, polysilicon thin film transistors, or the like. Because the source electrode and the drain electrode of a transistor can be symmetrical in structure, there can be no difference in the physical structure of the source electrode and the drain electrode. In the embodiments of the present disclosure, in order to distinguish transistors, except for the gate electrode as the control electrode, it is directly described that one electrode is a first electrode and the other electrode is a second electrode. Thus, the first electrodes and the second electrodes of all or some of the transistors in the embodiments of the present disclosure are interchangeable depending upon requirements.

It should be noted that, in the embodiments of the present disclosure, in addition to being the 7T1C (that is, seven transistors and one capacitor) structure illustrated in FIG. 8, the pixel circuit of the sub-pixel can also be a structure including transistors of another number, such as a 7T2C structure, a 6T1C structure, a 6T2C structure or a 9T2C structure. No limitation is made in this regard in the embodiments of the present disclosure.

Figure 9:
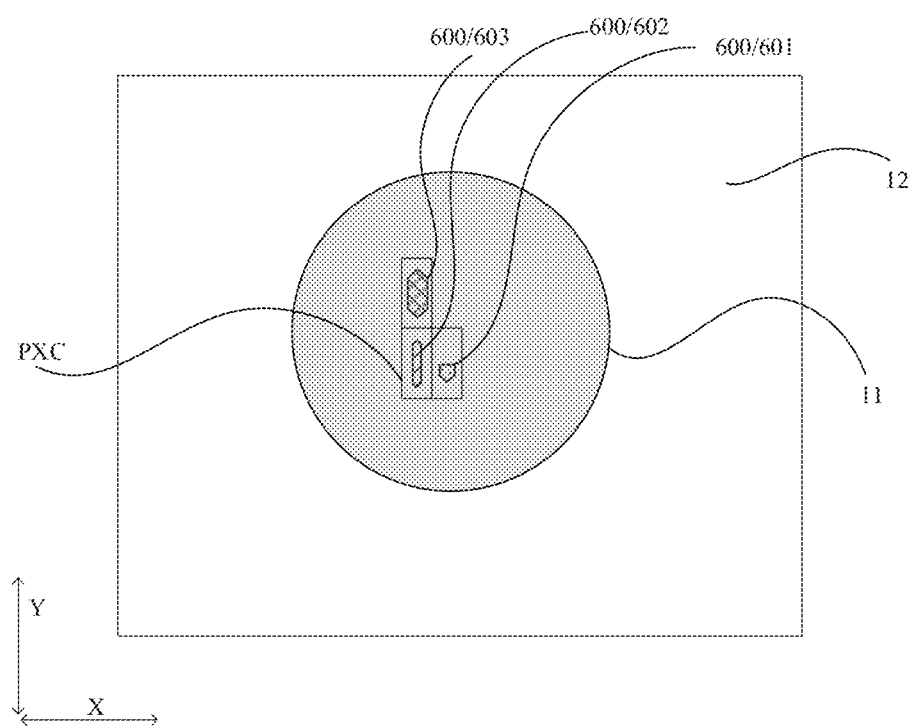
FIG. 9 is a schematic diagram of a display panel adopting a fully built-in scheme.
Figure 10:
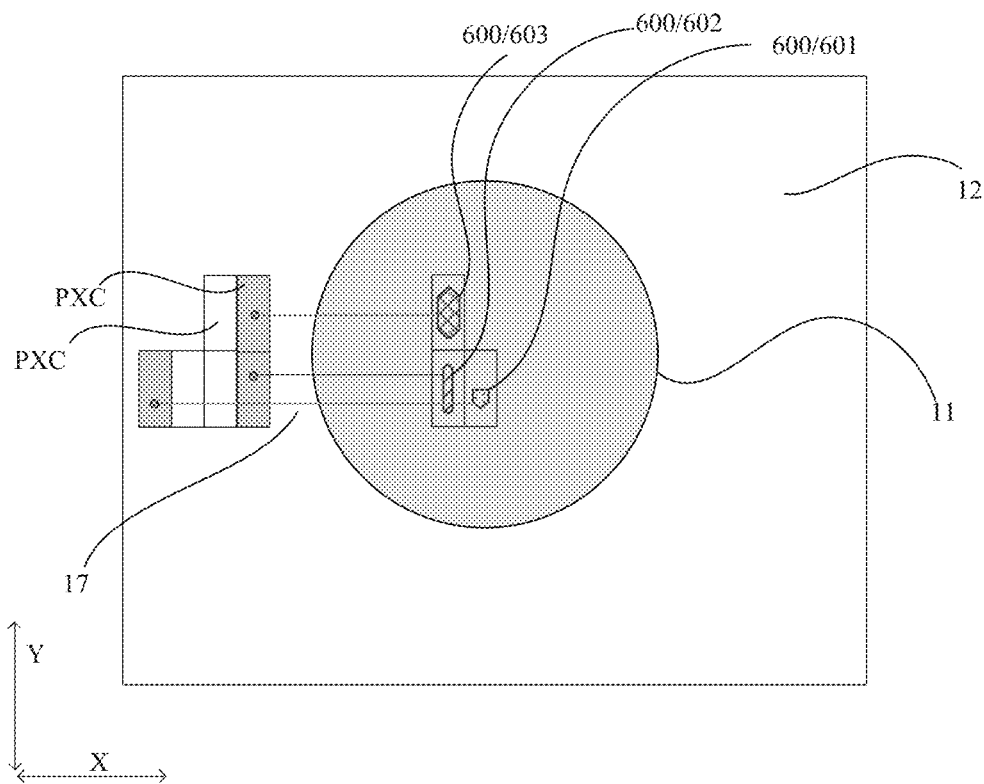
FIG. 10 is a schematic diagram of a display panel adopting a fully external scheme.
Figure 11:
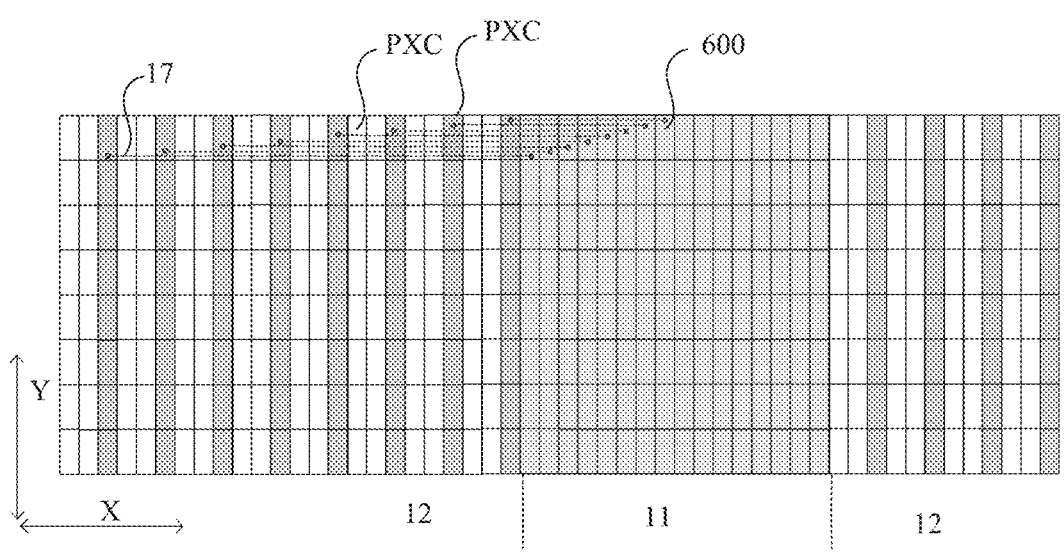
FIG. 11 is a schematic diagram of lead wires in a display panel adopting a fully external scheme.
Figure 12:
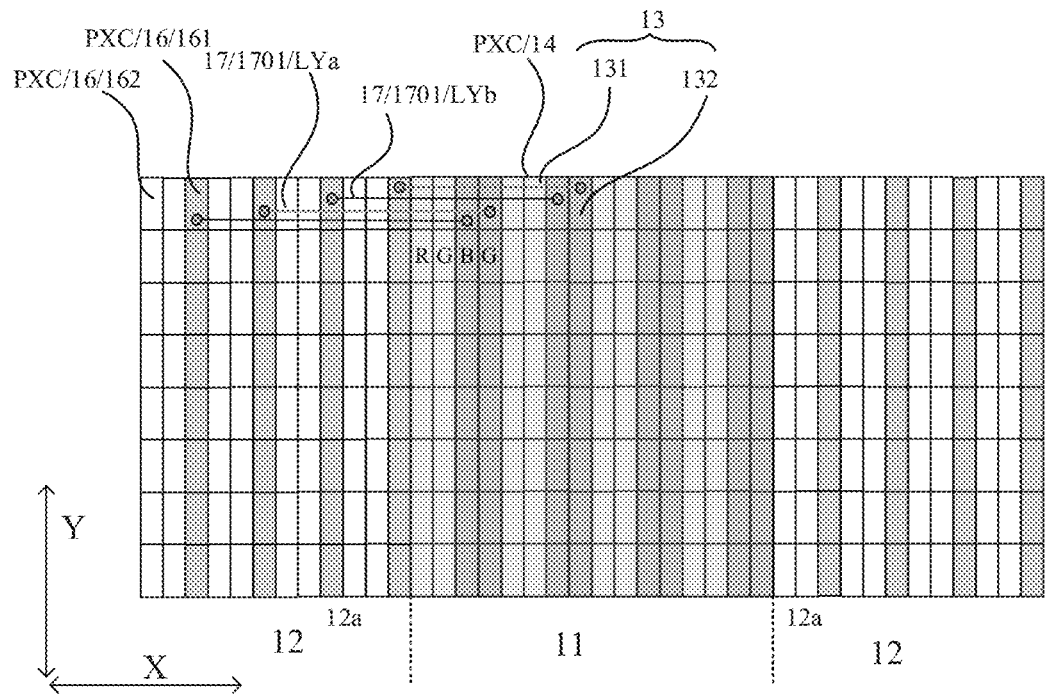
FIG. 12 is a schematic diagram of a display panel adopting a compression scheme and a built-in scheme provided by an embodiment of the present disclosure.
Figure 13:
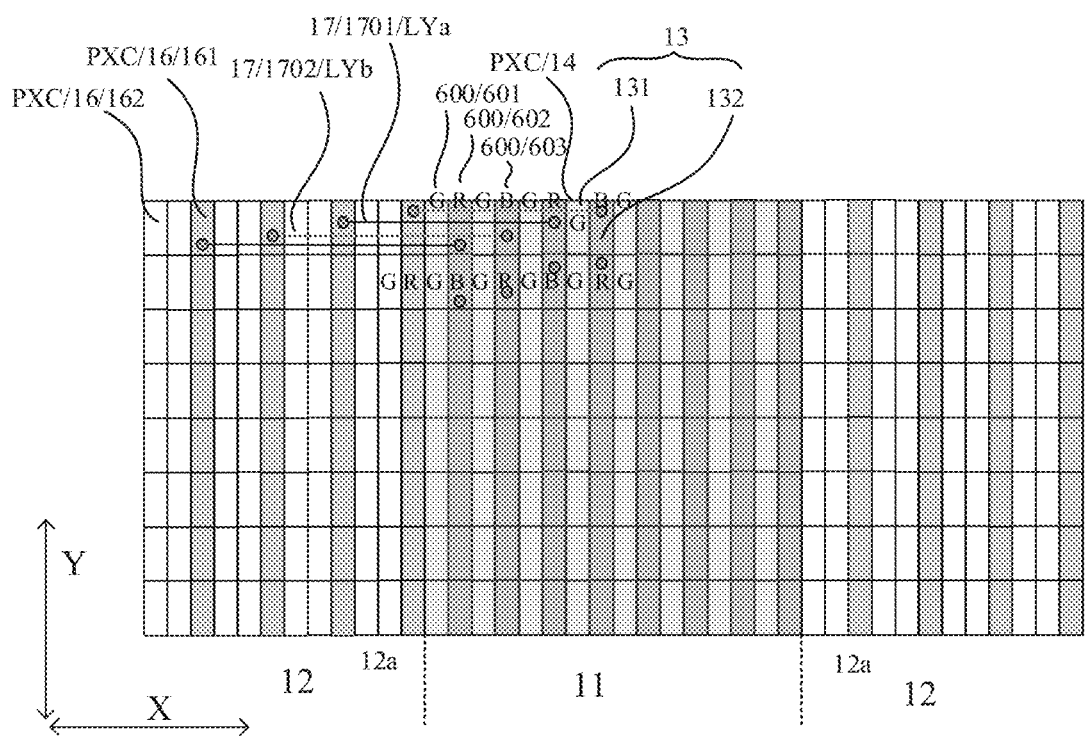
FIG. 13 is a schematic diagram of a display panel provided by an embodiment of the present disclosure.
Figure 14:
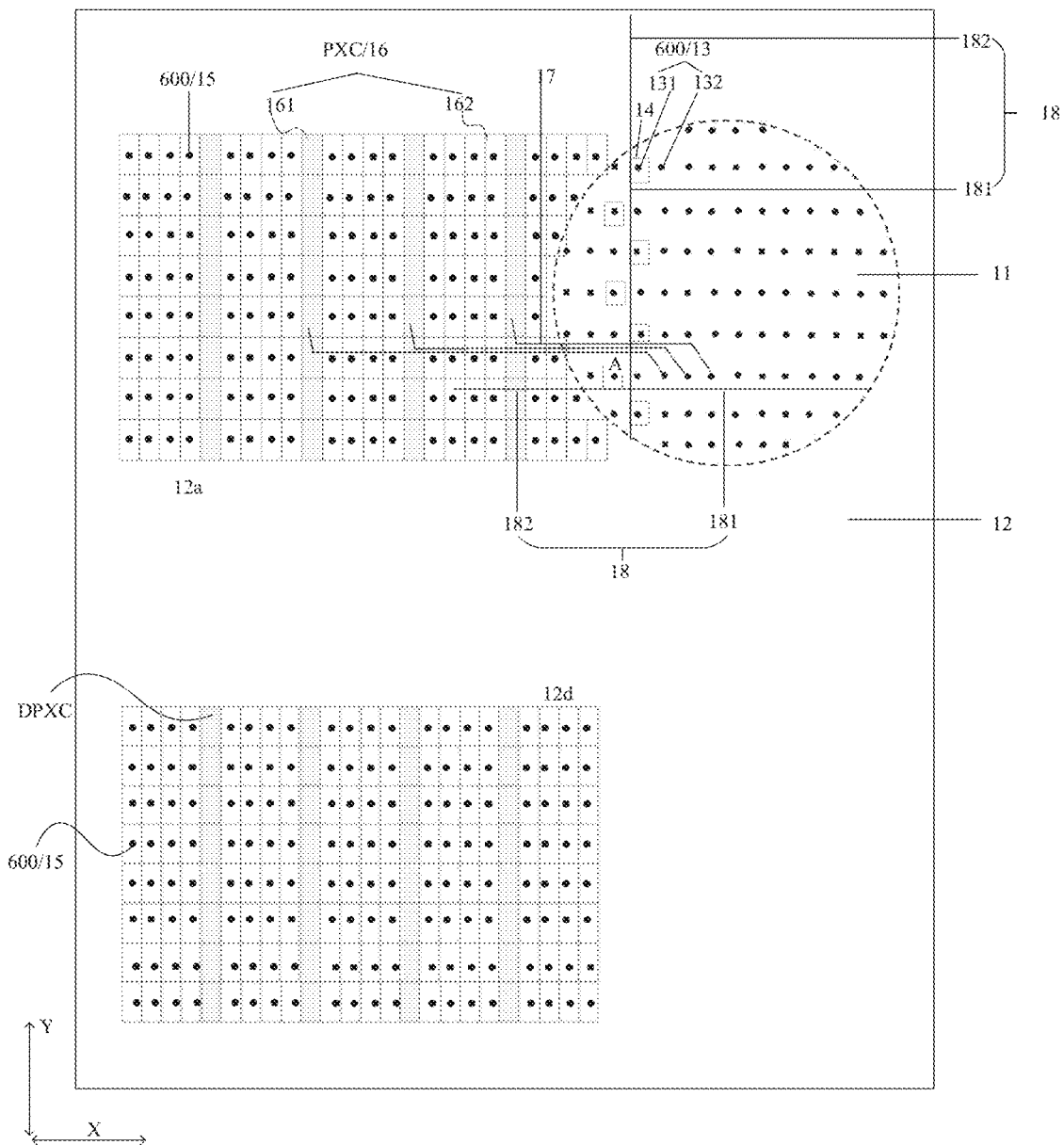
FIG. 14 is a schematic diagram of a display panel provided by an embodiment of the present disclosure.

FIG. 9 is a schematic diagram of a display panel adopting a fully built-in scheme. FIG. 10 is a schematic diagram of a display panel adopting a fully external scheme. FIG. 11 is a schematic diagram of lead wires in a display panel adopting a fully external scheme. FIG. 12 is a schematic diagram of a display panel adopting a compression scheme and a built-in scheme provided by an embodiment of the present disclosure. FIG. 13 is a schematic diagram of a display panel provided by an embodiment of the present disclosure. FIG. 14 is a schematic diagram of a display panel provided by an embodiment of the present disclosure.

As illustrated in FIG. 9 to FIG. 12, the light-emitting device 600 includes a first color light light-emitting device 601, a second color light light-emitting device 602, and a third color light light-emitting device 603.

As illustrated in FIG. 9, the pixel circuits PXC connected to the light-emitting devices 600 in the first display area 11 are all built-in, that is, the pixel circuits PXC connected to the light-emitting devices 600 in the first display area 11 are all located in the first display area 11. By adopting a fully built-in scheme, a large aperture can be realized without the need to provide lead wires connecting the light-emitting devices 600 and the pixel circuits PXC, but the transmittance of the first display area 11 is low, for example, the transmittance is 12%, and there is a glare diffraction problem.

As illustrated in FIG. 10, the pixel circuits PXC connected to the light-emitting devices 600 in the first display area 11 are all external, that is, the pixel circuits PXC connected to the light-emitting devices 600 in the first display area 11 are all located in the second display area 12. The light-emitting devices 600 in the first display area 11 and the pixel circuits PXC are arranged separately. The light-emitting devices 600 in the first display area 11 are connected to the pixel circuits PXC located in the second display area 12 through lead wires 17. In the display panel adopting a fully external scheme, the number of lead wires 17 is relatively large and the lengths of the lead wires 17 are relatively great. As a result, the load on the lead wires is relatively large and the lengths of the lead wires 17 vary greatly, which easily lead to the problem of non-uniform display.

FIG. 11 illustrates a schematic diagram of some lead wires in the display panel. As illustrated in FIG. 11, the lengths of the lead wires 17 are large and the lengths of the lead wires 17 vary greatly.

As illustrated in FIG. 12, the display panel provided by the embodiments of the present disclosure adopts a combination of a compression scheme and a built-in scheme, so that the first display area 11 can have a large aperture and low glare diffraction. At the same time, because the first display area 11 has the same aperture, the number of lead wires 17 in the display panel illustrated in FIG. 12 is about half less than the number of lead wires 17 in the display panel illustrated in FIG. 10 or FIG. 11. Therefore, the lengths of the lead wires 17 are relatively small and the lengths of the lead wires 17 vary slightly, which helps to improve display uniformity.

For example, as illustrated in FIG. 13, the first light-emitting device 131 includes a first color light light-emitting device 601, the second light-emitting device 132 includes a second color light light-emitting device 602 and a third color light light-emitting device 603, and the first color light light-emitting device 601, the second color light light-emitting device 602 and the third color light light-emitting device 603 are configured to emit light of different colors. For example, the first light-emitting device 131 includes a green light light-emitting device, and the second light-emitting device 132 includes a red light light-emitting device and a blue light light-emitting device. G in FIG. 13 represents a green light light-emitting device (the first color light light-emitting device 601), R represents a red light light-emitting device (the second color light light-emitting device 602), and B represents a blue light light-emitting device (the third color light light-emitting device 603).

For example, as illustrated in FIG. 13, the lead wire 17 includes a first conductive wire 1701 and a second conductive wire 1702, the first conductive wire 1701 is connected to the second color light light-emitting device 602, and the second conductive wire 1702 is connected to the third color light light-emitting device 603. The first conductive wire 1701 is located in the first transparent conductive layer LYa, and the second conductive wire 1702 is located in the second transparent conductive layer LYb.

For example, as illustrated in FIG. 13, in the second direction Y, the first conductive wires 1701 and the second conductive wires 1702 are alternately arranged, but not limited thereto.

As illustrated in FIG. 13, because the pixel circuit PXC of the green light light-emitting device (the first color light light-emitting device 601) is built-in, that is, located in the first display area 11, the green light light-emitting device (the first color light light-emitting device 601) is not provided with a lead wire 17.

In the display panel, the capacitance of the lead wires varies greatly. Due to the different lengths of the lead wires connecting the various light-emitting devices located in the first display area 11, the difference in capacitance of the light-emitting devices emitting light of different colors changes differently. Compared with the difference in capacitance of the lead wires connected to the red light light-emitting device and the difference in capacitance of the lead wires connected to the blue light light-emitting device, the difference in capacitance of the lead wires connected to the green light light-emitting device is larger. Because the difference in capacitance of the lead wires connected to the green light light-emitting device is relatively large, the luminous time of the green light light-emitting device is reduced, so that the brightness of the display panel is different, resulting in poor display. Under the low gray scale, the defect degree of the green light light-emitting device is greater than that of the red light light-emitting device, and the defect degree of the red light light-emitting device is greater than that of the blue light light-emitting device. For example, under the same gray scale, the driving current for driving the blue light light-emitting device is greater than the driving current for driving the red light light-emitting device, and the driving current for driving the red light light-emitting device is greater than the driving current for driving the green light light-emitting device.

Referring to FIG. 12 to FIG. 14, the second driving circuit 161 is connected to the second light-emitting device 132 through a lead wire 7, and the area where the second driving circuit 161 is disposed can be referred to as an auxiliary area 12a (as illustrated in FIG. 14). In the area 12d (as illustrated in FIG. 14) of the second display area 12 except the auxiliary area 12a, a dummy pixel circuit DPXC not connected to the built-in light-emitting device 13 and not connected to the third light-emitting device 15 can be provided.

As illustrated in FIG. 12 and FIG. 14, illustration is made for the combined external and compression scheme. By making some of the pixel circuits connected to the light-emitting devices in the first display area 11 built-in and making some of them external, compatibility between high transparency and display design are achieved. Some display panels, for example, display panels having distance sensors need to have: a large aperture, a high transmittance, and less of glare diffraction problems. Generally, the pure external (fully external) scheme cannot solve the problem of a large aperture in the first display area, or reduce the number of film layers and the number of mask plates. By combining the built-in scheme with the external scheme, a large aperture is realized, which not only meets the requirement of transmittance but also meets the requirement of diffraction.

For a pure external scheme, the number of lead wires required is relatively large. For example, in some display panels, for the upper left part of the first display area, 40 lead wires may need to be provided, and thus three transparent conductive layers need to be provided. For the combined external and built-in scheme, only about half of the lead wires need to be provided, that is, for the upper left part of the first display area. 20 lead wires need to be provided. In this case, lead wire arrangement is completed by providing two transparent conductive layers, and the length of the lead wire is reduced by half. As described above, illustration is made by taking as an example that 40 lead wires need to be provided for the upper left part of the first display area, and the number of lead wires can be adjusted to another numerical value depending upon requirements.

As illustrated in FIG. 13, because the length of the lead wire has the greatest influence on the green light light-emitting device, for each light-emitting device located in the first display area 11, the pixel circuit connected to the green light light-emitting device is built-in (placed in the first display area 11), and the pixel circuit connected to the red light light-emitting device and the blue light light-emitting device is external (placed in the second display area 12), and the red sub-pixel and the blue sub-pixel are both external, that is, the pixel circuits of the green sub-pixel are built-in so as to improve display uniformity.

For other structures of the display panel illustrated in FIG. 14, reference can be made to the description in FIG. 1, and no further detail will be provided here.

Figure 15:
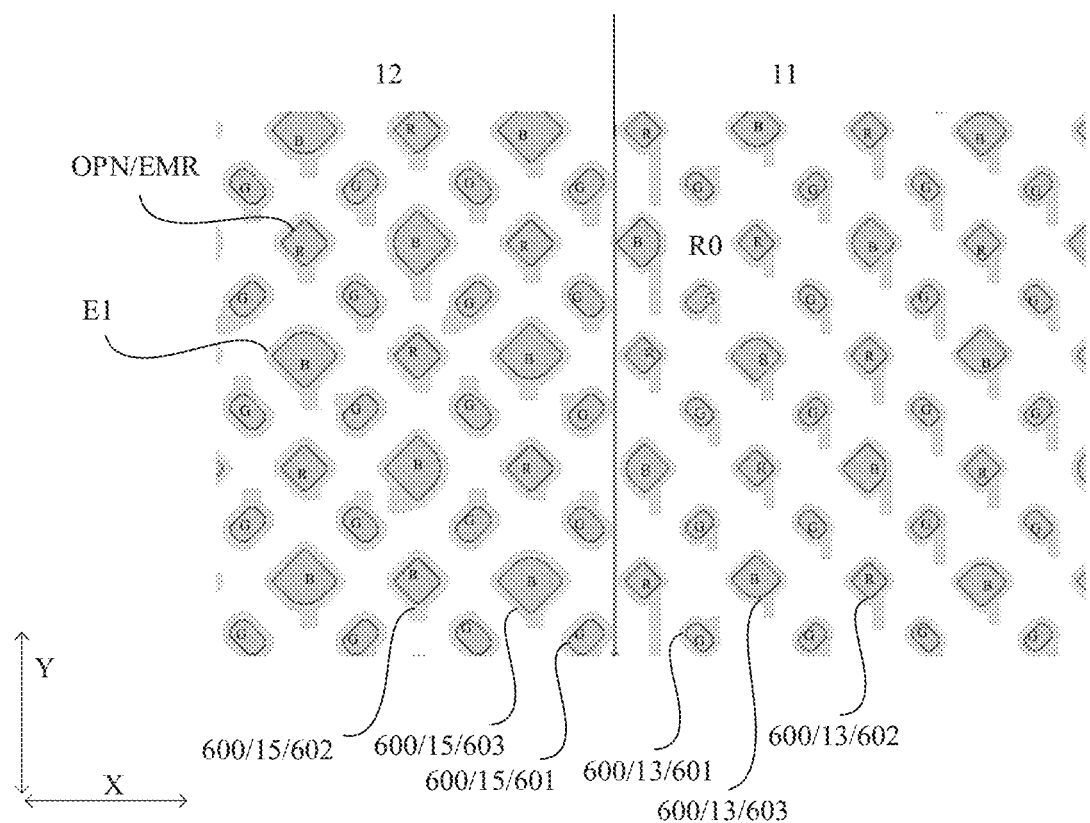
FIG. 15 is a schematic diagram of a display panel provided by an embodiment of the present disclosure.

FIG. 15 is a schematic diagram of a display panel provided by an embodiment of the present disclosure. As illustrated in FIG. 15, for the light-emitting devices of the same color light, the size of the light-emitting devices 600 located in the first display area 11 is smaller than the size of the light-emitting devices 600 located in the second display area 12, so as to help improve the transmittance of the first display area 11. At the same time, because some of the pixel circuits are built-in and some are external, the transmittance of the first display area 11 can also be improved. In the first display area 11 of FIG. 15, the region between adjacent light-emitting devices 600 includes a light-transmitting region R0. That is, in the first display area 11, the light-transmitting region R0 is located in the region between adjacent light-emitting devices 600.

FIG. 15 illustrates the light-emitting device 600 by means of a first electrode E1 of the light-emitting device. The closed line frame within the first electrode E1 represents a light-emitting region EMR of the light-emitting device 600, and the light-emitting region EMR corresponds to an opening OPN of the pixel definition layer.

Figure 16:
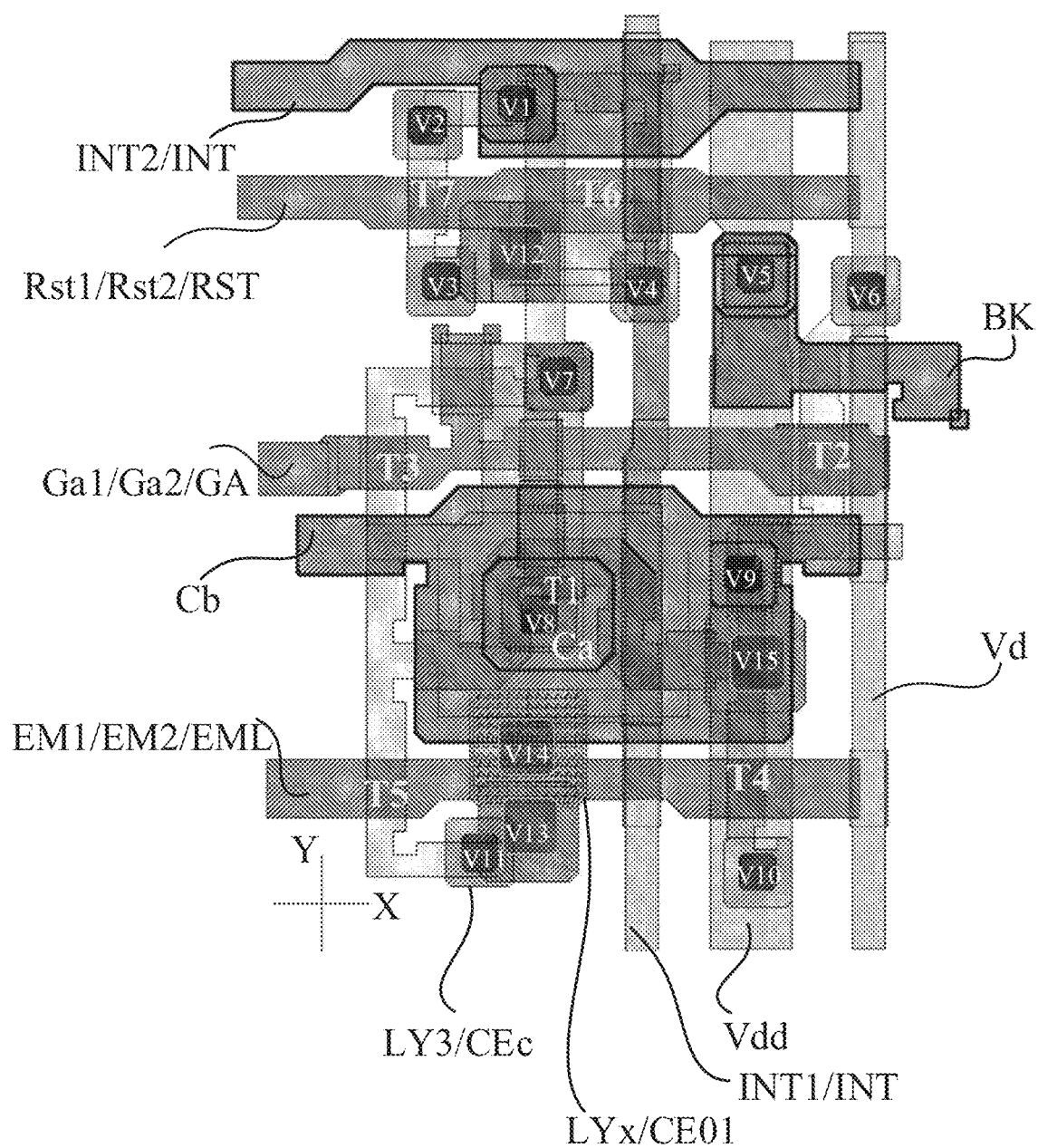
FIG. 16 is a layout diagram of a pixel circuit located in a second display area in a display panel provided by an embodiment of the present disclosure.
Figure 17:
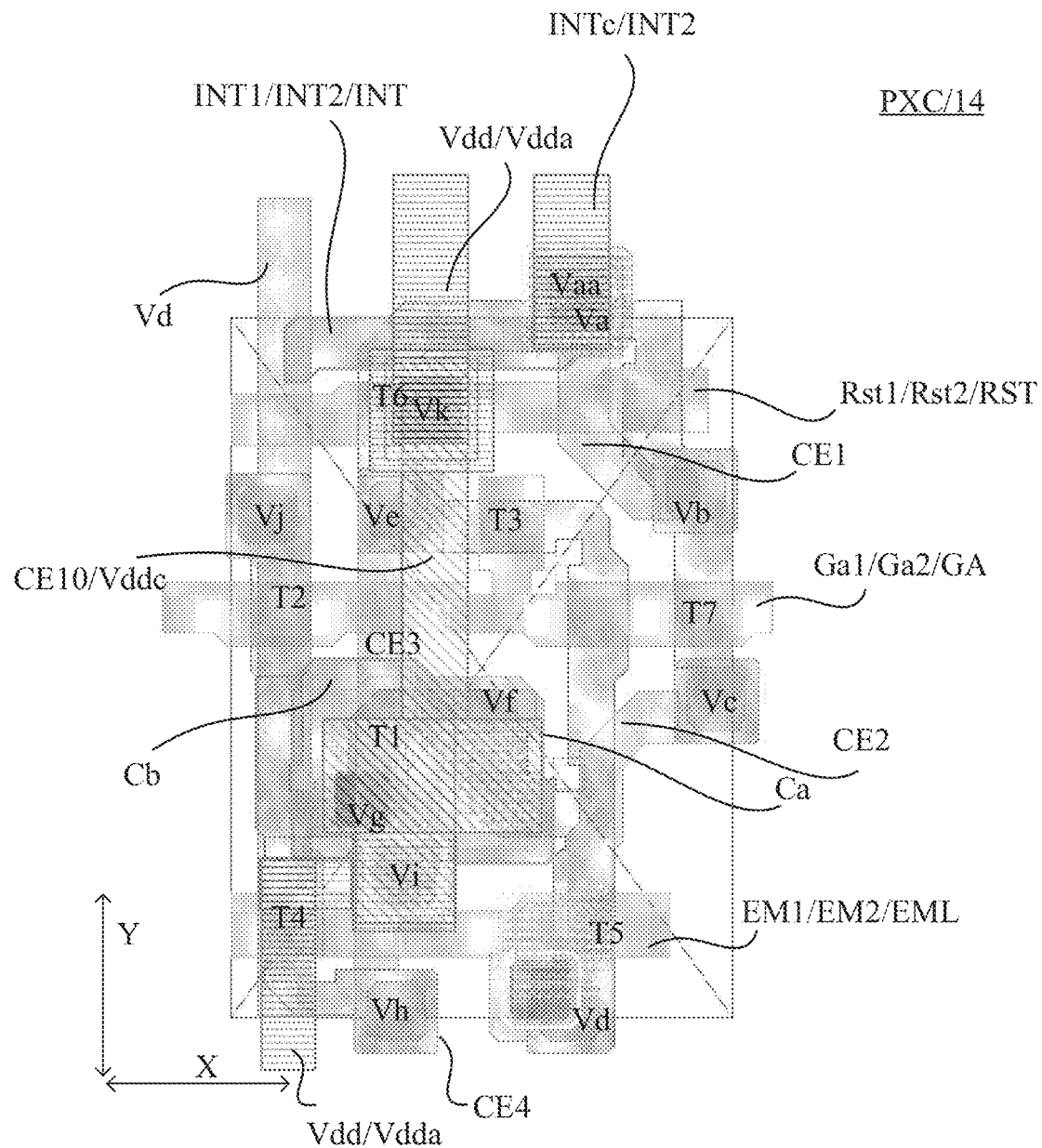
FIG. 17 is a layout diagram of a pixel circuit located in a first display area in a display panel provided by an embodiment of the present disclosure.
Figure 18:
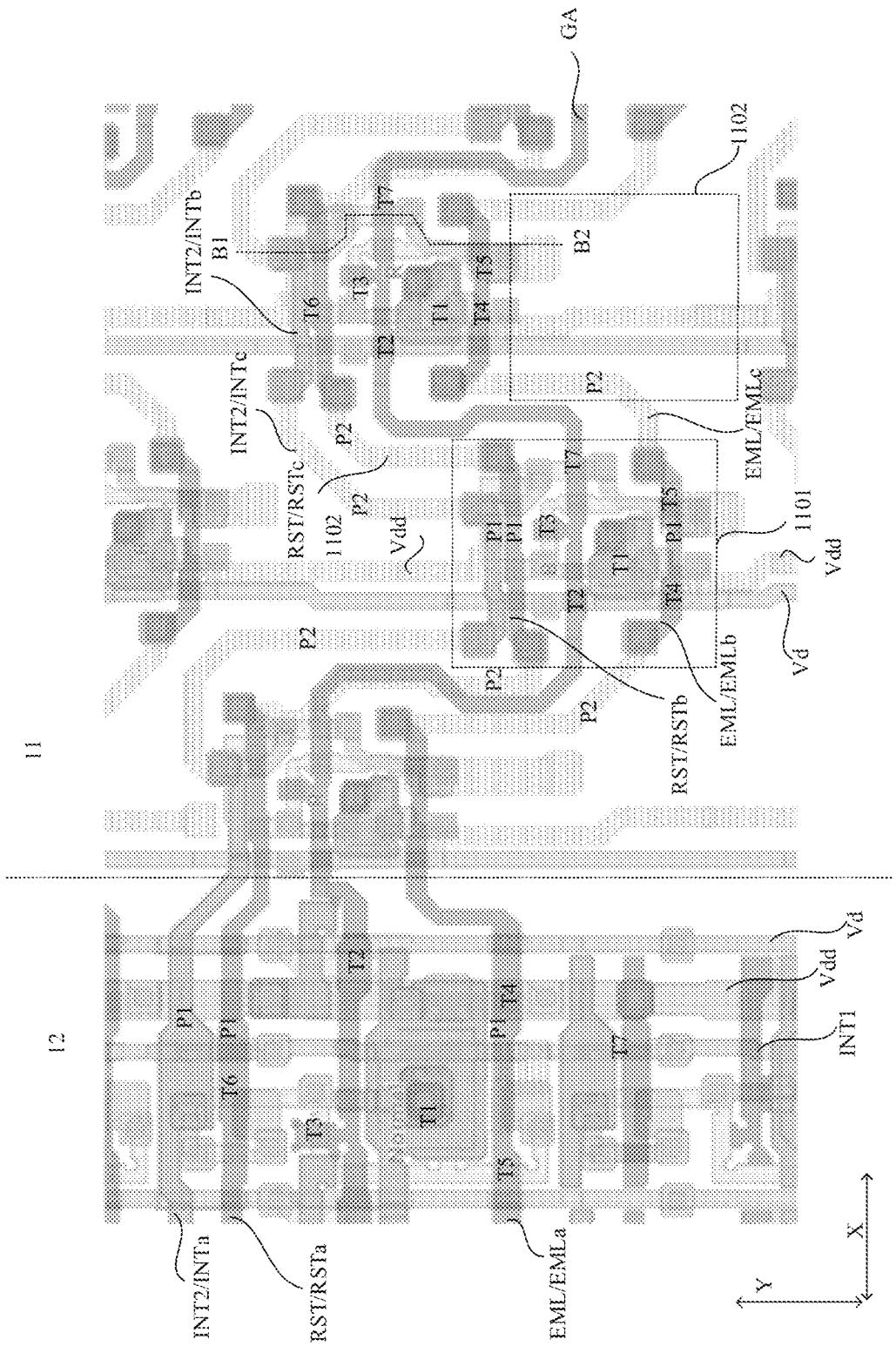
FIG. 18 is a layout diagram of pixel circuits located in a first display area and a second display area in a display panel provided by an embodiment of the present disclosure.

FIG. 16 is a layout diagram of a pixel circuit located in a second display area in a display panel provided by an embodiment of the present disclosure. FIG. 17 is a layout diagram of a pixel circuit located in a first display area in a display panel provided by an embodiment of the present disclosure. FIG. 18 is a layout diagram of pixel circuits located in a first display area and a second display area in a display panel provided by an embodiment of the present disclosure.

FIG. 16 to FIG. 18 illustrate the driving transistor T1, the data writing transistor T2, the threshold compensation transistor T3, the first light-emitting control transistor T4, the second light-emitting control transistor T5, the first reset transistor T6, the second reset transistor T7, the first electrode Cb of the capacitor C, and the second electrode Ca of the capacitor C that are included in the pixel circuit PXC.

Referring to FIG. 8, FIG. 16 and FIG. 17, the first scanning signal line Ga1 and the second scanning signal line Ga2 are the same signal line, that is, both are the gate signal line GA; the first reset control signal line Rst1 and the second reset control signal line Rst2 are the same signal line, that is, both are the reset control signal line RST; and the first light-emitting control signal line EM1 and the second light-emitting control signal line EM2 are the same signal line, that is, both are the light-emitting control signal line EML.

For example, as illustrated in FIG. 16 to FIG. 18, the display panel further includes a plurality of signal lines connected to the pixel circuit PXC (the first driving circuit 14), and at least one signal line in the plurality of signal lines is arranged in segments.

As illustrated in FIG. 16 to FIG. 18, at least one of the first power supply line Vdd, the light-emitting control signal line EML, the reset control signal line RST, and the reset signal line INT2 is arranged in segments. FIG. 18 is illustrated by taking as an example that the first power supply line Vdd, the light-emitting control signal line EML, the reset control signal line RST, and the reset signal line INT2 are arranged in segments.

For example, the reset signal line INT1 is connected to the first reset power supply terminal Vinit1, and the reset signal line INT2 is connected to the second reset power supply terminal Vinit2. For example, in some embodiments of the present disclosure, the reset signal line INT2 is connected to the first reset power supply terminal Vinit1 or the second reset power supply terminal Vinit2.

As illustrated in FIG. 18, the light-emitting control signal line EML includes a light-emitting control signal portion EMLa, a light-emitting control signal portion EMLb, and a light-emitting control signal portion EMLc. The light-emitting control signal portion EMLa is located in the second display area 12, the light-emitting control signal portion EMLb and the light-emitting control signal portion EMLc are located in the first display area, the adjacent light-emitting control signal portions EMLc are connected through the light-emitting control signal portion EMLb, and the light-emitting control signal portion EMLa is connected to the light-emitting control signal portion EMLc adjacent thereto through the light-emitting control signal portion EMLb.

As illustrated in FIG. 18, the reset control signal line RST includes a reset control signal portion RSTa, a reset control signal portion RSTb, and a reset control signal portion RSTc. The reset control signal portion RSTa is located in the second display area 12, the reset control signal portion RSTb and the reset control signal portion RSTc are located in the first display area, the adjacent reset control signal portions RSTc are connected through the reset control signal portion RSTb, and the reset control signal portion RSTa is connected to the reset control signal portion RSTc adjacent thereto through the reset control signal portion RSTb.

As illustrated in FIG. 18, the reset signal line INT2 includes a reset signal portion INTa, a reset signal portion INTb, and a reset signal portion INTc. The reset signal portion INTa is located in the second display area 12, the reset signal portion INTb and the reset signal portion INTc are located in the first display area, the adjacent reset signal portions INTc are connected through the reset signal portion INTb, and the reset signal portion INTa and the reset signal portion INTc adjacent thereto are connected through the reset signal portion INTb.

For example, as illustrated in FIG. 16 to FIG. 18, the signal lines arranged in segments include a plurality of signal portions located in different layers.

For example, as illustrated in FIG. 16 to FIG. 18, the signal lines arranged in segments include a first signal portion and a second signal portion, the material of the first signal portion includes a transparent conductive metal oxide, and the material of the second signal portion includes a metal. For example, at least one of the reset signal portion INTc, the reset control signal portion RSTc, and the light-emitting control signal portion EMLc can be referred to as a first signal portion P1; and the reset signal portion INTa, the reset signal portion INTb, the reset control signal portion RSTa, the reset control signal portion RSTb, the light-emitting control signal portion EMLa and the light-emitting control signal portion EMLb can be referred to as a second signal portion P2. Of course, the first signal portion P1 and the second signal portion P2 are not limited to the above description, and can be set depending upon requirements.

For example, as illustrated in FIG. 18, the first display area 11 includes a driving circuit arranging area 1101 and a wiring area 1102, the first signal portion P1 is located in the driving circuit arranging area 1101, and the second signal portion P2 is located in the wiring area 1102.

For example, referring to FIG. 1, FIG. 8, FIG. 15, and FIG. 16 to FIG. 18, the display panel further includes a light-emitting control signal line EML, a reset control signal line RST, and a reset signal line INT2, and the pixel circuit PXC includes a driving module 222, a light-emitting control circuit 223, a light-emitting control circuit 224, and a reset circuit 229, the pixel circuit PXC includes at least one of the first driving circuit 14, the second driving circuit 161, and the third driving circuit 162, the light-emitting control signal line EML is connected to at least one of the control terminal of the light-emitting control circuit 223 and the control terminal of the light-emitting control circuit 224, the reset control signal line RST is connected to the control terminal of the reset circuit 229, the reset signal line INT2 is connected to the first electrode of the reset circuit 229, and at least one of the light-emitting control signal line EML, the reset control signal line RST and the reset signal line INT2 is arranged in segments in the first display area 11.

For example, referring to FIG. 1, FIG. 8, FIG. 15 and FIG. 16 to FIG. 18, the reset circuit 229 includes a first reset transistor T6 and a second reset transistor T7, the first reset transistor T6 is configured to reset the control terminal of the driving module 222, the second reset transistor T7 is configured to reset the first electrode of the light-emitting device 600, and the light-emitting device 600 includes at least one of the first light-emitting device 131, the second light-emitting device 132, and the third light-emitting device. As illustrated in FIG. 17 and FIG. 18, in the same pixel circuit, the first reset transistor T6 and the second reset transistor T7 share the same reset signal line INT2 so as to be configured to provide the same reset signal. For example, the light-emitting device 600 is the light-emitting device 220 in FIG. 8.

FIG. 17 illustrates the connection electrode CE1, the connection electrode CE2, and the connection electrode CE3. As illustrated in FIG. 17, one end of the connection electrode CE1 is connected to the reset signal line INT2, the other end of the connection electrode CE1 is connected to the first electrode of the second reset transistor T7; one end of the connection electrode CE2 is connected to the second electrode of the second reset transistor T7, and the other end of the connection electrode CE2 is connected to the second electrode of the second light-emitting control transistor T5. As illustrated in FIG. 17, one end of the connection electrode CE3 is connected to the second electrode of the first reset transistor T6, and the other end of the connection electrode CE3 is connected to the gate electrode of the driving transistor T1.

For example, referring to FIG. 16 to FIG. 18, the layout of the second driving circuit 161 is the same as that of the third driving circuit 162, and the layout of the first driving circuit 14 is different from that of the second driving circuit 161 or that of the third driving circuit 162. The layout of the first driving circuit 14 is adjusted so as to improve the transmittance of the first display area.

FIG. 16 to FIG. 18 illustrate the reset signal line INT1 and the reset signal line INT2. The reset signal line INT1 is connected to the first reset power supply terminal Vinit1, and the reset signal line INT2 is connected to the second reset power supply terminal Vinit2. FIG. 16 to FIG. 18 are illustrated by taking as an example that the reset signal line INT serves as the reset signal line INT1 and reset signal line INT2.

Figure 19:
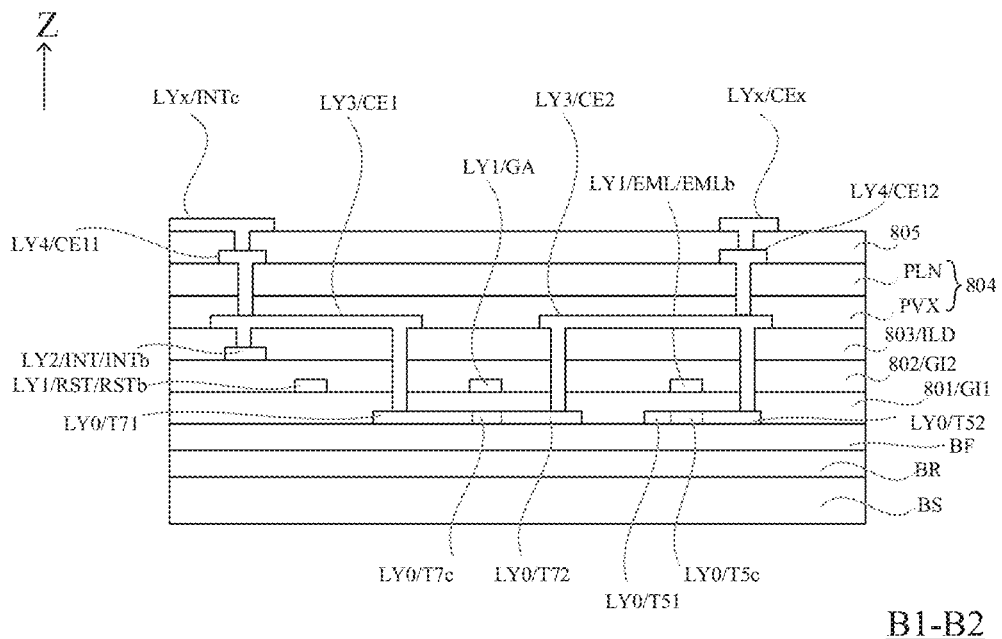
FIG. 19 is a cross-sectional view along the line B1-B2 in FIG. 18.
Figure 20:
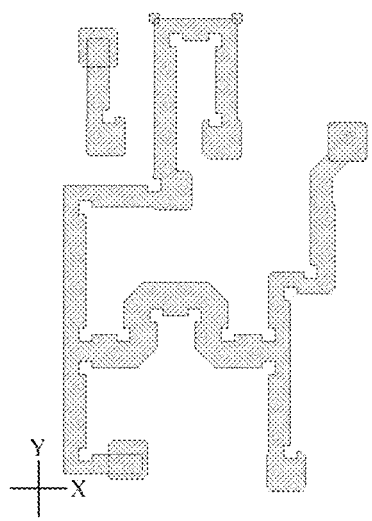
FIG. 20 is a plan view of the active layer in FIG. 16.
Figure 21:
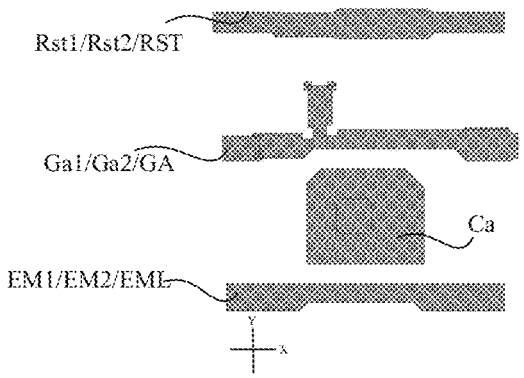
FIG. 21 is a plan view of the first conductive layer in FIG. 16.
Figure 22:
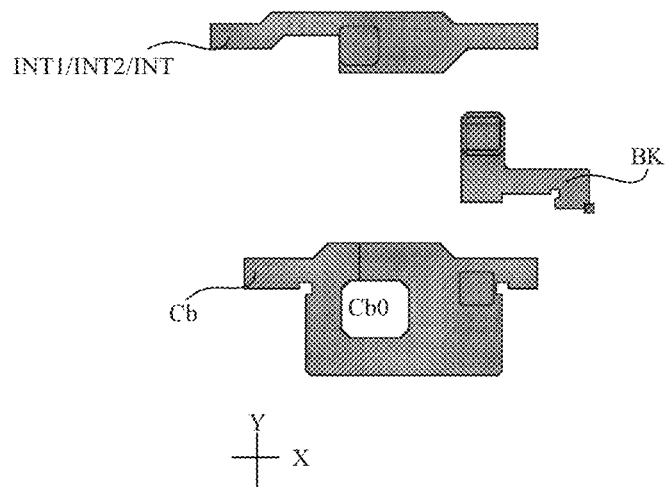
FIG. 22 is a plan view of the second conductive layer in FIG. 16.
Figure 23:
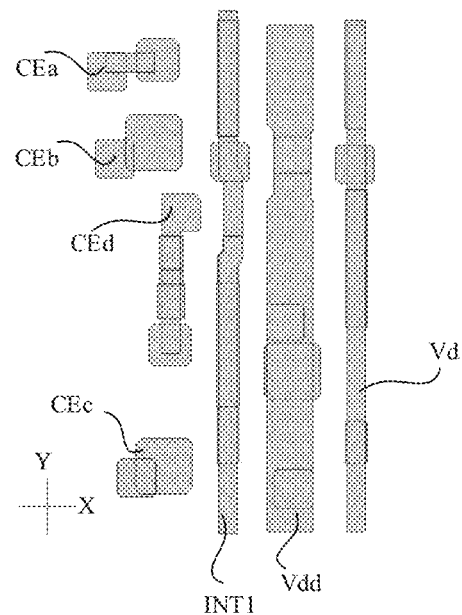
FIG. 23 is a plan view of the third conductive layer in FIG. 16.
Figure 24:
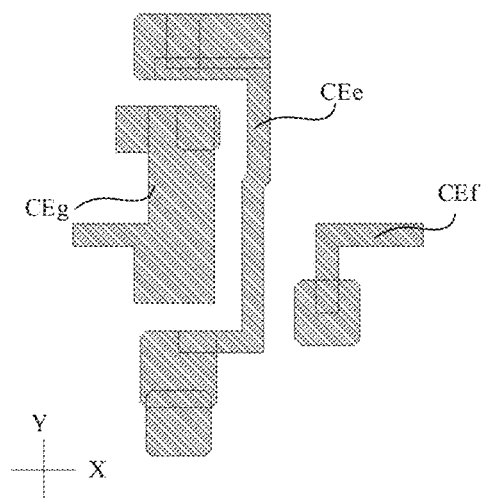
FIG. 24 is a plan view of the fourth conductive layer in FIG. 16.
Figure 25:
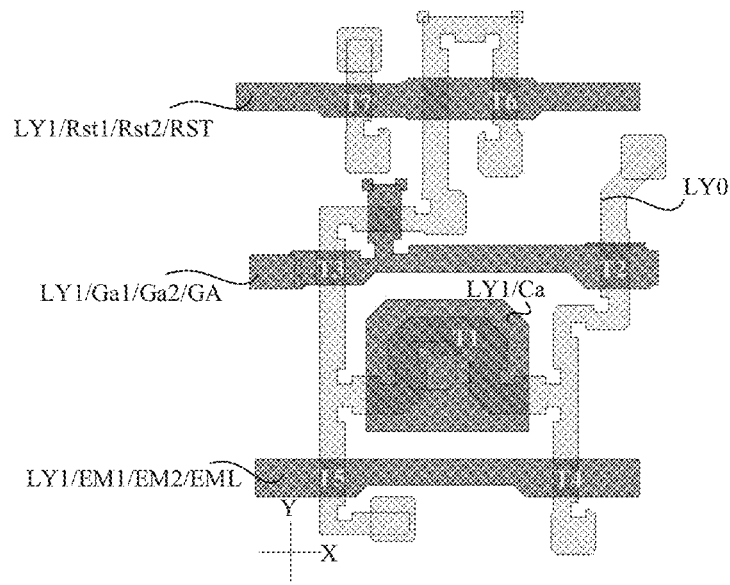
FIG. 25 is a stacked plan view of the active layer and the first conductive layer in FIG. 16.

FIG. 19 is a cross-sectional view along the line B1-B2 of FIG. 18. FIG. 20 is a plan view of the active layer in FIG. 16. FIG. 21 is a plan view of the first conductive layer in FIG. 16. FIG. 22 is a plan view of the second conductive layer in FIG. 16. FIG. 23 is a plan view of the third conductive layer in FIG. 16. FIG. 24 is a plan view of the fourth conductive layer in FIG. 16. FIG. 25 is a stacked plan view of the active layer and the first conductive layer in FIG.

Figure 26:
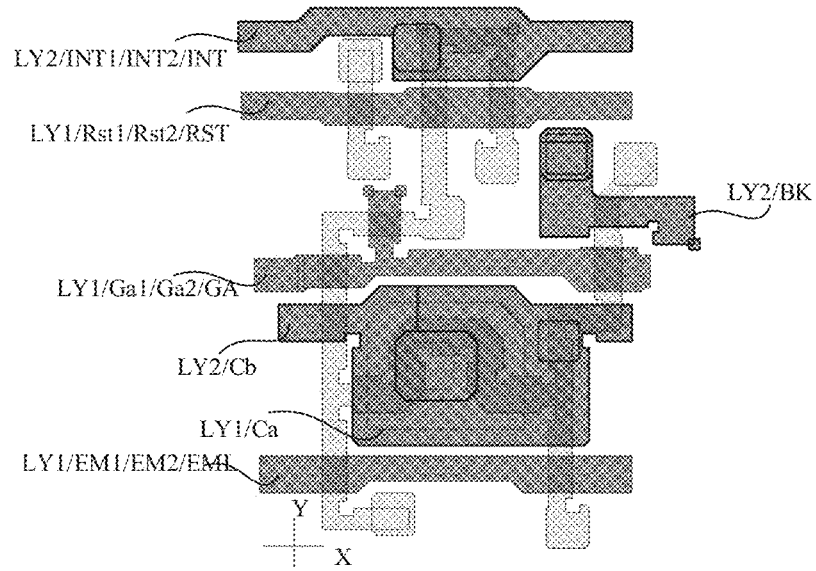
FIG. 26 is a stacked plan view of the active layer, the first conductive layer, and the second conductive layer in FIG. 16.
Figure 27:
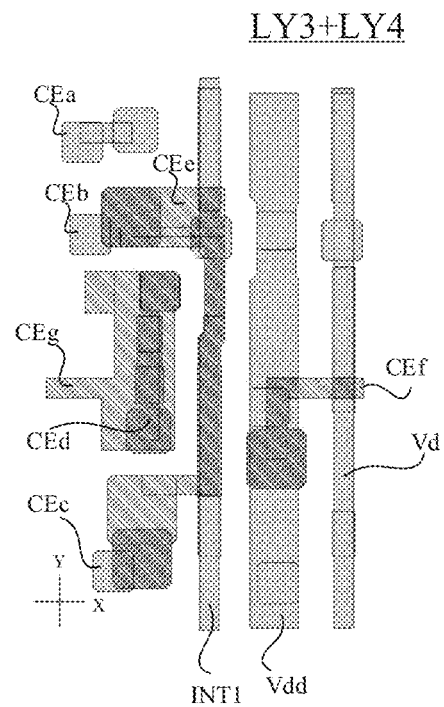
FIG. 27 is a stacked plan view of the third conductive layer and the fourth conductive layer in FIG. 16.
Figure 28:
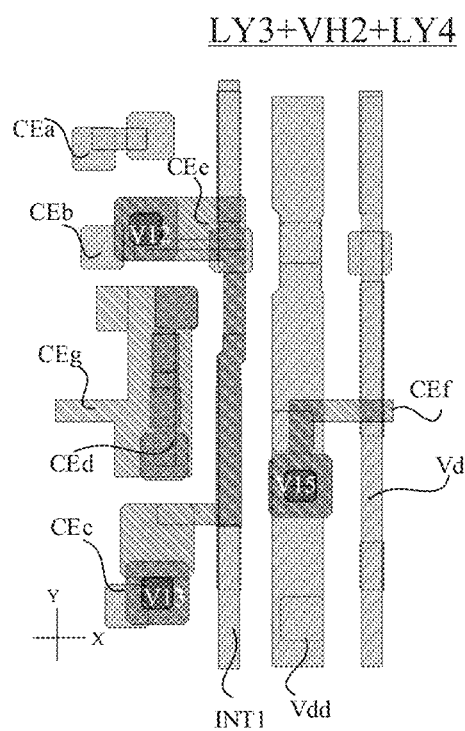
FIG. 28 is a stacked plan view of the third conductive layer, the fourth conductive layer, and via holes in the insulating layer located between the third conductive layer and the fourth conductive layer in FIG. 16.
Figure 29:
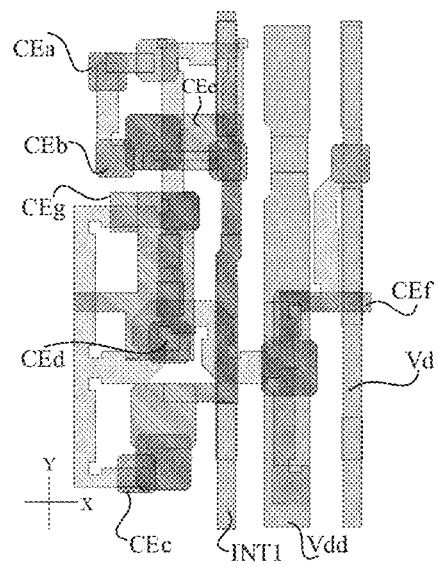
FIG. 29 is a stacked plan view of the active layer, the third conductive layer, the fourth conductive layer, and the via holes in the insulating layer between the third conductive layer and the fourth conductive layer in FIG. 16.
Figure 30:
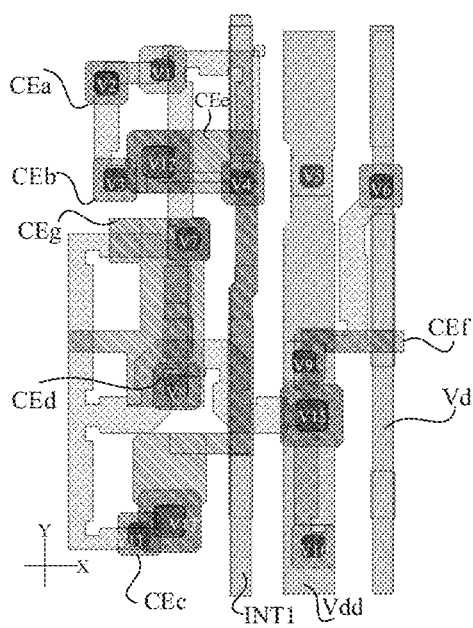
FIG. 30 is a stacked plan view of the active layer, the third conductive layer, the fourth conductive layer, the via holes in the insulating layer between the active layer and the third conductive layer, and the via holes in the insulating layer between the third conductive layer and the fourth conductive layer in FIG. 16.
Figure 31:
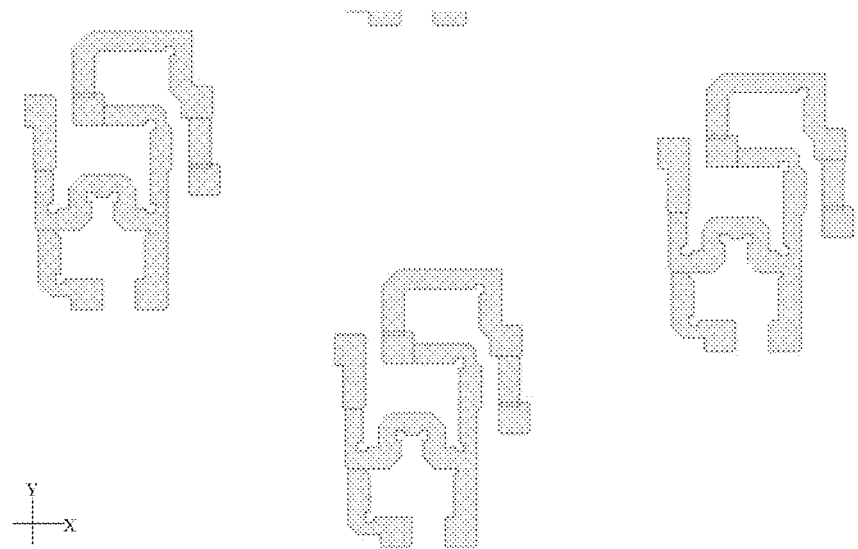
FIG. 31 is a plan view of an active layer in a first display area of a display panel provided by an embodiment of the present disclosure.
Figure 32:
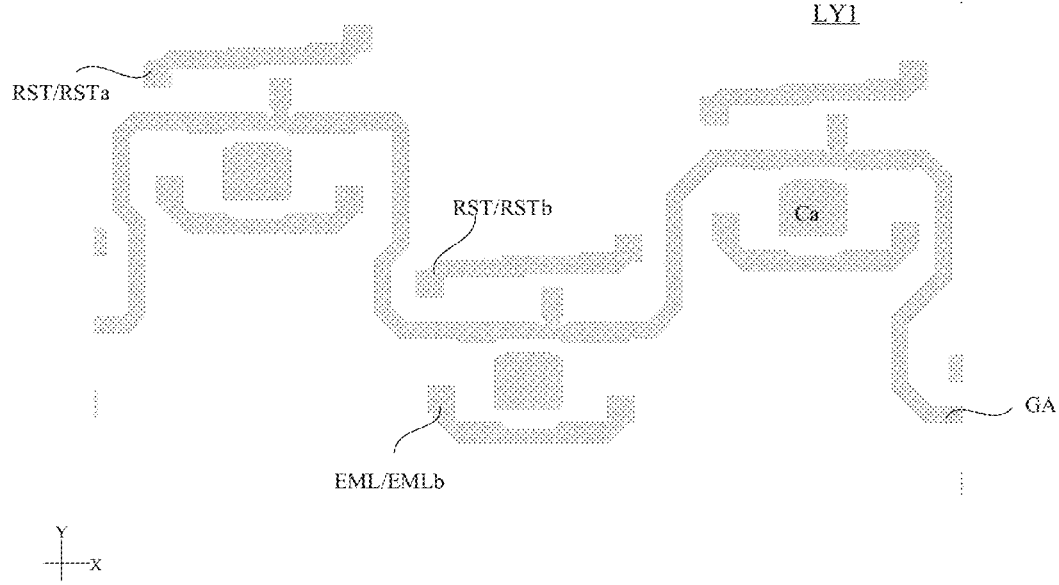
FIG. 32 is a plan view of a first conductive layer in a first display area of a display panel provided by an embodiment of the present disclosure.
Figure 33:
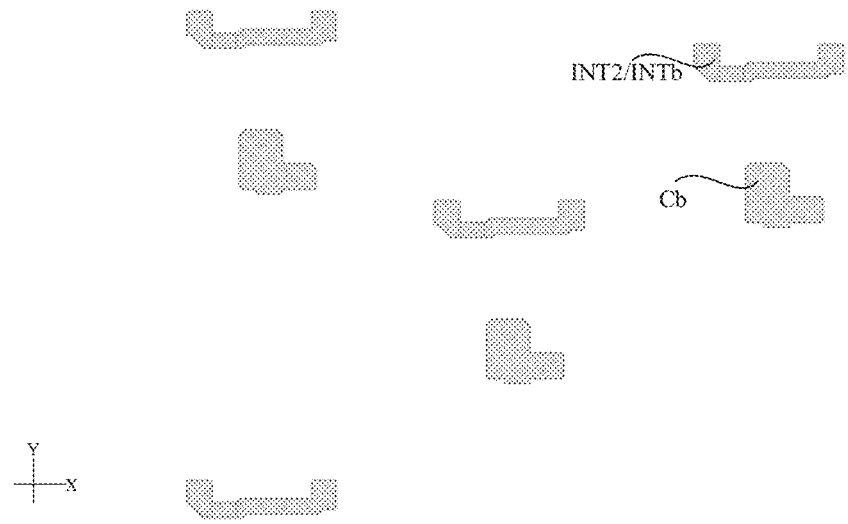
FIG. 33 is a plan view of a second conductive layer in a first display area of a display panel provided by an embodiment of the present disclosure.
Figure 34:
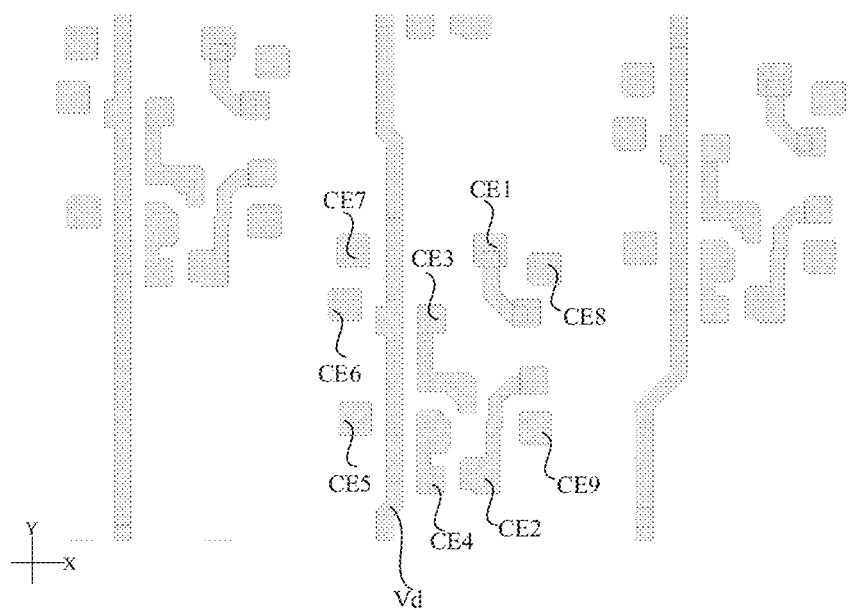
FIG. 34 is a plan view of a third conductive layer in a first display area of a display panel provided by an embodiment of the present disclosure.
Figure 35:
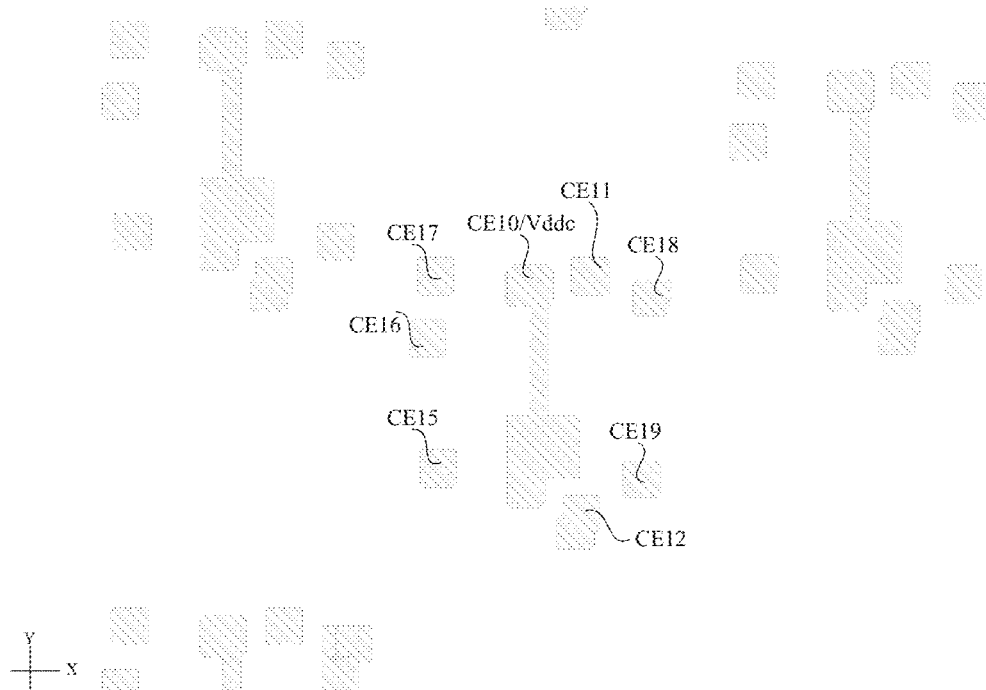
FIG. 35 is a plan view of a fourth conductive layer in a first display area of a display panel provided by an embodiment of the present disclosure.
Figure 36:
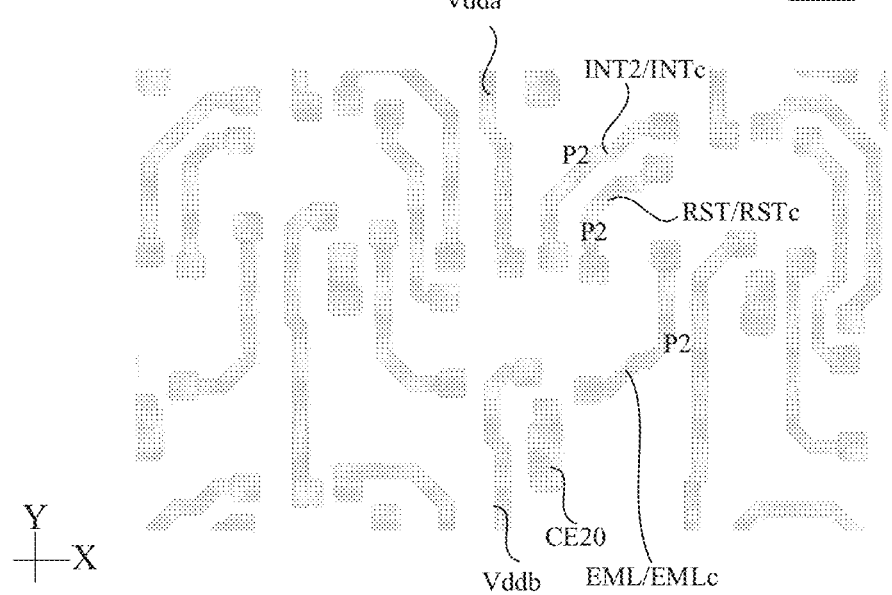
FIG. 36 is a plan view of a transparent conductive layer in a first display area of a display panel provided by an embodiment of the present disclosure.

16. FIG. 26 is a stacked plan view of the active layer, the first conductive layer, and the second conductive layer in FIG. 16. FIG. 27 is a stacked plan view of the third conductive layer and the fourth conductive layer in FIG. 16. FIG. 28 is a stacked plan view of the third conductive layer, the fourth conductive layer, and via holes in the insulating layer located between the third conductive layer and the fourth conductive layer in FIG. 16. FIG. 29 is a stacked plan view of the active layer, the third conductive layer, the fourth conductive layer, and the via holes in the insulating layer between the third conductive layer and the fourth conductive layer in FIG. 16. FIG. 30 is a stacked plan view of the active layer, the third conductive layer, the fourth conductive layer, the via holes VH1 in the insulating layer between the active layer and the third conductive layer, and the via holes VH2 in the insulating layer between the third conductive layer and the fourth conductive layer in FIG. 16. FIG. 31 is a plan view of an active layer in a first display area of a display panel provided by an embodiment of the present disclosure. FIG. 32 is a plan view of a first conductive layer in a first display area of a display panel provided by an embodiment of the present disclosure. FIG. 33 is a plan view of a second conductive layer in a first display area of a display panel provided by an embodiment of the present disclosure. FIG. 34 is a plan view of a third conductive layer in a first display area of a display panel provided by an embodiment of the present disclosure. FIG. 35 is a plan view of a fourth conductive layer in a first display area of a display panel provided by an embodiment of the present disclosure. FIG. 36 is a plan view of a transparent conductive layer in a first display area of a display panel provided by an embodiment of the present disclosure.

FIG. 20 and FIG. 31 illustrate the active layer LY0. FIG. 21 and FIG. 32 illustrate the first conductive layer LY1. FIG. 22 and FIG. 33 illustrate the second conductive layer LY2. FIG. 23 and FIG. 34 illustrate the third conductive layer LY3. FIG. 24 and FIG. 35 illustrate the fourth conductive layer LY4. FIG. 36 illustrates the transparent conductive layer LYx.

As illustrated in FIG. 19, the display panel includes a base substrate BS, a barrier layer BR is located on the base substrate BS, a buffer layer BF is located on the barrier layer BR, and an active layer LY0 is located on the buffer layer BF. As illustrated in FIG. 19, the active layer LY0 includes a channel T7c of the second reset transistor T7, a first electrode T71 and a second electrode T72 located on both sides of the channel T7c, a channel T5c of the second light-emitting control transistor T5, and a first electrode T51 and a second electrode T52 located on both sides of the channel T5c. As illustrated in FIG. 19, the insulating layer 801 is located on the active layer LY0, and the first conductive layer LY1 is located on the insulating layer 801. FIG. 19 illustrates a reset control signal portion RSTb, a gate signal line GA, and a light-emitting control signal portion EMLb that are located in the first conductive layer LY1. As illustrated in FIG. 19, the insulating layer 802 is located on the first conductive layer LY1, and the second conductive layer LY2 is located on the insulating layer 802. FIG. 19 illustrates the reset signal portion INTb in the second conductive layer LY2. As illustrated in FIG. 19, the insulating layer 803 is located on the second conductive layer LY2, and the third conductive layer LY3 is located on the insulating layer 803. FIG. 19 illustrates the connection electrode CE1 and the connection electrode CE2 that are located in the third conductive layer LY3. As illustrated in FIG. 19, one end of the connection electrode CE1 is connected to the reset signal portion INTb and the other end of the connection electrode CE1 is connected to the first electrode T71 of the second reset transistor T7; one end of the connection electrode CE2 is connected to the second electrode T72 of the second reset transistor T7 and the other end of the connection electrode CE2 is connected to the second electrode T52 of the second light-emitting control transistor T5. As illustrated in FIG. 19, the insulating layer 804 is located on the third conductive layer LY3, and the fourth conductive layer LY4 is located on the insulating layer 804. FIG. 19 illustrates the connection electrode CE11 and the connection electrode CE12 that are located in the fourth conductive layer LY4. As illustrated in FIG. 19, the connection electrode CE11 is connected to the connection electrode CE1, and the connection electrode CE12 is connected to the connection electrode CE2. As illustrated in FIG. 19, the insulating layer 805 is located on the fourth conductive layer LY4, and the transparent conductive layer LYx is located on the insulating layer 805. FIG. 19 illustrates the reset signal portion INTc and the connection electrode CEx that are located in the transparent conductive layer LYx. The connection electrode CEx is connected to the connection electrode CE12, and the reset signal portion INTc is connected to the connection electrode CE11.

As illustrated in FIG. 19, the insulating layer 804 can include at least one insulating layer. FIG. 19 is illustrated by taking as an example that the insulating layer 804 includes a passivation layer PVX and a planarization layer PLN.

As illustrated in FIG. 19, the insulating layer 801 can also be referred to as a gate insulating layer GI1, the insulating layer 802 can also be referred to as a gate insulating layer GI2, and the insulating layer 803 can also be referred to as an interlayer insulating layer ILD.

As illustrated in FIG. 21, the first conductive layer LY1 includes a reset control signal line RST, a gate signal line GA, a second electrode Ca of a capacitor C, and a light-emitting control signal line EML.

As illustrated in FIG. 22, the second conductive layer LY2 includes a reset signal line INT2, a block BK, and a first electrode Cb of a capacitor C.

As illustrated in FIG. 16, the block BK is connected to the first power supply line Vdd through a via hole V5. The block BK functions to stabilize the voltage at the intermediate node between the two channels of the threshold compensation transistor T3.

In the embodiments of the present disclosure, the first power supply line Vdd is connected to the first voltage terminal VDD.

Referring to FIG. 16, and FIG. 21 to FIG. 23, the first electrode Cb of the capacitor C has an opening Cb0 so as to facilitate the connection between the connection electrode CEd and the second electrode Ca of the capacitor C.

As illustrated in FIG. 23, the third conductive layer LY3 includes a data line Vd, a first power supply line Vdd, a reset signal line INT1, a connection electrode CEa, a connection electrode CEb, a connection electrode CEc, and a connection electrode CEd.

As illustrated in FIG. 24, the fourth conductive layer LY4 includes a connection electrode CEe, a connection electrode CEf, and a shield electrode CEg.

FIG. 25 illustrates each transistor, the part of the active layer LY0 covered by the first conductive layer LY1 is the channel of the transistor, the two sides of the channel are respectively the first electrode and the second electrode of the transistor, the second electrode Ca of the capacitor C also serves as the gate electrode of the driving transistor T1, part of the gate signal line GA serves as the gate electrode of the data writing transistor T2, part of the gate signal line GA serves as the gate electrode of the threshold compensation transistor T3, part of the light-emitting control signal line EML serves the gate electrode of the first light-emitting control transistor T4, part of the light-emitting control signal line EML serves as the gate electrode of the second light-emitting control transistor T5, part of the reset control signal line RST serves as the gate electrode of the first reset transistor T6, and part of the reset control signal line RST serves as the gate electrode of the second reset transistor T7.

Referring to FIG. 16. FIG. 23, FIG. 24, and FIG. 27 to FIG. 30, one end of the connection electrode CEe is connected to the connection electrode CEb through a via hole V12, the other end of the connection electrode CEe is connected to the connection electrode CEc through a via hole V13, the connection electrode CEf is connected to the first power supply line Vdd through a via hole V15, and the orthographic projection of the shield electrode CEg on the base substrate covers the orthographic projection of the connection electrode CEd on the base substrate so as to stabilize the voltage on the gate electrode of the driving transistor.

Referring to FIG. 16, FIG. 23, FIG. 24, and FIG. 30, one end of the connection electrode CEa is connected to the reset signal line INT (the reset signal line INT2) through a via hole V1, and the other end of the connection electrode CEa is connected to the first electrode of the second reset transistor T7 through a via hole V2.

Referring to FIG. 16, FIG. 23, FIG. 24, and FIG. 30, one end of the connection electrode CEb is connected to the second electrode of the second reset transistor T7 through a via hole V3.

Referring to FIG. 16. FIG. 23. FIG. 24, and FIG. 30, one end of the connection electrode CEc is connected to the second electrode of the second light-emitting control transistor T5 through a via hole V11.

Referring to FIG. 16, FIG. 23, FIG. 24, and FIG. 30, one end of the connection electrode CEd is connected to the second electrode of the first reset transistor T6 through a via hole V7, and the other end of the connection electrode CEd is connected to the gate electrode of the driving transistor T1 through a via hole V8.

Referring to FIG. 16, FIG. 23, and FIG. 30, the first power supply line Vdd is connected to the first electrode Cb of the capacitor C through a via hole V9. The first power supply line Vdd is connected to the first electrode of the first light-emitting control transistor T4 through a via hole V10.

Referring to FIG. 16, FIG. 23, and FIG. 30, the data line Vd is connected to the second electrode of the data writing transistor T2 through a via hole V6.

Referring to FIG. 16, FIG. 23, FIG. 24, and FIG. 30, the reset signal line INT1 is connected to the first electrode of the first reset transistor T6 through a via hole V4.

As illustrated in FIG. 16, the connection electrode CE01 located in the transparent conductive layer LYx is connected to the connection electrode CEc through a via hole V14.

Referring to FIG. 16, FIG. 22, FIG. 23, and FIG. 27 to FIG. 30, the reset signal line INT1 and the reset signal line INT2 are located in different layers, for example, the reset signal line INT1 is located in the third conductive layer LY3, and the reset signal line INT2 is located in the second conductive layer LY2.

Referring to FIG. 16, FIG. 23, FIG. 24, and FIG. 27 to FIG. 30, the reset signal line INT1 intersects with the reset signal line INT2. For example, the reset signal line INT1 is perpendicular to the reset signal line INT2.

As illustrated in FIG. 30, the via hole VH1 located in the insulating layer between the active layer and the third conductive layer includes via holes V1 to V11, and the via hole VH2 located in the insulating layer between the third conductive layer and the fourth conductive layer includes a via hole V12, a via hole V13, and a via hole V15.

For example, the insulating layer 801, the insulating layer 802, the insulating layer 803, the insulating layer 804, and the insulating layer 805 can all be made of insulating materials. In the embodiments of the present disclosure, the base substrate can be a flexible base substrate, and the material includes polyimides, but is not limited thereto.

"Normal" in FIG. 18 indicates that the pixel circuit is located in the second display area 12, "R" in the figure denotes the pixel circuit connected to the red light light-emitting device, and "B" denotes the pixel circuit connected to the blue light light-emitting device. FIG. 18 illustrates the pixel circuits of some sub-pixels, and for the remaining pixel circuits, reference can be correspondingly made to the structures of the pixel circuits illustrated in FIG. 18 according to the positions of the remaining pixel circuits.

FIG. 31 to FIG. 36 illustrate plan views of a single film layer located in the first display area 11 in the display panel provided by the embodiments of the present disclosure. The structure of the pixel circuit PXC (first driving circuit 14) located in the first display area 11 will be described below with reference to FIG. 17, FIG. 18, and FIG. 31 to FIG. 36. FIG. 31 to FIG. 36 illustrate three pixel circuits PXCs (first driving circuits 14).

FIG. 31 illustrates the active layer LY0. Referring to FIG. 20 and FIG. 31, the portion of the active layer LY0 located in the second display area as illustrated in FIG. 20 has a different structure from the portion of the active layer LY0 located in the first display area as illustrated in FIG. 31. Therefore, referring to FIG. 16 and FIG. 17, the structure of the first driving circuit 14 is different from that of the external driving circuit 16.

FIG. 17 illustrates via holes Va to Vk.

Referring to FIG. 17, FIG. 33, and FIG. 34, one end of the connection electrode CE1 is connected to the reset signal line INT2 through a via hole Va, and the other end of the connection electrode CE1 is connected to the first electrode of the second reset transistor T7 through a via hole Vb; one end of the electrode CE2 is connected to the second electrode of the second reset transistor T7 through a via hole Vc, and the other end of the connection electrode CE2 is connected to the second electrode of the second light-emitting control transistor T5 through a via hole Vd.

Referring to FIG. 17, FIG. 33, and FIG. 34, one end of the connection electrode CE3 is connected to the second electrode of the first reset transistor T6 through a via hole Ve, and the other end of the connection electrode CE3 is connected to the gate electrode of the driving transistor T1 through a via hole Vf.

Referring to FIG. 17, FIG. 33, and FIG. 34, the first power supply line Vdd is connected to the first electrode Cb of the capacitor C through a via hole Vg.

Referring to FIG. 17, FIG. 33, and FIG. 34, one end of the connection electrode CE4 is connected to the first electrode of the first light-emitting control transistor T4 through a via hole Vh, and the other end of the connection electrode CE4 is connected to the first power supply line Vdd through a via hole Vi.

Referring to FIG. 17, FIG. 33, and FIG. 34, the data line Vd is connected to the second electrode of the data writing transistor T2 through a via hole Vj.

Referring to FIG. 17. FIG. 35, and FIG. 36, the first power supply line Vdd includes: a connection electrode CE10 (power supply portion Vddc), a power supply portion Vdda, and a power supply portion Vddb, and the connection electrode CE10 (power supply portion Vddc) is connected to the power supply portion Vdda through a via hole Vk and the connection electrode CE10 (power supply portion Vddc) is connected to the power supply portion Vddb through a via hole Vi. The first power supply line Vdd is made of different materials located in different layers, which helps to improve the transmittance of the first display area. Of course, in other embodiments, the first power supply line Vdd may also not be arranged in segments.

Referring to FIG. 17, FIG. 33, and FIG. 36, the reset signal portion INTc is connected to the reset signal portion INTb through a via hole Vaa.

FIG. 34 also illustrates the connection electrode CE5, the connection electrode CE6, the connection electrode CE7, the connection electrode CE8, and the connection electrode CE9. The connection electrodes CE5. CE6, CE7, CE8, and CE9 all serve as intermediate elements for connecting with the corresponding elements located in the fourth conductive layer LY4 at corresponding positions.

FIG. 35 also illustrates the connection electrode CE22, the connection electrode CE12, the connection electrode CE15, the connection electrode CE16, the connection electrode CE17, the connection electrode CE18, and the connection electrode CE19.

Referring to FIG. 18, FIG. 34, and FIG. 35, the connection electrode CE11 is connected to the connection electrode CE1, for example, connected to the upper end of the connection electrode CE1; the connection electrode CE12 is connected to the connection electrode CE2, for example, connected to the lower end of the connection electrode CE2; the connection electrode CE15 is connected to the connection electrode CE5, the connection electrode CE16 is connected to the connection electrode CE6, the connection electrode CE17 is connected to the connection electrode CE7, the connection electrode CE18 is connected to the connection electrode CE8, and the connection electrode CE19 is connected to the connection electrode CE9. The elements located in the fourth conductive layer LY4 and the elements located in the third conductive layer LY3 are connected through via holes passing through the insulating layer between the third conductive layer LY3 and the fourth conductive layer LY4.

Referring to FIG. 18, and FIG. 34 to FIG. 36, the reset control signal portion RSTb is connected to the connection electrode CE18 through a via hole, the connection electrode CE18 is connected to the connection electrode CE8 through a via hole, and the connection electrode CE8 is connected to the reset control signal portion RSTc through a via hole. The connection electrode CE18 and the connection electrode CE8 both serve as intermediate connecting pieces. This arrangement enables the reset control signal line to include at least two different materials, so as to improve the transmittance of the first display area. Of course, in other embodiments, the reset control signal line can also be formed of the same material located in the same layer, instead of being formed in a segmented manner. Likewise, the connection electrode CE6 and the connection electrode CE16 serve as intermediate connecting pieces at the other end of the reset control signal portion RSTb, and no further detail will be provided here.

Referring to FIG. 18, and FIG. 34 to FIG. 36, the reset signal portion INTb is connected to the connection electrode CE1 through a via hole, the connection electrode CE1 is connected to the connection electrode CE11 through a via hole, and the connection electrode CE11 is connected to the reset signal portion INTc through a via hole. The connection electrode CE1 and the connection electrode CE11 both serve as intermediate connecting pieces. This arrangement enables the reset control signal line to include at least two different materials, so as to improve the transmittance of the first display area. Of course, in other embodiments, the reset signal line can also be formed of the same material located in the same layer, instead of being formed in a segmented manner. Likewise, the connection electrode CE7 and the connection electrode CE17 serve as intermediate connecting pieces at the other end of the reset signal portion INTb, and no further detail will be provided here.

Referring to FIG. 18, and FIG. 34 to FIG. 36, the light-emitting control signal portion EMLb is connected to the connection electrode CE9 through a via hole, the connection electrode CE9 is connected to the connection electrode CE19 through a via hole, and the connection electrode CE19 is connected to the light-emitting control signal portion EMLc through a via hole. The connection electrode CE9 and the connection electrode CE19 both serve as intermediate connecting pieces. This arrangement enables the light-emitting control signal line to include at least two different materials, so as to improve the transmittance of the first display area. Of course, in other embodiments, the light-emitting control signal line can also be formed of the same material located in the same layer, instead of being formed in a segmented manner. Likewise, the connection electrode CE5 and the connection electrode CE15 serve as intermediate connecting pieces at the other end of the light-emitting control signal portion EMLb, and no further detail will be provided here.

Referring to FIG. 18, and FIG. 34 to FIG. 36, the connection electrode CE2 is connected to the connection electrode CE12 through a via hole, and the connection electrode CE12 is connected to the connection electrode CE20 through a via hole. The connection electrode CE20 can be connected to the first electrode of the light-emitting device.

In the case that at least one of the signal lines such as the first power supply line Vdd, the light-emitting control signal line EML, the reset control signal line RST, and the reset signal line INT2 is arranged in segments, the transparent conductive layer where each signal line is located can be closer to the base substrate than the transparent conductive layer where the lead wire 17 is located.

As illustrated in FIG. 17 and FIG. 18, for the pixel circuit located in the first display area 11, the control lines of the second reset transistor T7, the data writing transistor T2 and the threshold compensation transistor T3 are all gate signal line GA. The gate electrodes of the second reset transistor T7, the data writing transistor T2, and the threshold compensation transistor T3 are all connected to the gate signal line GA. As illustrated in FIG. 17 and FIG. 18, for the pixel circuit located in the first display area 11, the gate electrode of the first reset transistor T6 and the gate electrode of the second reset transistor T7 are not connected, and signals can be inputted separately.

As illustrated in FIG. 16 and FIG. 18, for the pixel circuit located in the second display area 12, the control lines of the first reset transistor T6 and the second reset transistor T7 are all reset control signal line RST. That is, the gate electrode of the first reset transistor T6 is connected to the gate electrode of the second reset transistor T7.

Referring to FIG. 16 to FIG. 18, the reset signal line INT2 extends from the second display area 12 to the first display area 11 and serves as a reset signal line for the first reset transistor T6 and the second reset transistor T7 of the pixel circuit located in the first display area 11. That is, the first reset transistor T6 and the second reset transistor T7 of the pixel circuit located in the first display area 11 share the same reset signal line, so as to be configured to provide the same reset signal. The same reset signal line can provide the same reset signal. The same reset signal line can be arranged in segments, and is connected by the sections located in different layers through via holes. Referring to FIG. 16 to FIG. 18, a pixel circuit located in the second display area 12 has two reset signal lines (a reset signal line INT2 and a reset signal line INT1), and the reset signal line INT2 extending along the first direction X extends from the second display area 12 to the first display area 11 and serves as a reset signal line for the first reset transistor T6 and the second reset transistor T7 of the pixel circuit located in the first display area 11.

Figure 37A:
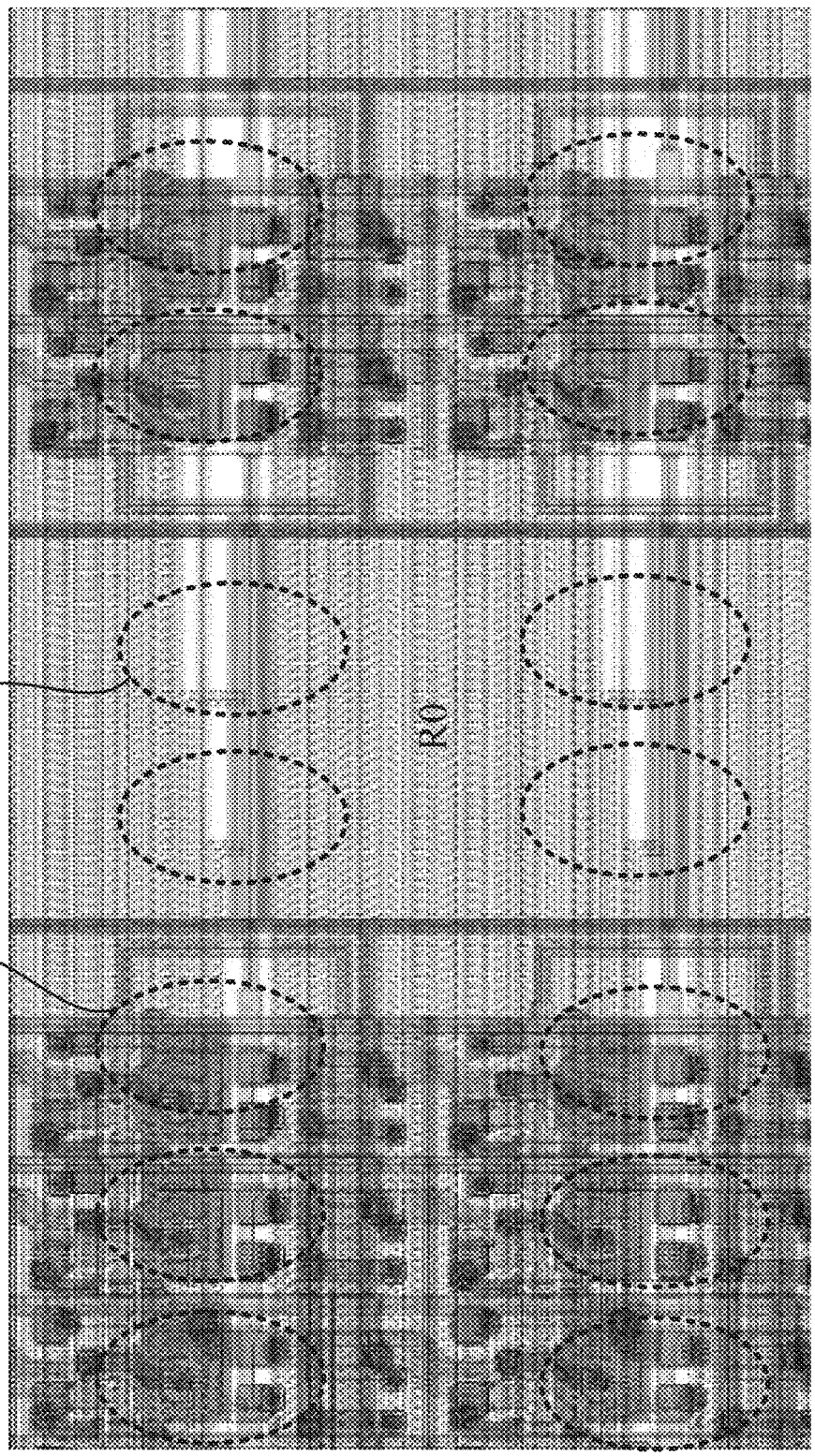
FIG. 37A is a schematic diagram of a display panel provided by an embodiment of the present disclosure.
Figure 37B:
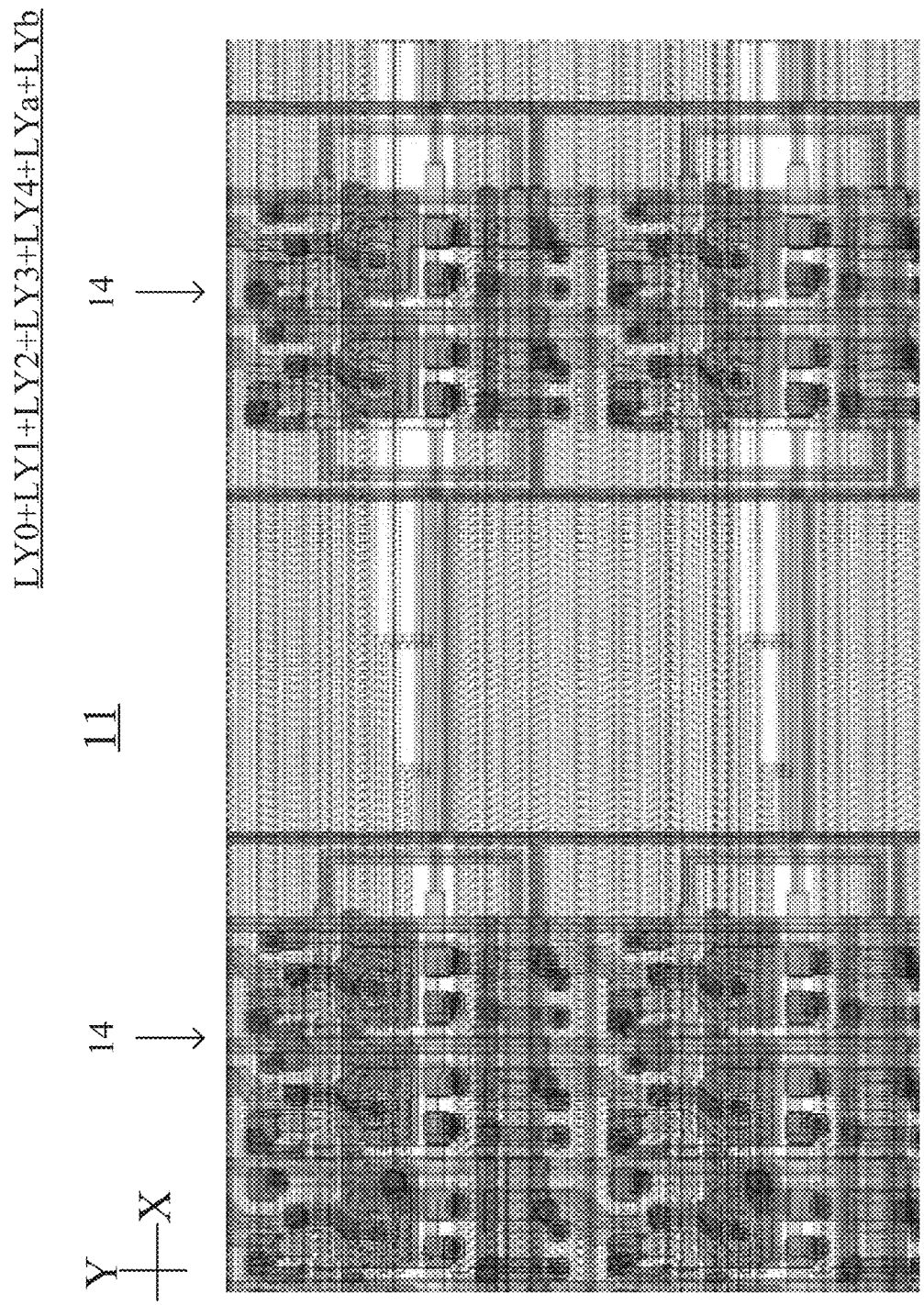
FIG. 37B is a layout diagram of a display panel provided by an embodiment of the present disclosure.
Figure 38:
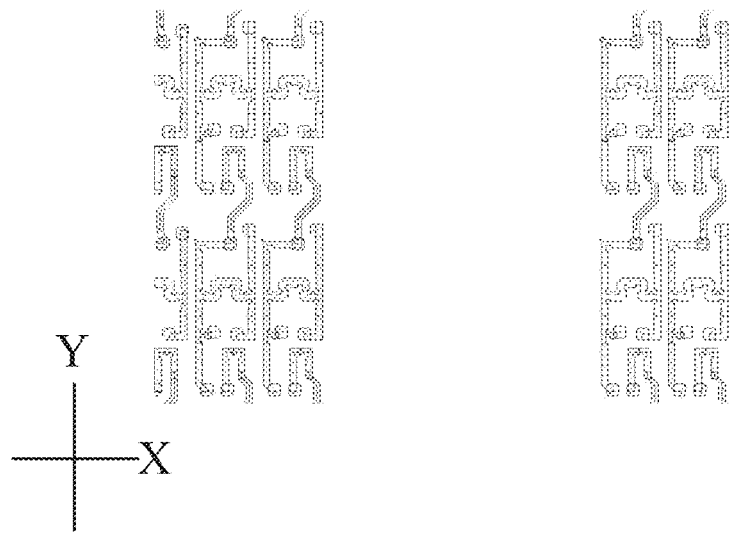
FIG. 38 is a plan view of an active layer LY0 in a display panel provided by an embodiment of the present disclosure.
Figure 39:
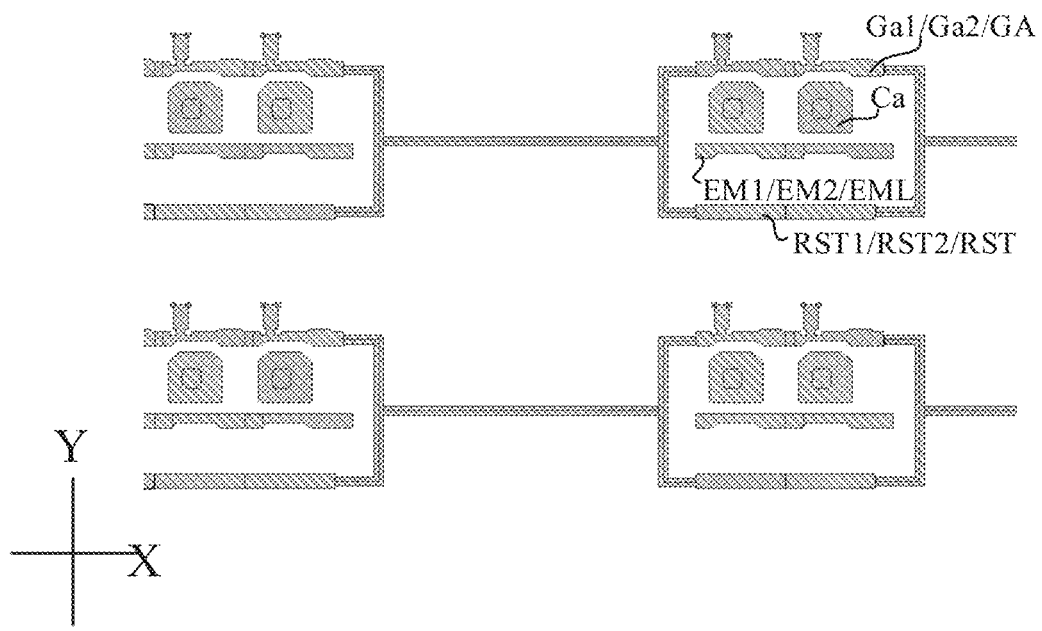
FIG. 39 is a plan view of a first conductive layer LY1 in a display panel provided by an embodiment of the present disclosure.
Figure 40:
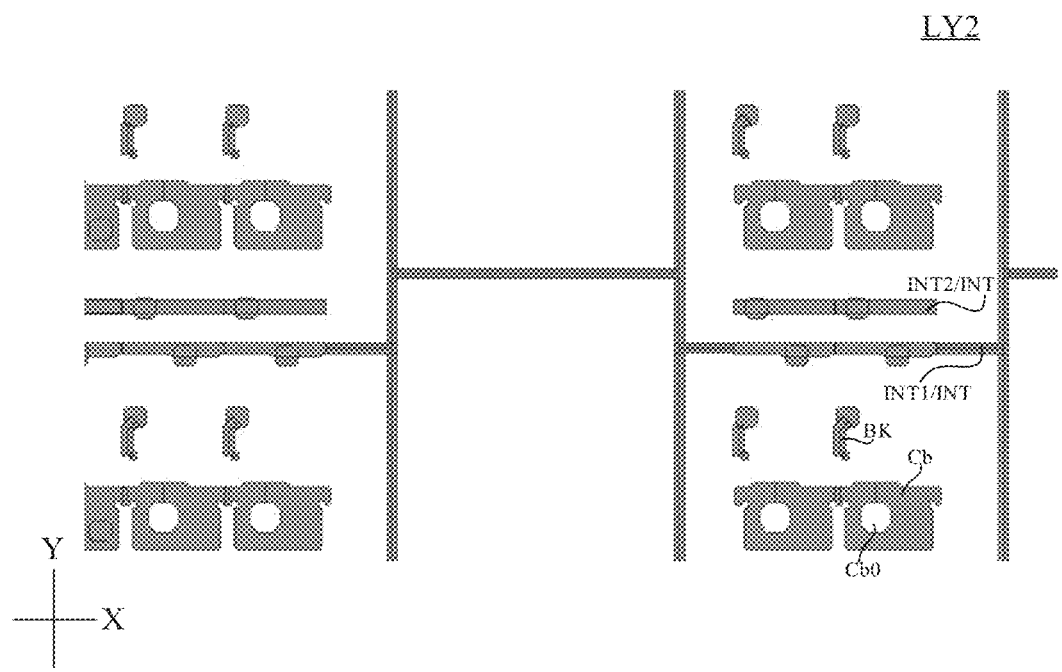
FIG. 40 is a plan view of a second conductive layer LY2 in a display panel provided by an embodiment of the present disclosure.
Figure 41:
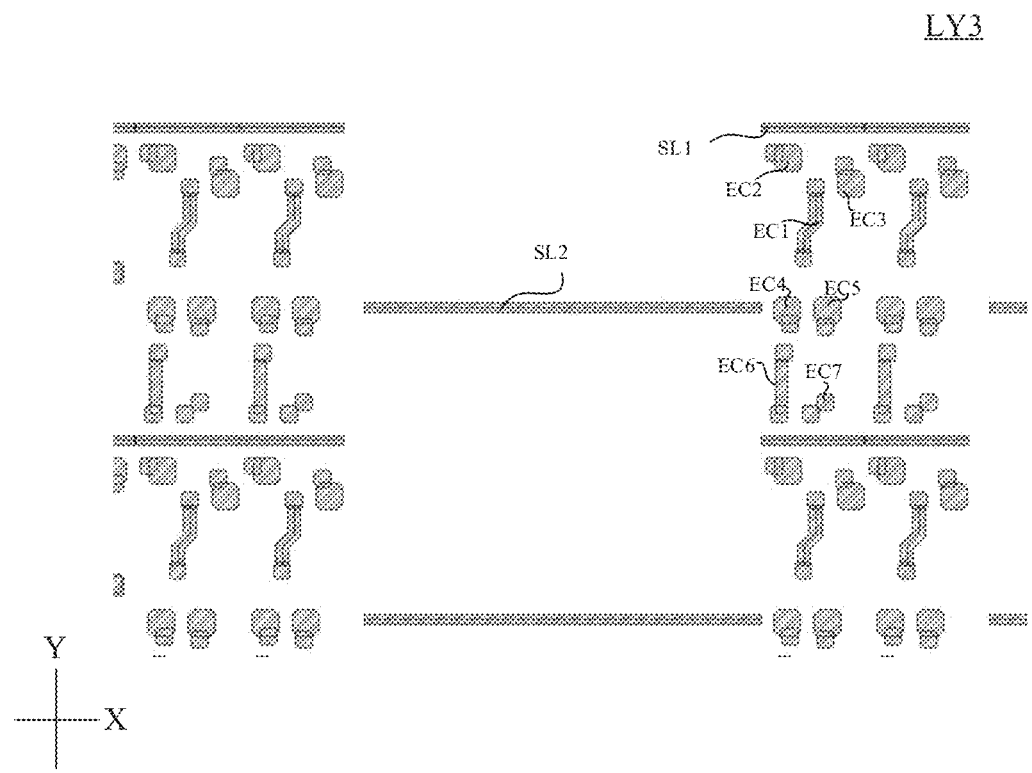
FIG. 41 is a plan view of a third conductive layer LY3 in a display panel provided by an embodiment of the present disclosure.
Figure 42:
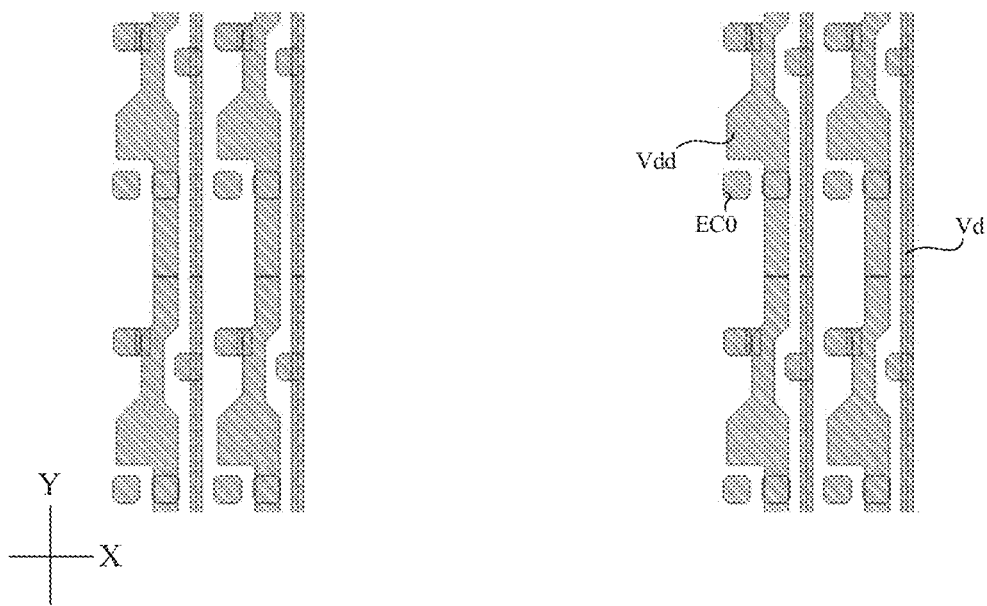
FIG. 42 is a plan view of a fourth conductive layer LY4 in a display panel provided by an embodiment of the present disclosure.
Figure 43:
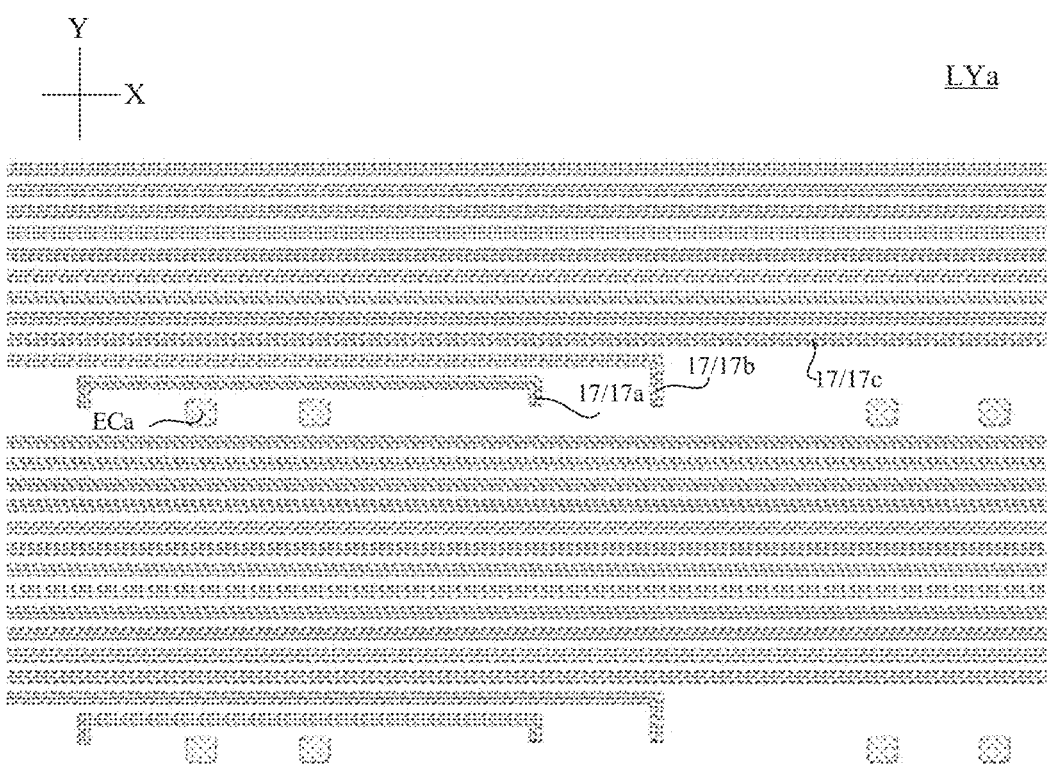
FIG. 43 is a plan view of a transparent conductive layer LYa in a display panel provided by an embodiment of the present disclosure.
Figure 44:
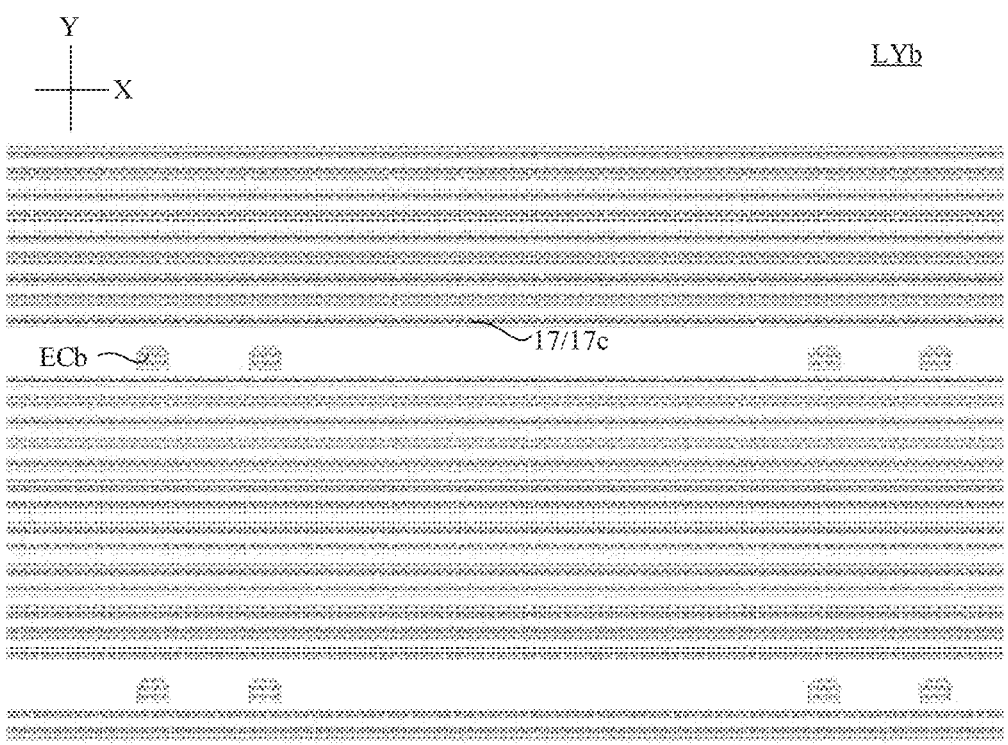
FIG. 44 is a plan view of a transparent conductive layer LYb in a display panel provided by an embodiment of the present disclosure.
Figure 45:
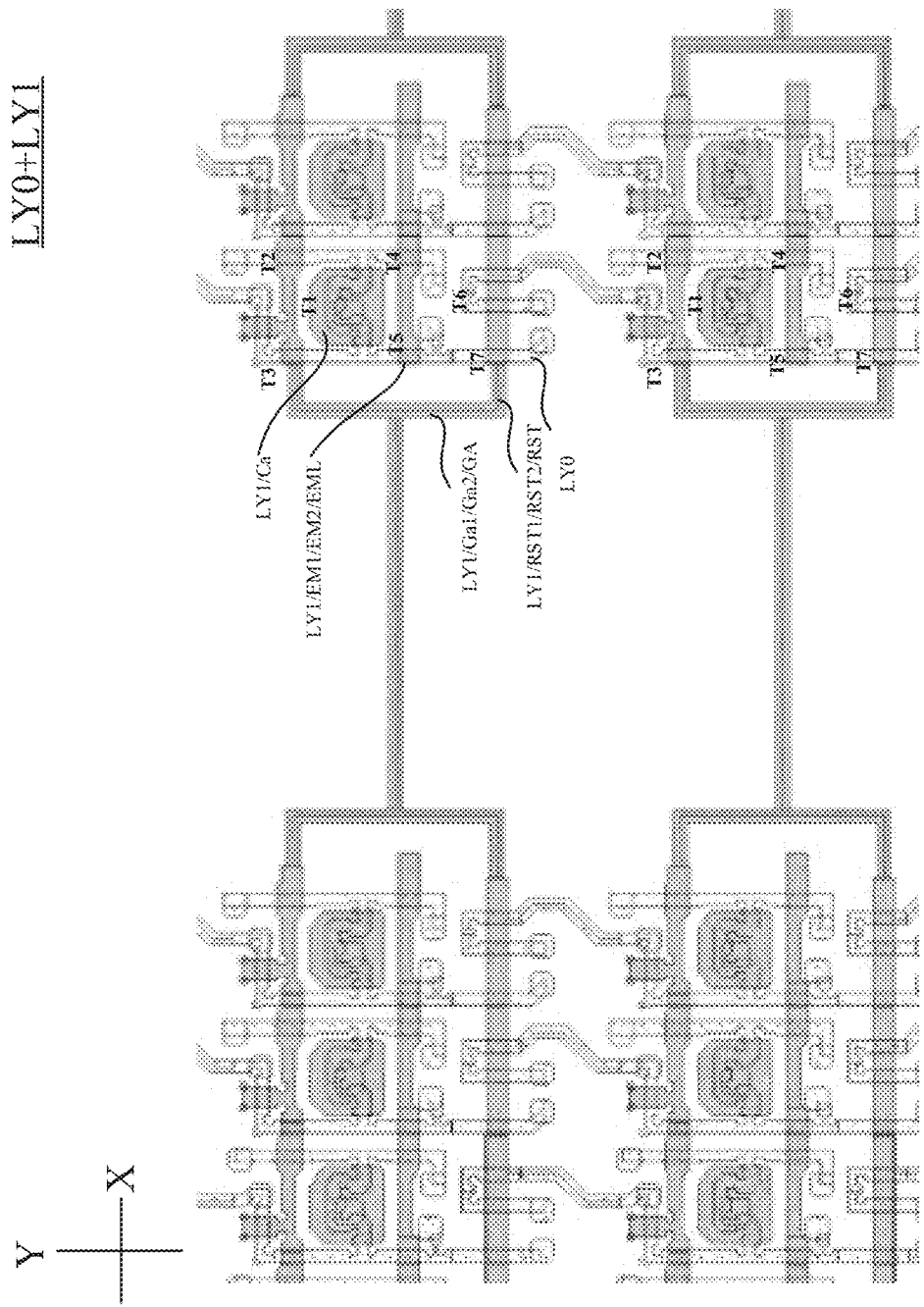
FIG. 45 is a stacked plan view of an active layer LY0 and a first conductive layer LY1 in a display panel provided by an embodiment of the present disclosure.
Figure 46:
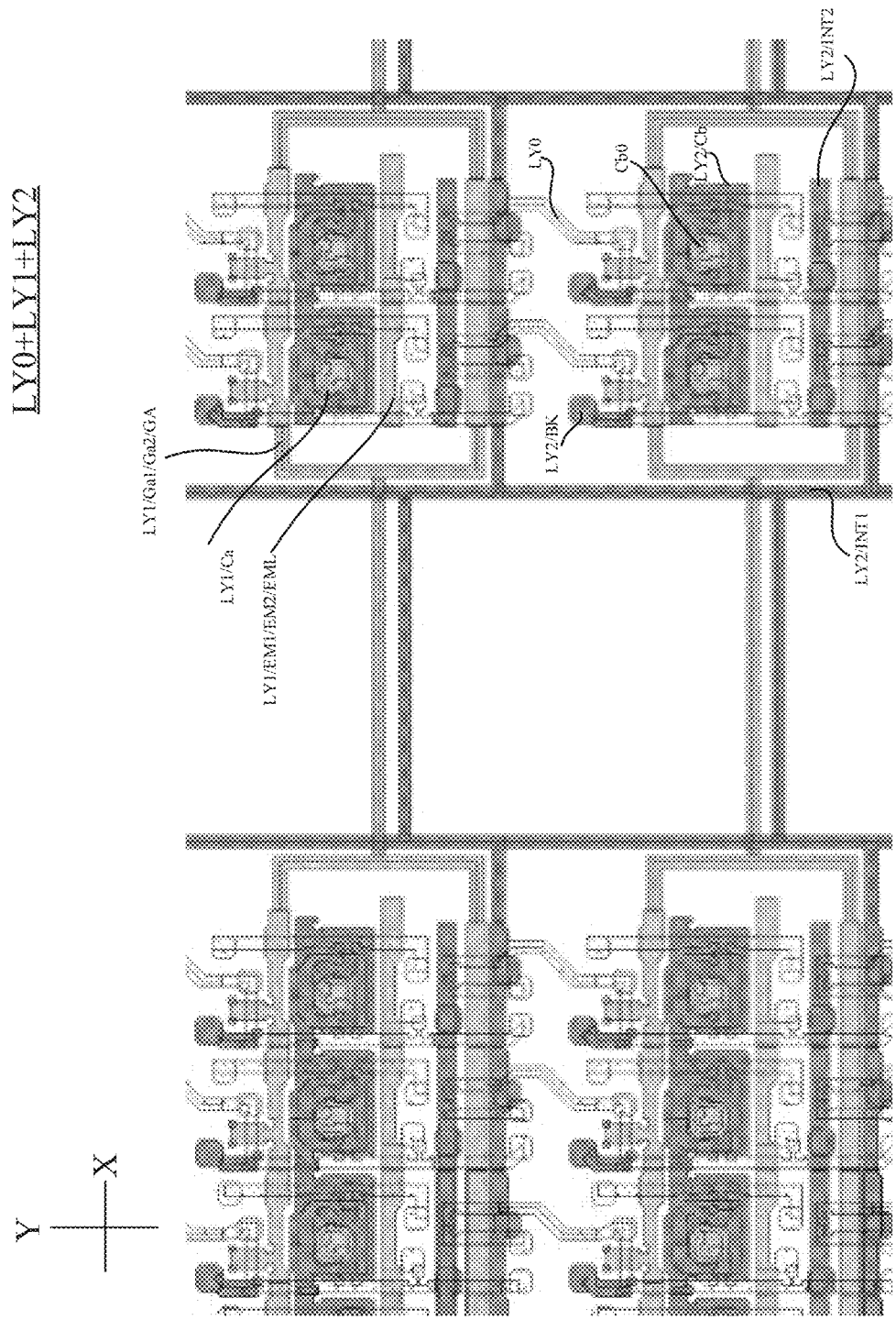
FIG. 46 is a stacked plan view of an active layer LY0, a first conductive layer LY1, and a second conductive layer LY2 in a display panel provided by an embodiment of the present disclosure.
Figure 47:
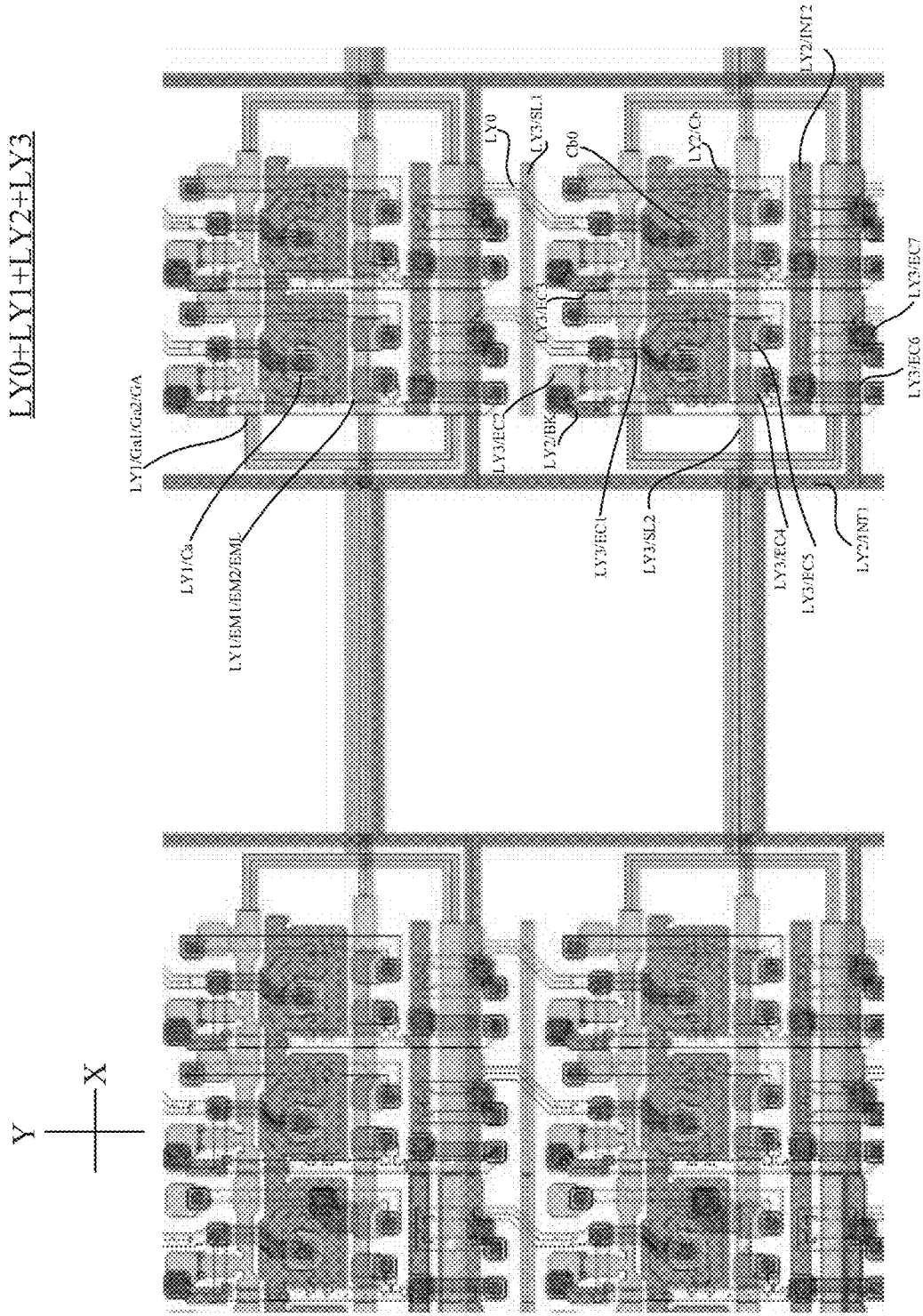
FIG. 47 is a stacked plan view of an active layer LY0, a first conductive layer LY1, a second conductive layer LY2, and a third conductive layer LY3 in a display panel provided by an embodiment of the present disclosure.
Figure 48:
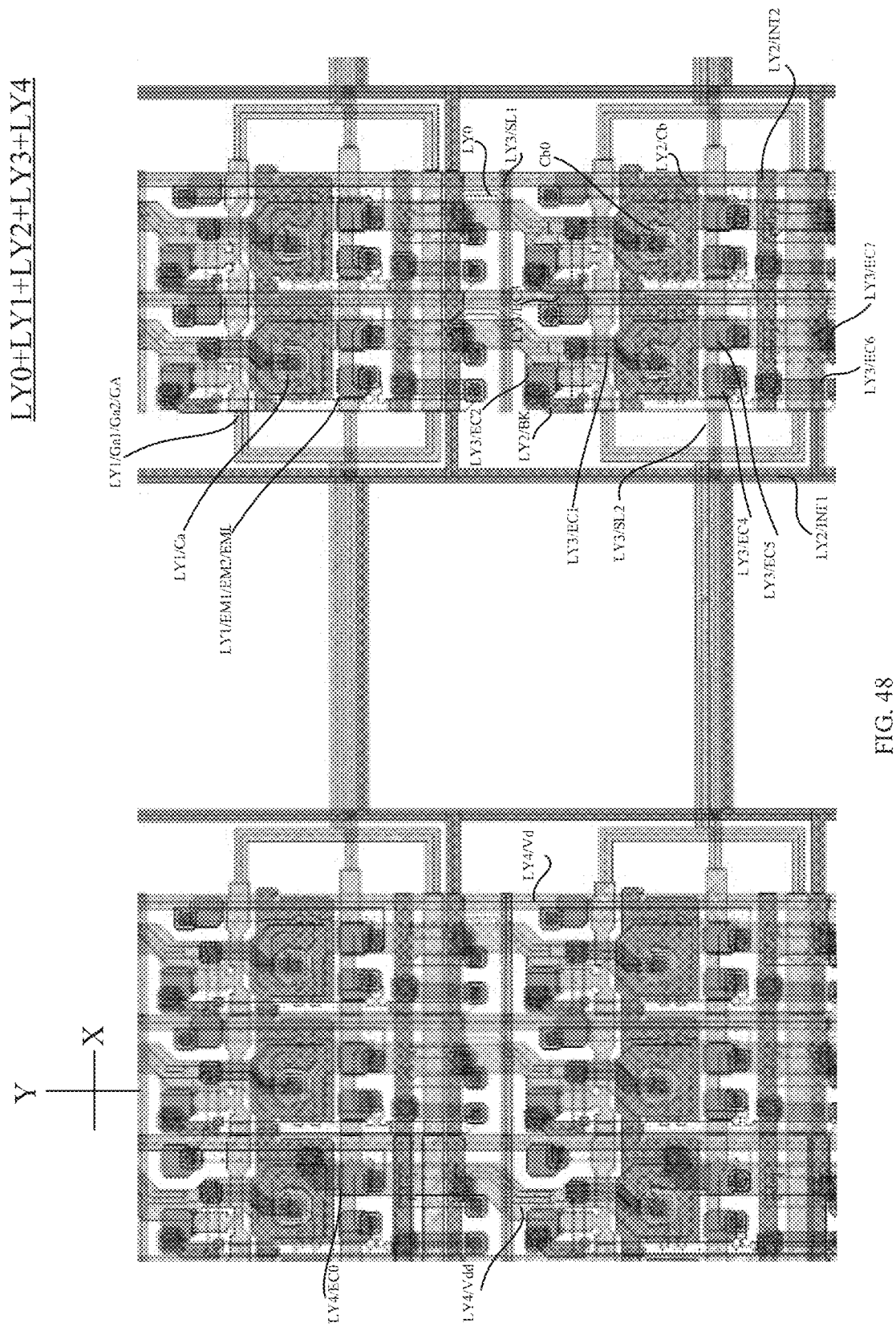
FIG. 48 is a stacked plan view of an active layer LY0, a first conductive layer LY1, a second conductive layer LY2, a third conductive layer LY3, and a fourth conductive layer LY4 in a display panel provided by an embodiment of the present disclosure.
Figure 49:
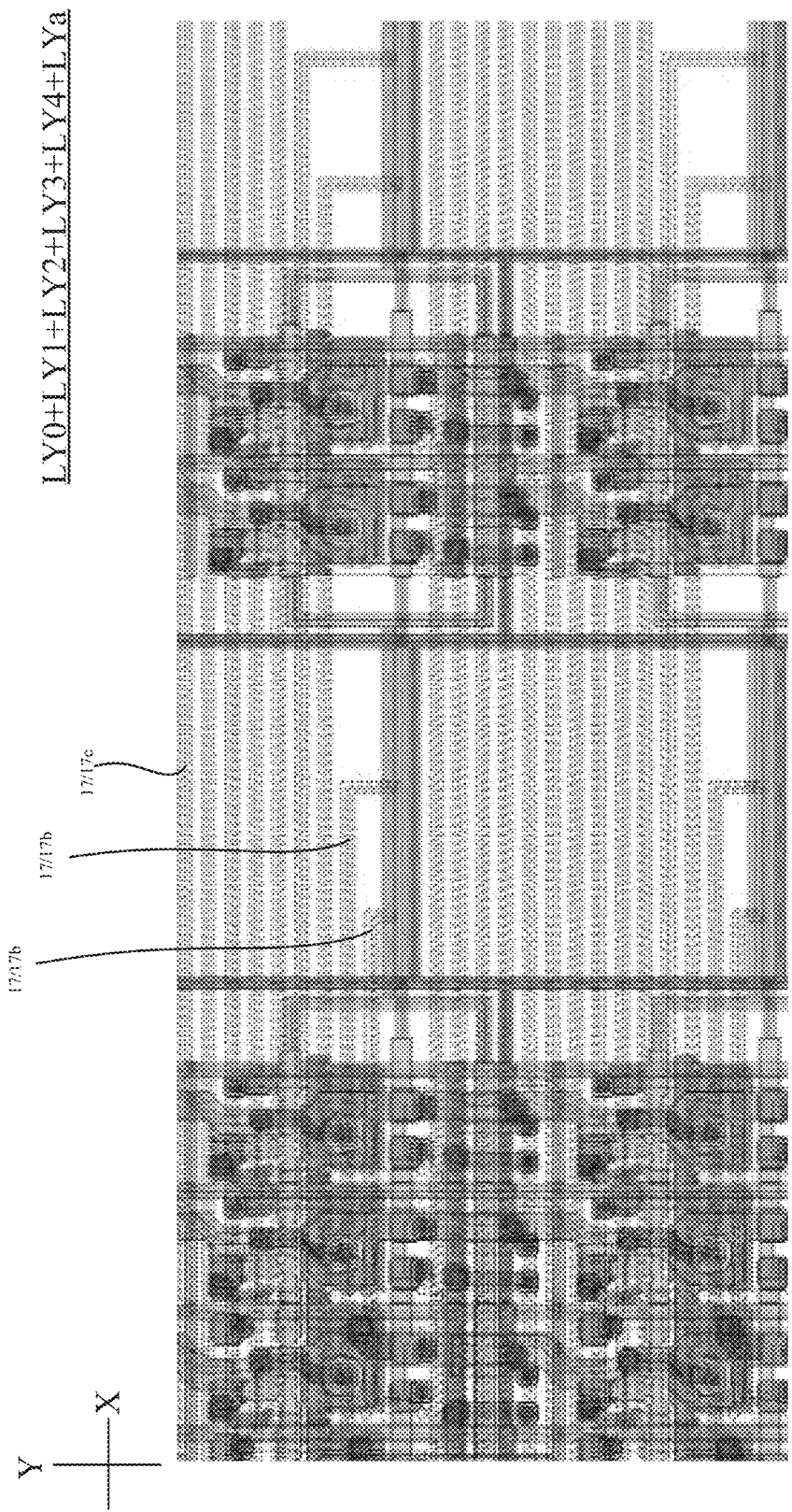
FIG. 49 is a stacked plan view of an active layer LY0, a first conductive layer LY1, a second conductive layer LY2, a third conductive layer LY3, a fourth conductive layer LY4, and a transparent conductive layer LYa in a display panel provided by an embodiment of the present disclosure.

FIG. 37A is a schematic diagram of a display panel provided by an embodiment of the present disclosure. FIG. 37B is a layout diagram of a display panel provided by an embodiment of the present disclosure. FIG. 38 is a plan view of an active layer LY0 in a display panel provided by an embodiment of the present disclosure. FIG. 39 is a plan view of a first conductive layer LY1 in a display panel provided by an embodiment of the present disclosure. FIG. 40 is a plan view of a second conductive layer LY2 in a display panel provided by an embodiment of the present disclosure. FIG. 41 is a plan view of a third conductive layer LY3 in a display panel provided by an embodiment of the present disclosure. FIG. 42 is a plan view of a fourth conductive layer LY4 in a display panel provided by an embodiment of the present disclosure. FIG. 43 is a plan view of a transparent conductive layer LYa in a display panel provided by an embodiment of the present disclosure. FIG. 44 is a plan view of a transparent conductive layer LYb in a display panel provided by an embodiment of the present disclosure. FIG. 45 is a stacked plan view of an active layer LY0 and a first conductive layer LY1 in a display panel provided by an embodiment of the present disclosure. FIG. 46 is a stacked plan view of an active layer LY0, a first conductive layer LY1, and a second conductive layer LY2 in a display panel provided by an embodiment of the present disclosure. FIG. 47 is a stacked plan view of an active layer LY0, a first conductive layer LY1, a second conductive layer LY2, and a third conductive layer LY3 in a display panel provided by an embodiment of the present disclosure. FIG. 48 is a stacked plan view of an active layer LY0, a first conductive layer LY1, a second conductive layer LY2, a third conductive layer LY3, and a fourth conductive layer LY4 in a display panel provided by an embodiment of the present disclosure. FIG. 49 is a stacked plan view of an active layer LY0, a first conductive layer LY1, a second conductive layer LY2, a third conductive layer LY3, a fourth conductive layer LY4, and a transparent conductive layer LYa in a display panel provided by an embodiment of the present disclosure.

FIG. 37B is a stacked plan view of an active layer LY0, a first conductive layer LY1, a second conductive layer LY2, a third conductive layer LY3, a fourth conductive layer LY4, a transparent conductive layer LYa, and a transparent conductive layer LYb in a display panel provided by an embodiment of the present disclosure. FIG. 49 is a stacked plan view of the active layer LY0, the first conductive layer LY1, the second conductive layer LY2, the third conductive layer LY3, the fourth conductive layer LY4, and the transparent conductive layer LYa in FIG. 37B.

As illustrated in FIG. 1 and FIG. 37A, the display panel includes a first driving circuit 14, a first light-emitting device 131 connected to the first driving circuit 14, and a second light-emitting device 132. FIG. 37A illustrates the first electrode E1 of the light-emitting device by means of an oval dotted line frame, and the first electrode E1 represents the light-emitting device. The shape of the first electrode E1 is not limited to what is illustrated in the figure, the size of the first electrode E1 is also not limited to what is illustrated in the figure, and the shape and the size can be determined depending upon requirements. FIG. 37A illustrates part of the first display area 11. FIG. 37A illustrates that a region between adjacent light-emitting devices includes a light-transmitting region R0.

FIG. 37B is a layout diagram of the pixel circuit in FIG. 37A. For the pixel circuit diagram illustrated in FIG. 37B, reference can be made to FIG. 8.

FIG. 38 illustrates the active layer LY0. FIG. 39 illustrates the first conductive layer LY1. FIG. 40 illustrates the second conductive layer LY2. FIG. 41 illustrates the third conductive layer LY3. FIG. 42 illustrates the fourth conductive layer LY4. FIG. 43 illustrates the transparent conductive layer LYa. FIG. 44 illustrates the transparent conductive layer LYb.

FIG. 37A, FIG. 37B, and FIG. 47 to FIG. 49 illustrate via holes connecting components of different layers.

In the embodiments of the present disclosure, the connection between components located in different layers in the active layer LY0, the first conductive layer LY1, and the second conductive layer LY2 is realized by the components located in the third conductive layer LY3. The components in the fourth conductive layer LY4 and the components in the third conductive layer LY3 are connected through via holes passing through the insulating layer between the third conductive layer LY3 and the fourth conductive layer LY4. The components in the transparent conductive layer LYa and the components in the fourth conductive layer LY4 are connected through via holes passing through the insulating layer between the transparent conductive layer LYa and the fourth conductive layer LY4. The components in the transparent conductive layer LYa and the components in the transparent conductive layer LYb are connected through via holes passing through the insulating layer between the transparent conductive layer LYa and the transparent conductive layer LYb.

As illustrated in FIG. 39, the first conductive layer LY1 includes a reset control signal line RST (a reset control signal line RST1 and a reset control signal line RST2), a gate signal line GA, a second electrode Ca of a capacitor C, and a light-emitting control signal line EML. In the same row of sub-pixels, the reset control signal line RST is connected to the gate signal line GA.

As illustrated in FIG. 40, the second conductive layer LY2 includes a reset signal line INT1, a reset signal line INT2, a block BK, and a first electrode Cb of a capacitor C. The reset signal line INT1 and the reset signal line INT2 both can be referred to as the reset signal line INT. The first electrode Cb of the capacitor C has an opening Cb0.

As illustrated in FIG. 48, the block BK is connected to the first power supply line Vdd through a via hole. The block BK functions to stabilize the voltage at the intermediate node between the two channels of the threshold compensation transistor T3. In the embodiments of the present disclosure, the first power supply line Vdd is connected to the first voltage terminal VDD.

Referring to FIG. 37B, FIG. 40, FIG. 41, and FIG. 46 to FIG. 49, the first electrode Cb of the capacitor C has an opening Cb0 so as to facilitate the connection between the connection electrode EC1 and the second electrode Ca of the capacitor C.

As illustrated in FIG. 41, the third conductive layer LY3 includes a signal line SL1, a signal line SL2, a connection electrode EC1, a connection electrode EC2, a connection electrode EC3, a connection electrode EC4, a connection electrode EC5, a connection electrode EC6, and a connection electrode EC7.

As illustrated in FIG. 42, the fourth conductive layer LY4 includes a data line Vd, a first power supply line Vdd, and a connection electrode EC0.

Referring to FIG. 37B, FIG. 40, FIG. 41, and FIG. 46 to FIG. 49, the orthographic projection of the first power supply line Vdd on the base substrate overlaps with the orthographic projection of the connection electrode EC1 on the base substrate so as to stabilize the voltage on the gate electrode of the driving transistor.

FIG. 45 illustrates various transistors. FIG. 45 illustrates a driving transistor T1, a data writing transistor T2, a threshold compensation transistor T3, a first light-emitting control transistor T4, a second light-emitting control transistor T5, a first reset transistor T6, and a second reset transistor T7.

As illustrated in FIG. 45, the portion of the active layer LY0 covered by the first conductive layer LY1 is the channel (semiconductor) of the transistor, and the two sides of the channel are the first electrode (conductor part) and the second electrode (conductor part) of the transistor, respectively. The second electrode Ca of the capacitor C also serves as the gate electrode of the driving transistor T1, part of the gate signal line GA serves as the gate electrode of the data writing transistor T2, part of the gate signal line GA serves as the gate electrode of the threshold compensation transistor T3, part of the light-emitting control signal line EML serves as the gate electrode of the first light-emitting control transistor T4, part of the light-emitting control signal line EML serves as the gate electrode of the second light-emitting control transistor T5, part of the reset control signal line RST serves as the gate electrode of the first reset transistor T6, and part of the reset control signal line RST serves as the gate electrode of the second reset transistor T7.

Referring to FIG. 8. FIG. 41, and FIG. 46 to FIG. 49, one end of the connection electrode EC1 is connected to the gate electrode of the driving transistor T1 through a via hole, and the other end of the connection electrode EC1 is connected to the second electrode of the first reset transistor T6 through a via hole.

Referring to FIG. 8, FIG. 41. FIG. 42, and FIG. 46 to FIG. 49, one end of the connection electrode EC2 is connected to the block BK through a via hole, and the other end of the connection electrode EC2 is connected to the data line Vdd through a via hole.

Referring to FIG. 8, FIG. 41, FIG. 42, and FIG. 46 to FIG. 49, one end of the connection electrode EC3 is connected to the second electrode of the data writing transistor T2 through a via hole, and the other end of the connection electrode EC3 is connected to the data line Vd through a via hole.

Referring to FIG. 8, FIG. 41, FIG. 42, and FIG. 46 to FIG. 49, one end of the connection electrode EC4 is connected to the second electrode of the second light-emitting control transistor T5 through a via hole, and the other end of the connection electrode EC4 is connected to the connection electrode EC0.

Referring to FIG. 8, FIG. 41, FIG. 42, and FIG. 46 to FIG. 49, one end of the connection electrode EC5 is connected to the first electrode of the first light-emitting control transistor T4 through a via hole, and the other end of the connection electrode EC5 is connected to the first power supply line Vdd through a via hole.

Referring to FIG. 8. FIG. 41, and FIG. 46 to FIG. 49, one end of the connection electrode EC6 is connected to the first electrode of the second reset transistor T7 through a via hole, and the other end of the connection electrode EC6 is connected to the reset signal line INT2 through a via hole.

Referring to FIG. 8, FIG. 41, and FIG. 46 to FIG. 49, one end of the connection electrode EC7 is connected to the first electrode of the first reset transistor T6 through a via hole, and the other end of the connection electrode EC7 is connected to the reset signal line INT1 through a via hole.

As illustrated in FIG. 41, and FIG. 46 to FIG. 49, the signal line SL2 is connected to the light-emitting control signal line EML through a via hole.

As illustrated in FIG. 43 and FIG. 44, the connection electrode ECa is connected to the connection electrode EC0 through a via hole, and the connection electrode ECa can be used for being connected to the connection electrode ECb so as to be connected to the first light-emitting device 131.

As illustrated in FIG. 43, the transparent conductive layer LYa includes a plurality of lead wires 17. The plurality of lead wires 17 include a lead wire 17a, a lead wire 17b, and a lead wire 17c. As illustrated in FIG. 43, both left and right ends of the lead wire 17a are illustrated. Referring to FIG. 1 and FIG. 43, the left end of the lead wire 17a is used for being connected to the second driving circuit 161, and the right end of the lead wire 17a is used for being connected to the second light-emitting device 132. As illustrated in FIG. 43, the right end of the lead wire 17b is illustrated, the middle portion of the lead wire 17c is illustrated, but the left and right ends of the lead wire 17c are not illustrated.

As illustrated in FIG. 43 and FIG. 44, the connection electrode ECb is connected to the connection electrode ECa through a via hole. The middle portion of the lead wire 17c in FIG. 44 is illustrated, but the left and right ends of the lead wire 17c are not illustrated.

Figure 50:
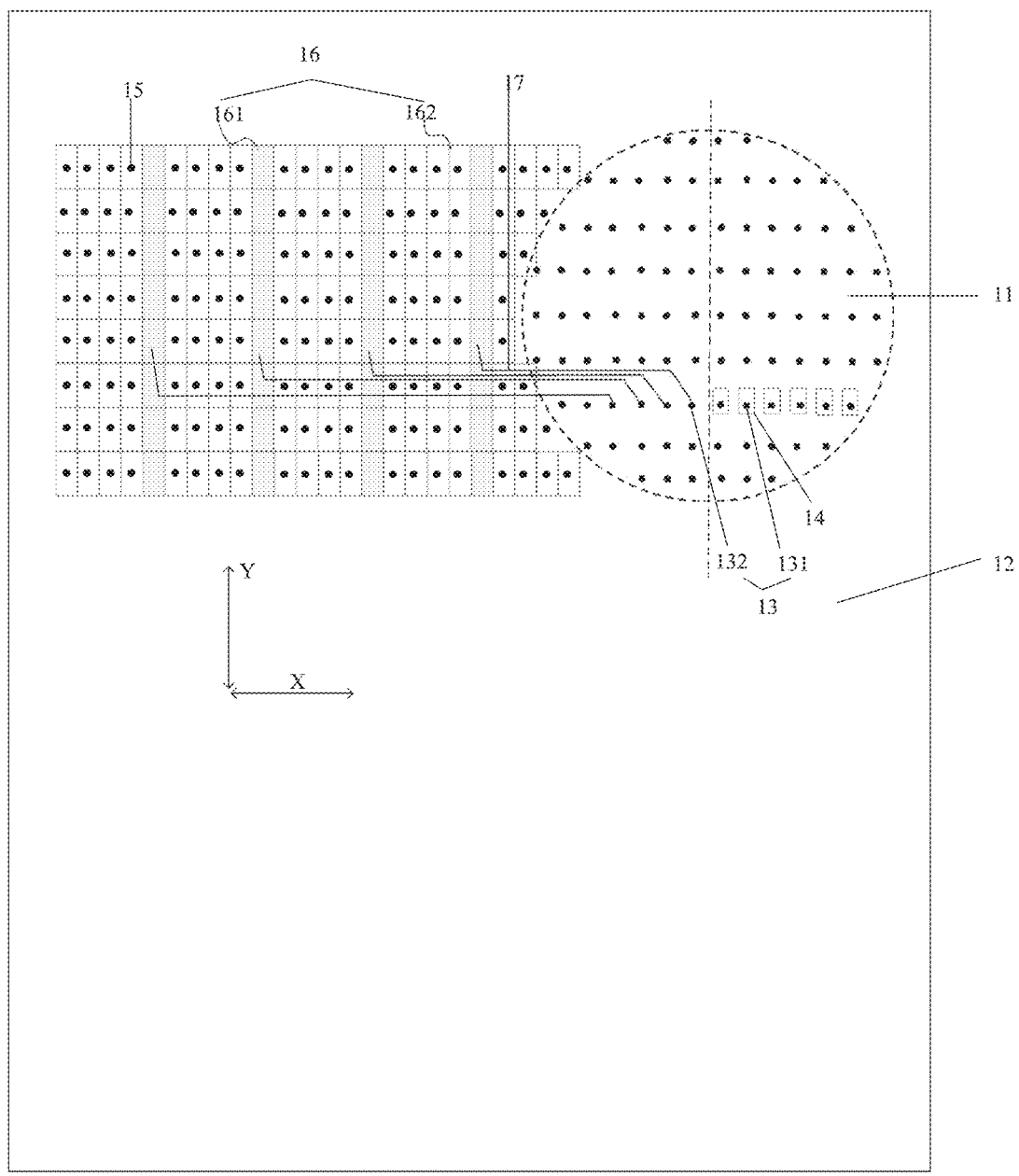
FIG. 50 is a schematic structural plan view of a display panel provided by an embodiment of the present disclosure.
Figure 51:
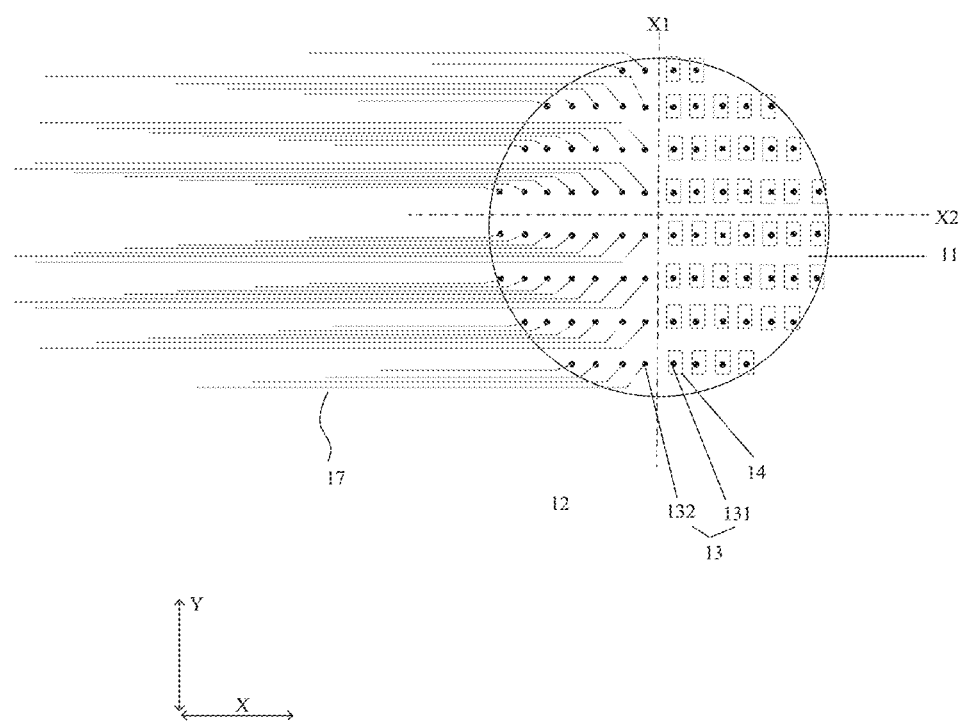
FIG. 51 is a schematic partial structural plan view of a display panel provided by an embodiment of the present disclosure.
Figure 52:
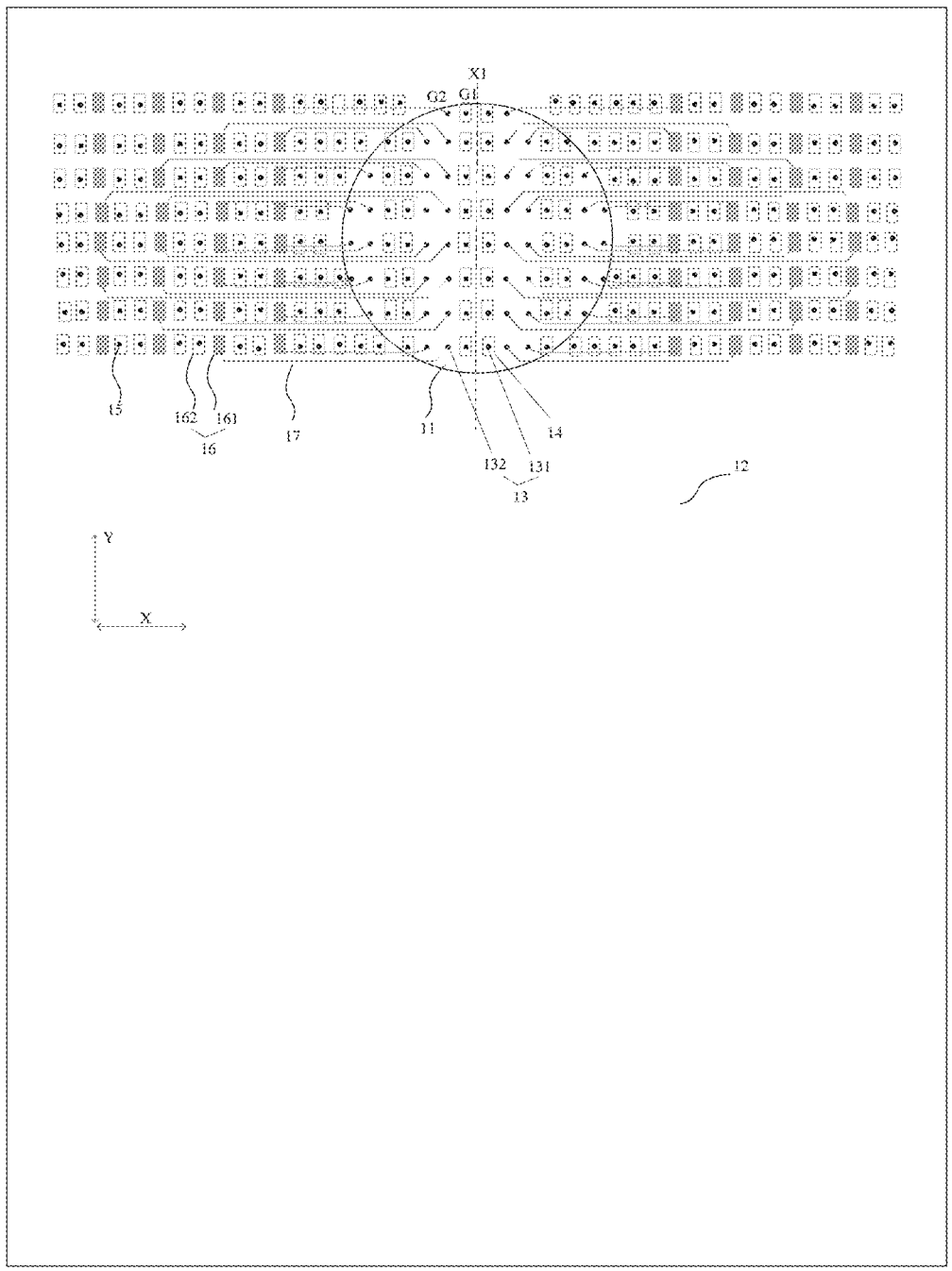
FIG. 52 is a schematic structural plan view of a display panel provided by an embodiment of the present disclosure.
Figure 53:
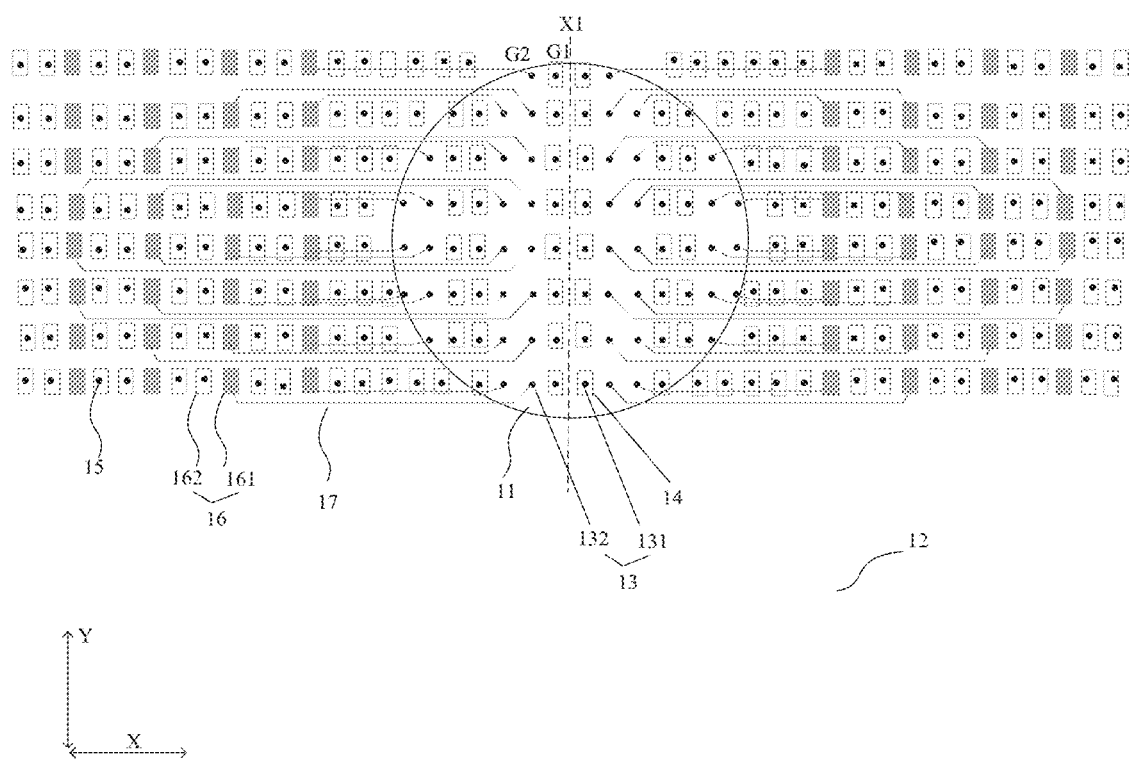
FIG. 53 is a schematic partial structural plan view of a display panel provided by an embodiment of the present disclosure.

FIG. 50 is a schematic structural plan view of a display panel provided by an embodiment of the present disclosure. FIG. 51 is a schematic partial structural plan view of a display panel provided by an embodiment of the present disclosure. FIG. 52 is a schematic structural plan view of a display panel provided by an embodiment of the present disclosure. FIG. 53 is a schematic partial structural plan view of a display panel provided by an embodiment of the present disclosure.

As illustrated in FIG. 50 to FIG. 52, the first display area 11 includes a plurality of built-in light-emitting devices 13 and at least one first driving circuit 14, the plurality of built-in light-emitting devices 13 include a first light-emitting device 131 and a second light-emitting device 132, the first driving circuit 14 is connected to the first light-emitting device 131, and the first driving circuit 14 is configured to drive the first light-emitting device 131 to emit light.

As illustrated in FIG. 50 to FIG. 52, the second display area 12 includes at least one third light-emitting device 15 and a plurality of external driving circuits 16, the plurality of external driving circuits 16 include a second driving circuit 161 and a third driving circuit 162, the second driving circuit 161 is connected to the second light-emitting device 132 through a lead wire 17, the second driving circuit 161 is configured to drive the second light-emitting device 132 to emit light, the third driving circuit 162 is connected to the third light-emitting device 15, and the third driving circuit 162 is configured to drive the third light-emitting device 15 to emit light.

As illustrated in FIG. 50 to FIG. 53, the first display area 11 has a symmetry axis X1, for example, the symmetry axis X1 extends along the second direction Y. The first display area 11 can also have a symmetry axis X2, and the symmetry axis X2 extends along the first direction X.

As illustrated in FIG. 50 and FIG. 51, in the first display area 11, all the light-emitting devices located on one side of the symmetry axis X1 are connected by lead wires (pixel circuits are external, a compression scheme), that is, the light-emitting devices and pixel circuits are arranged separately, while all the light-emitting devices located on the other side of the symmetry axis X1 adopt the manner in which the pixel circuits are built-in (a built-in scheme). That is, in the first display area 11, all the light-emitting devices located on the left side of the symmetry axis X1 adopt the manner in which the pixel circuits are external, while all the light-emitting devices located on the right side of the symmetry axis X1 adopt the manner in which the pixel circuits are built-in. However, no limitation is made in this regard. Moreover, division can also be made according to the symmetry axis X2. For example, all the light-emitting devices on one side of the symmetry axis X2 are connected by lead wires (pixel circuits are external, a compression scheme), that is, the light-emitting devices and pixel circuits are arranged separately, while all the light-emitting devices on the other side of the symmetry axis X2 adopt the manner in which the pixel circuits are built-in (a built-in scheme). That is, the first display area 11 is divided into two sub-areas, one sub-area adopts the built-in scheme and the other sub-area adopts the compression scheme.

As illustrated in FIG. 52 and FIG. 53, in the first display area 11, the built-in light-emitting device 13 includes a plurality of first light-emitting device groups G1 and a plurality of second light-emitting device groups G2, the plurality of first light-emitting device groups G1 and the plurality of second light-emitting device groups G2 are arranged alternately, the light-emitting devices (first light-emitting devices 131) in the first light-emitting device groups G1 adopt the manner in which the pixel circuits are built-in, and the light-emitting devices (second light-emitting devices 132) in the plurality of second light-emitting device groups G2 adopt the manner in which the pixel circuits and the light-emitting devices are arranged separately.

FIG. 52 and FIG. 53 are illustrated by taking as an example that the first light-emitting device group G1 includes two columns of light-emitting devices and the second light-emitting device group G2 includes two columns of light-emitting devices. For example, in the first light-emitting device group G1, one column of light-emitting devices are green light light-emitting devices, and the other column are red light light-emitting devices and blue light light-emitting devices that are arranged alternately. For example, in the second light-emitting device group G2, one column of light-emitting devices are green light light-emitting devices, and the other column are red light light-emitting devices and blue light light-emitting devices that are arranged alternately.

For example, the first light-emitting device group G1 includes at least one column of first light-emitting devices 131, and the second light-emitting device group G2 includes at least one column of second light-emitting devices 132.

FIG. 50 is illustrated by taking as an example that a column of second driving circuits 161 are provided for every four columns of third driving circuits 162, and FIG. 52 is illustrated by taking as an example that a column of second driving circuits 161 are provided for every two columns of third driving circuits 162. It should be noted that the number of columns of the third driving circuits 162 disposed between two adjacent columns of the second driving circuits 161 can be set depending upon requirements, and is not limited to what is illustrated in the figure.

For the sake of clarity. FIG. 50 and FIG. 52 do not illustrate all structures within the second display area 21.

Embodiments of the present disclosure provide a display apparatus, including: a photosensitive element and any display panel as described above.

For example, the orthographic projection of the photosensitive element on the display panel overlaps with the first display area.

For example, the photosensitive element can include a sensing module, and the sensing module can include, for example, an infrared sensing module; a specific pattern (such as a fingerprint pattern, an iris pattern, etc.) is recognized from an infrared image. In an embodiment, the sensing module can perform facial recognition.

For example, the photosensitive element can include an optical member, and the optical member can include an illuminance sensor. The illuminance sensor can measure illuminance around the display apparatus, and the display apparatus can adjust the brightness of the screen based on the measured illuminance.

For example, the photosensitive element can include a sensor, and the sensor can be an electronic element that utilizes light or sound. For example, the sensor can be a sensor (such as an infrared sensor) for receiving and utilizing light, a sensor for measuring distance or recognizing a fingerprint by outputting and detecting light or sound, a small lamp for outputting light, a loudspeaker for outputting sound, and/or a camera for capturing images. A plurality of sensor devices can be provided.

For example, the sensor includes an infrared sensor, an ultrasonic sensor, a light detection and ranging (LIDAR) sensor, a radar sensor, and a camera sensor.

For example, the photosensitive element includes an under-screen camera or a distance sensor, but is not limited thereto.

For example, the distance sensor includes a time of flight (TOF) sensor. TOF stands for time of flight, which is a technology that uses the time of flight of light to measure distance and has been widely used in facial recognition of smartphones and other fields.

Those skilled in the art can understand that the display apparatus has all the features and advantages of the above-mentioned display panel.

In some embodiments, the specific types of the display apparatus include but are not limited to mobile phones, laptops, iPads, kindles, televisions and other display apparatuses having display and camera functions.

Those skilled in the art can understand that, in addition to the above-mentioned display panel, the display apparatus can also include structures or components necessary for conventional display apparatuses. Taking a mobile phone as an example, in addition to the above-mentioned display panel, it also includes a glass cover, a battery back cover, a middle frame, a motherboard, a touch module, an audio module, a camera module and other necessary structures or components.

For example, the first direction X is a direction parallel to the main surface of the base substrate 40. The second direction Y is a direction parallel to the main surface of the base substrate 40. The first direction X intersects with the second direction Y. Embodiments of the present disclosure are illustrated by taking as an example that the first direction X is perpendicular to the second direction Y. The third direction Z is a direction perpendicular to the main surface of the base substrate 40. The main surface of the base substrate 40 is the surface used for fabricating various film layers. For example, the upper surface of the base substrate 40 in FIG. 4 is the main surface thereof.

The various embodiments in this specification are described in a progressive manner, each embodiment focuses on the difference from other embodiments, and the same and similar parts of the various embodiments can be referred to by each other.

It should be noted that for the sake of clarity, in the drawings used for describing the embodiments of the present disclosure, the thicknesses of layers or regions are scaled up. It will be understood that when an element such as a layer, a film, a region, or a substrate is referred to as being "on" or "under" another element, the element can be "directly" "on" or "under" another element, or intermediate elements can be present.

In the embodiments of the present disclosure, elements arranged in the same layer are formed by the same film layer using the same patterning process. For example, elements arranged in the same layer are located on the surface of the same element away from the base substrate, but are not limited thereto. The elements arranged in the same layer can have different heights relative to the base substrate.

In the embodiments of the present disclosure, the patterning or patterning process may only include a photolithography process, or include a photolithography process and an etching process, or may include other processes for forming predetermined patterns such as printing process and inkjet process. The photolithography process refers to the process including film formation, exposure, development, etc., using photoresist, mask, exposure machine, etc, to form patterns. The corresponding patterning process can be selected according to the structure formed in the embodiment of the present disclosure.

In the case of no conflict, the features in the same embodiment and different embodiments of the present disclosure can be combined with each other.

The above are only specific embodiments of the present disclosure, but the protection scope of the present disclosure is not limited thereto. Any person skilled in the art can easily think of changes or substitutions within the technical scope disclosed in the present disclosure. It should be covered within the protection scope of the present disclosure. Therefore, the protection scope of the present disclosure should be determined by the protection scope of the claims.

What is claimed is:

1. A display panel, comprising: a first display area and a second display area, wherein the second display area is located on at least one side of the first display area and a transmittance of the first display area is greater than a transmittance of the second display area;
   the first display area comprises a plurality of built-in light-emitting devices and at least one first driving circuit, the plurality of built-in light-emitting devices comprise a first light-emitting device and a second light-emitting device, the first driving circuit is connected to the first light-emitting device, and the first driving circuit is configured to drive the first light-emitting device to emit light;
   the second display area comprises at least one third light-emitting device and a plurality of external driving circuits, the plurality of external driving circuits comprise a second driving circuit and a third driving circuit, the second driving circuit is connected to the second light-emitting device through a lead wire, the second driving circuit is configured to drive the second light-emitting device to emit light, the third driving circuit is connected to the third light-emitting device, and the third driving circuit is configured to drive the third light-emitting device to emit light,
   wherein a plurality of the third light-emitting devices are provided, and in a first direction, the plurality of external driving circuits and the plurality of third light-emitting devices are arranged periodically, and an arrangement period of the plurality of external driving circuits is less than an arrangement period of the plurality of third light-emitting devices.

2. The display panel according to claim 1, wherein a ratio of the arrangement period of the plurality of external driving circuits to the arrangement period of the plurality of third light-emitting devices is greater than or equal to 1/2 and less than or equal to 9/10.

3. The display panel according to claim 1, wherein the first light-emitting device comprises a green light light-emitting device and/or a blue light light-emitting device; and the second light-emitting device comprises at least one selected from the group consisting of a green light light-emitting device, a blue light light-emitting device, and a red light light-emitting device.

4. The display panel according to claim 1, wherein the first light-emitting device comprises a red light light-emitting device and/or a blue light light-emitting device; and the second light-emitting device comprises at least one selected from the group consisting of a green light light-emitting device, a blue light light-emitting device, and a red light light-emitting device.

5. The display panel according to claim 1, wherein the first light-emitting device comprises a green light light-emitting device and/or a red light light-emitting device; and the second light-emitting device comprises at least one selected from the group consisting of a green light light-emitting device, a blue light light-emitting device, and a red light light-emitting device.

6. The display panel according to claim 1, wherein the first light-emitting device comprises a first color light light-emitting device, the second light-emitting device comprises a second color light light-emitting device and a third color light light-emitting device, and the first color light light-emitting device, the second color light light-emitting device, and the third color light light-emitting device are configured to emit light of different colors,
   wherein the first light-emitting device comprises a green light light-emitting device and the second light-emitting device comprises a red light light-emitting device and a blue light light-emitting device,
   wherein the lead wire comprises a first conductive wire and a second conductive wire, the first conductive wire is connected to the second color light light-emitting device, and the second conductive wire is connected to the third color light light-emitting device.

7. A display panel, comprising: a first display area and a second display area, wherein the second display area is located on at least one side of the first display area and a transmittance of the first display area is greater than a transmittance of the second display area;
   the first display area comprises a plurality of built-in light-emitting devices and at least one first driving circuit, the plurality of built-in light-emitting devices comprise a first light-emitting device and a second light-emitting device, the first driving circuit is connected to the first light-emitting device, and the first driving circuit is configured to drive the first light-emitting device to emit light;

the second display area comprises at least one third light-emitting device and a plurality of external driving circuits, the plurality of external driving circuits comprise a second driving circuit and a third driving circuit, the second driving circuit is connected to the second light-emitting device through a lead wire, the second driving circuit is configured to drive the second light-emitting device to emit light, the third driving circuit is connected to the third light-emitting device, and the third driving circuit is configured to drive the third light-emitting device to emit light, wherein the first light-emitting device comprises a first color light light-emitting device, the second light-emitting device comprises a second color light light-emitting device and a third color light light-emitting device, and the first color light light-emitting device, the second color light light-emitting device, and the third color light light-emitting device are configured to emit light of different colors, wherein the first light-emitting device comprises a green light light-emitting device and the second light-emitting device comprises a red light light-emitting device and a blue light light-emitting device, wherein the lead wire comprises a first conductive wire and a second conductive wire, the first conductive wire is connected to the second color light light-emitting device, and the second conductive wire is connected to the third color light light-emitting device.

8. The display panel according to claim 7, wherein the first light-emitting device comprises a first anode layer disposed on a base substrate, and the third light-emitting device comprises a second anode layer disposed on the base substrate;

wherein a ratio of an orthographic projection area of the first driving circuit on the base substrate to an orthographic projection area of the first anode layer on the base substrate is less than a ratio of an orthographic projection area of the third driving circuit on the base substrate to an orthographic projection area of the second anode layer on the base substrate.

9. The display panel according to claim 8, wherein an orthographic projection of the first anode layer on the base substrate covers an orthographic projection of the first driving circuit on the base substrate.

10. The display panel according to claim 7, wherein the first display area is divided into two sub-areas, and the light-emitting devices in one sub-area are all first light-emitting devices and the light-emitting devices in the other sub-area are all second light-emitting devices.

11. The display panel according to claim 7, wherein a plurality of first light-emitting devices are provided, a plurality of second light-emitting devices are provided, the plurality of first light-emitting devices constitute a plurality of first light-emitting device groups, the plurality of second light-emitting devices constitute a plurality of second light-emitting device groups, the plurality of first light-emitting device groups and the plurality of second light-emitting device groups are alternately arranged, each of the plurality of first light-emitting device groups comprises at least one column of first light-emitting devices, and each of the plurality of second light-emitting device groups comprises at least one column of second light-emitting devices.

12. The display panel according to claim 7, wherein the number of the first light-emitting device is greater than or equal to the number of the second light-emitting device.

13. The display panel according to claim 7, wherein the second light-emitting device comprises a first color light light-emitting device, a second color light light-emitting device, and a third color light light-emitting device, the lead wire connecting the first color light light-emitting device and the second driving circuit is a first lead wire, the lead wire connecting the second color light light-emitting device and the second driving circuit is a second lead wire, the lead wire connecting the third color light light-emitting device and the second driving circuit is a third lead wire, an area of the first lead wire is less than or equal to an area of the second lead wire, and the area of the second lead wire is less than or equal to an area of the third lead wire.

14. The display panel according to claim 7, wherein a signal line connected to the first driving circuit comprises a first line segment and a second line segment, the first line segment is connected to the second line segment, the first line segment is located in the first display area, the second line segment is located in the second display area, a material of the first line segment comprises a transparent conductive material, and a material of the second line segment comprises a metal material, wherein a material of the lead wire comprises a transparent conductive material, and the lead wire and the first line segment are respectively located in different film layers.

15. The display panel according to claim 7, further comprising a plurality of signal lines connected to the first driving circuit, wherein at least one signal line in the plurality of signal lines is arranged in segments, wherein the signal line arranged in segments comprises a plurality of signal portions located in different layers, wherein the signal line arranged in segments comprises a first signal portion and a second signal portion, a material of the first signal portion comprises a transparent conductive metal oxide, and a material of the second signal portion comprises a metal, wherein the first display area comprises a driving circuit arranging area and a wiring area, the first signal portion is located in the driving circuit arranging area, and the second signal portion is located in the wiring area.

16. The display panel according to claim 7, further comprising a light-emitting control signal line, a reset control signal line, and a reset signal line, wherein a pixel circuit comprises a driving module, a light-emitting control circuit, and a reset circuit, the pixel circuit comprises at least one of the first driving circuit, the second driving circuit, and the third driving circuit, wherein the light-emitting control signal line is connected to a control terminal of the light-emitting control circuit, the reset control signal line is connected to a control terminal of the reset circuit, the reset signal line is connected to a first electrode of the reset circuit, and at least one of the light-emitting control signal line, the reset control signal line, and the reset signal line is arranged in segments in the first display area.

17. The display panel according to claim 16, wherein the reset circuit comprises a first reset transistor and a second reset transistor, the first reset transistor is configured to reset a control terminal of the driving module, the second reset transistor is configured to reset a first electrode of a light-emitting device, the light-emitting device comprises at least one of the first light-emitting device, the second light-emitting device, and the third light-emitting device, and in a same pixel circuit located in the first display area, the first reset transistor and the second reset transistor share a same reset signal line.

18. The display panel according to claim 7, wherein a layout of the second driving circuit is the same as a layout of the third driving circuit, and a layout of the first driving circuit is different from the layout of the second driving circuit or the third driving circuit.

19. The display panel according to claim 7, wherein the first driving circuit comprises a driving transistor, a first reset transistor, a second reset transistor, a data writing transistor, and a threshold compensation transistor,
- a first electrode of the first reset transistor is electrically connected to a first reset signal line, and a second electrode of the first reset transistor is electrically connected to a gate electrode of the driving transistor,
- a first electrode of the second reset transistor is electrically connected to a second reset signal line, and a second electrode of the second reset transistor is connected to the first light-emitting device,
- a first electrode of the data writing transistor is electrically connected to a first electrode of the driving transistor, and a second electrode of the data writing transistor is configured to be connected to a data line;
- a first electrode of the threshold compensation transistor is electrically connected to a second electrode of the driving transistor, and a second electrode of the threshold compensation transistor is electrically connected to the gate electrode of the driving transistor, and
- the first reset signal line and the second reset signal line are a same reset signal line.

20. A display apparatus, comprising: a photosensitive element and a display panel, wherein the display panel comprises: a first display area and a second display area, wherein the second display area is located on at least one side of the first display area and a transmittance of the first display area is greater than a transmittance of the second display area;
the first display area comprises a plurality of built-in light-emitting devices and at least one first driving circuit, the plurality of built-in light-emitting devices comprise a first light-emitting device and a second light-emitting device, the first driving circuit is connected to the first light-emitting device, and the first driving circuit is configured to drive the first light-emitting device to emit light;
the second display area comprises at least one third light-emitting device and a plurality of external driving circuits, the plurality of external driving circuits comprise a second driving circuit and a third driving circuit, the second driving circuit is connected to the second light-emitting device through a lead wire, the second driving circuit is configured to drive the second light-emitting device to emit light, the third driving circuit is connected to the third light-emitting device, and the third driving circuit is configured to drive the third light-emitting device to emit light,
wherein an orthographic projection of the photosensitive element on the display panel overlaps with the first display area.

* * * * *